US010553590B2

(12) United States Patent
Kim

(10) Patent No.: US 10,553,590 B2
(45) Date of Patent: Feb. 4, 2020

(54) SEMICONDUCTOR DEVICE INCLUDING BURIED GATE STRUCTURE AND METHOD FOR FABRICATING THE SAME

(71) Applicant: SK hynix Inc., Gyeonggi-do (KR)

(72) Inventor: Dong-Soo Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/857,016

(22) Filed: Dec. 28, 2017

(65) Prior Publication Data

US 2018/0342518 A1 Nov. 29, 2018

(30) Foreign Application Priority Data

May 29, 2017 (KR) .................. 10-2017-0065959

(51) Int. Cl.
*H01L 27/108* (2006.01)
*H01L 21/762* (2006.01)
(Continued)

(52) U.S. Cl.
CPC .. *H01L 27/10823* (2013.01); *H01L 21/28088* (2013.01); *H01L 21/28176* (2013.01); *H01L 21/28194* (2013.01); *H01L 21/32136* (2013.01); *H01L 21/32155* (2013.01); *H01L 21/76224* (2013.01); *H01L 27/10826* (2013.01); *H01L 27/10876* (2013.01); *H01L 27/10879* (2013.01);
(Continued)

(58) Field of Classification Search
CPC ......... H01L 21/28079; H01L 21/28194; H01L 21/28202; H01L 27/10823; H01L 27/10876; H01L 27/228; H01L 27/2436; H01L 27/2463; H01L 29/4236; H01L 29/4958; H01L 29/66621; H01L 29/66795; H01L 29/78; H01L 45/04; H01L 45/06; H01L 45/145; H01L 45/16; H01L 21/0823; H01L 21/28088; H01L 21/28176; H01L 21/32136; H01L 21/32155; H01L 21/31053; H01L 21/76244; H01L 29/517
See application file for complete search history.

(56) References Cited

U.S. PATENT DOCUMENTS 7,525,133 B2 * 4/2009 Ohta ................... H01L 29/0649
257/213
9,178,039 B2 11/2015 Park et al.
(Continued)

FOREIGN PATENT DOCUMENTS

TW 201511243 3/2015
TW 201626445 7/2016

OTHER PUBLICATIONS

Office Action issued by the Taiwanese Patent Office dated Sep. 5, 2018.

*Primary Examiner* — Mohammed Shamsuzzaman
(74) *Attorney, Agent, or Firm* — IP & T Group LLP

(57) ABSTRACT

A semiconductor device includes: a gate trench formed into a semiconductor substrate; a gate dielectric layer formed in the gate trench to cover an inside surface of the gate trench; and a gate electrode disposed over the gate dielectric layer to fill the gate trench, wherein the gate electrode includes: second crystal grains formed in the gate trench; and first crystal grains disposed between the second crystal grains and the gate dielectric layer and having a smaller crystal grain size than the second crystal grains.

11 Claims, 32 Drawing Sheets

(51) Int. Cl.

|||
|---|---|
| *H01L 29/51* | (2006.01) |
| *H01L 21/3213* | (2006.01) |
| *H01L 21/3215* | (2006.01) |
| *H01L 21/28* | (2006.01) |
| *H01L 29/49* | (2006.01) |
| *H01L 21/3105* | (2006.01) |

(52) U.S. Cl.
CPC ...... *H01L 29/4966* (2013.01); *H01L 29/4983* (2013.01); *H01L 29/513* (2013.01); *H01L 29/518* (2013.01); *H01L 21/31053* (2013.01); *H01L 29/517* (2013.01)

(56) References Cited

U.S. PATENT DOCUMENTS

| | | |
|---|---|---|
| 9,240,347 B2 | 1/2016 | Chandrashekar et al. |
| 9,755,057 B1 | 9/2017 | Su et al. |
| 2006/0234454 A1* | 10/2006 | Yasui ................ H01L 21/28282 438/267 |
| 2011/0260239 A1 | 10/2011 | Oyu |
| 2012/0080756 A1 | 4/2012 | Suzuki et al. |
| 2012/0161218 A1* | 6/2012 | Niitsuma .......... H01L 21/28061 257/296 |
| 2014/0162440 A1* | 6/2014 | Kim ................ H01L 27/11582 438/487 |
| 2014/0256103 A1* | 9/2014 | Kim ...................... H01L 21/283 438/270 |
| 2015/0228491 A1* | 8/2015 | Kang ................ H01L 21/28194 257/330 |
| 2017/0033178 A1* | 2/2017 | Krishnan .......... H01L 21/02675 |

\* cited by examiner

SEMICONDUCTOR DEVICE INCLUDING BURIED GATE STRUCTURE AND METHOD FOR FABRICATING THE SAME

CROSS-REFERENCE TO RELATED APPLICATIONS

The present application claims priority of Korean Patent Application No. 10-2017-0065959, filed on May 29, 2017, which is incorporated herein by reference in its entirety.

BACKGROUND

1. Field

Exemplary embodiments of the present invention relate to a semiconductor device, and more particularly, to a semiconductor device including a buried gate structure, a method for fabricating the semiconductor device, and a memory cell including the buried gate structure.

2. Description of the Related Art

A metal gate electrode may be used to realize a high-performance transistor. A buried gate-type transistor includes a buried gate structure that fills a gate trench.

Recent trend for high integration leads to limitation for a space where a gate electrode of a buried gate structure is buried.

SUMMARY

Various embodiments of the present invention are directed to a buried gate structure capable of improving the resistance of a gate electrode, and a method for forming the buried gate structure.

Furthermore, various embodiments of the present invention are directed to a buried gate structure capable of improving characteristics of the interface between a gate dielectric layer and a gate electrode, and a method for forming the buried gate structure.

In accordance with an embodiment of the present invention, a semiconductor device may include: a gate trench formed into a semiconductor substrate; a gate dielectric layer formed in the gate trench to cover an inside surface of the gate trench; and a gate electrode disposed over the gate dielectric layer to fill the gate trench, wherein the gate electrode may include: second crystal grains formed in the gate trench; and first crystal grains disposed between the second crystal grains and the gate dielectric layer and having a smaller crystal grain size than the second crystal grains.

The first crystal grains and the second crystal grains may be crystal grains of the same material.

The first crystal grains and the second crystal grains may include metal crystal grains or metal nitride crystal grains.

The first crystal grains and the second crystal grains include titanium nitride (TiN) crystal grains, respectively.

The semiconductor device may further include: a fin region formed on a bottom surface of the gate trench and including an upper surface and side walls covered by the gate dielectric layer.

The first crystal grains may cover the gate dielectric layer, and the second crystal grains may not contact the gate dielectric layer.

The semiconductor device may further include: a first doping region and a second doping region that are formed inside the semiconductor substrate to be isolated from each other by the gate trench; a bit line that is coupled to the first doping region; and a memory element that is coupled to the second doping region.

In accordance with another embodiment of the present invention, a semiconductor device includes: a gate trench formed into a semiconductor substrate; a gate dielectric layer formed in the gate trench to cover an inside surface of the gate trench; a crystallization delay layer disposed over the gate dielectric layer; and a gate electrode disposed over the crystallization delay layer to fill the gate trench, wherein the gate electrode includes: second crystal grains formed in the gate trench; and first crystal grains disposed between the second crystal grains and the crystallization delay layer and having a smaller crystal grain size than the second crystal grains.

The crystallization delay layer may be formed of any suitable material having a high fixed charge density and a high interface trap charge density.

The crystallization delay layer may include a nitrogen-rich silicon oxynitride or a nitrogen-rich silicon nitride.

The first crystal grains and the second crystal grains may include metal crystal grains or metal nitride crystal grains, individually.

The first crystal grains and the second crystal grains may include titanium nitride (TiN) crystal grains, respectively.

The semiconductor device may further include: a fin region formed on a bottom surface of the gate trench and including an upper surface and side walls covered by the gate dielectric layer, wherein the first crystal grains cover the upper surface and side walls of the fin region.

The semiconductor device may further include: an interface layer disposed between the crystallization delay layer and the gate dielectric layer.

The interface layer may include a nitride formed by plasma-nitriding a surface of the gate dielectric layer.

The interface layer and the crystallization delay layer may include a nitrogen-containing material, and the crystallization delay layer may include a higher nitrogen concentration than the interface layer.

The interface layer may include a silicon oxynitride, and the crystallization delay layer may include a nitrogen-rich silicon nitride.

The first crystal grains may cover the gate dielectric layer, and the second crystal grains may not contact the gate dielectric layer.

The semiconductor device may further include a capping layer formed on the gate electrode inside the gate trench to fill an upper part of the gate trench, and wherein the gate electrode filling a lower part of the gate trench.

The first crystal grains and the second crystal grains are formed of metal nitride.

In accordance with another embodiment of the present invention, a method for fabricating a semiconductor device includes: forming a gate trench in a semiconductor substrate; forming a gate dielectric layer over a bottom surface and side walls of the gate trench; and forming a gate electrode including second crystal grains and first crystal grains, wherein the second crystal grains are disposed over the gate dielectric layer to fill the gate trench and the first crystal grains are disposed between the second crystal grains and the gate dielectric layer and have a smaller crystal grain size than the second crystal grains.

The first crystal grains may be formed contacting the gate dielectric layer, and the second crystal grains may be formed not contacting the gate dielectric layer.

The forming of the gate electrode may include forming a first conductive layer over the gate dielectric layer; amorphizing the first conductive layer; forming a second conductive layer over the amorphous first conductive layer; recessing the amorphous first conductive layer and the second conductive layer to form an amorphous first conductive layer pattern and a second conductive layer pattern that are disposed inside the gate trench; and exposing the amorphous first conductive layer pattern and the second conductive layer pattern to an, annealing process in order to form the first crystal grains and the second crystal grains.

The amorphizing of the first conductive layer may include: performing a reactive ion etch process.

The amorphizing of the first conductive layer may include: performing an ion implantation process.

The implantation process may be performed using nitrogen (N), carbon (C), fluorine (F), or ammonia ($NH_3$) as a dopant.

The forming of the gate electrode may include: forming a first conductive layer over the gate dielectric layer at a low temperature; forming a second conductive layer over the first conductive layer at a high temperature; recessing the first conductive layer and the second conductive layer to form a first conductive layer pattern and a second conductive layer pattern that are disposed inside the gate trench; and exposing the first conductive layer pattern and the second conductive layer pattern to an annealing process in order to form the first crystal grains and the second crystal grains.

The first conductive layer may be deposited at a temperature lower than approximately 600° C., and the second conductive layer may be deposited at a temperature higher than approximately 600° C.

The forming of the gate electrode may include: forming a conductive layer over the gate dielectric layer at a low temperature to fill the gate trench; performing a post-processing to remove impurities from the conductive layer; recessing the conductive layer to form a conductive layer pattern that is disposed inside the gate trench; and exposing the conductive layer pattern to an annealing process in order to form the first crystal grains and the second crystal grains.

The conductive layer may be deposited at a temperature lower than approximately 500° C.

The post-processing may include a hydrogen Rapid Thermal Annealing (H-RTA) process that is performed in an atmosphere of hydrogen, a Rapid Thermal Annealing ($NH_3$-RTA) process that is performed in an atmosphere of ammonia ($NH_3$), or a helium (He) plasma treatment.

The forming of the gate electrode may include: forming a conductive layer over the gate dielectric layer at a high temperature to fill the gate trench; performing a post-processing to remove impurities from the conductive layer; recessing the post-processed conductive layer to form a conductive layer pattern that is disposed inside the gate trench; and exposing the conductive layer pattern to an annealing process in order to form the first crystal grains and the second crystal grains.

The conductive layer may be deposited at a temperature higher than approximately 600° C.

The post-processing may include a hydrogen Rapid Thermal Annealing (H-RTA) process that is performed in an atmosphere of hydrogen, a Rapid Thermal Annealing ($NH_3$-RTA) process that is performed in an atmosphere of ammonia ($NH_3$), or a helium (He) plasma treatment.

The annealing process may be performed at a temper ranging from approximately 300° C. to approximately 1100° C.

The gate electrode may include a metal or a metal nitride, and the first crystal grains and the second crystal grains may individually include metal crystal grains or metal nitride crystal grains.

The method may further include: forming a fin region having an upper surface and side walls on a bottom surface of the gate trench, after the forming of the gate trench, wherein the first crystal grains may cover the upper surface and side walls of the fin region.

The method may further include: forming a first doping region and a second doping region in the semiconductor substrate to be isolated from each other by the gate trench, after the forming of the gate electrode; forming a bit line coupled to the first doping region in an upper portion of the semiconductor substrate; and forming a memory element coupled to the second doping region in the upper portion of the semiconductor substrate.

In accordance with still another embodiment of the present invention, a method for fabricating a semiconductor device may include: forming a gate trench in a semiconductor substrate; forming a gate dielectric layer over a bottom surface and side walls of the gate trench; forming a crystallization delay layer over the gate dielectric layer; and forming a gate electrode including second crystal grains and first crystal grains, wherein the second crystal grains are disposed over the crystallization delay layer to fill the gate trench and the first crystal grains which are disposed between the second crystal grains and the crystallization delay layer and have a smaller crystal grain size than the second crystal grains.

The forming of the crystallization delay layer may include: forming a nitrogen-rich layer over the gate dielectric layer.

The forming of the crystallization delay layer may include: plasma-nitriding an upper surface of the gate dielectric layer in an atmosphere of high-concentration nitrogen.

The forming of the crystallization delay layer may include: depositing a high-concentration nitrogen-containing layer over the gate dielectric layer through an Atomic Layer Deposition (ALD) process.

The method may further include: forming an interface layer by plasma-nitriding an upper surface of the gate dielectric layer, before the forming of the crystallization delay layer, wherein the crystallization delay layer has a higher nitrogen concentration than the interface layer.

The forming of the gate electrode may include: forming a conductive layer over the crystallization delay layer to fill the gate trench; recessing the conductive layer to form a conductive layer pattern that is disposed inside the gate trench; and exposing the conductive layer pattern to an annealing process in order to form the first crystal grains that cover the crystallization delay layer and the second crystal grains that are disposed over the first crystal grains, wherein the first crystal grains and the second crystal grains individually include metal crystal grains or metal nitride crystal grains.

The method may further include: forming a fin region having an upper surface and side walls on a bottom surface of the gate trench, after the forming of the gate trench, wherein the first crystal grains cover the upper surface and side walls of the fin region.

The method may further include: forming a first doping region and a second doping region in the semiconductor substrate to be isolated from each other by the gate trench, after the forming of the gate electrode; forming a bit line coupled to the first doping region in an upper portion of the semiconductor substrate; and forming a memory element coupled to the second doping region in the upper portion of the semiconductor substrate.

The annealing process may be performed at a temperature ranging from approximately 300° C. to approximately 1100° C.

These and other features and advantages of the present invention will become apparent to those skilled in the art of the present invention from the following detailed description in conjunction with the accompanying drawings.

DETAILED DESCRIPTION

Figure 1:
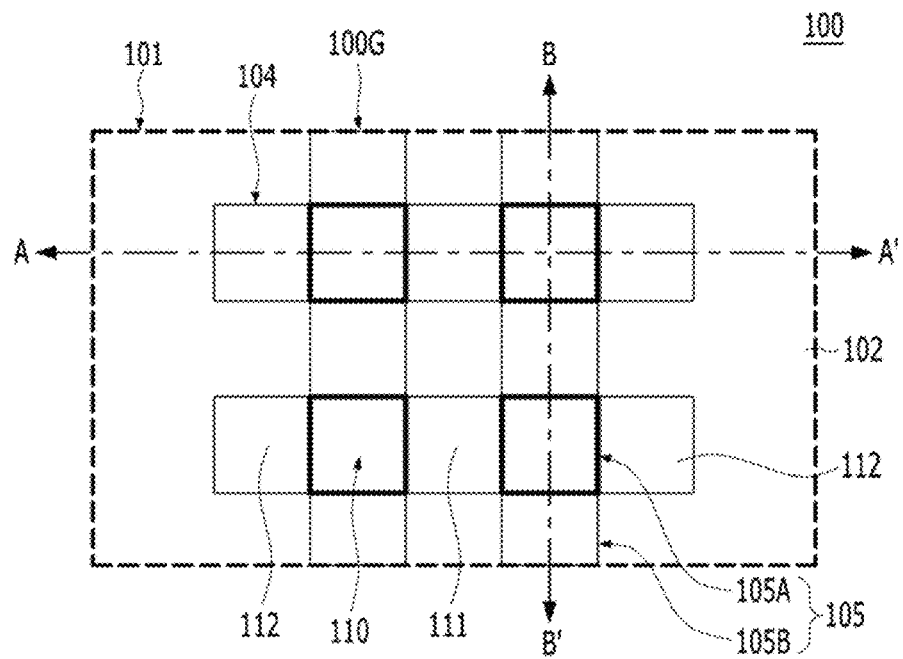
FIG. 1 is a plan view illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
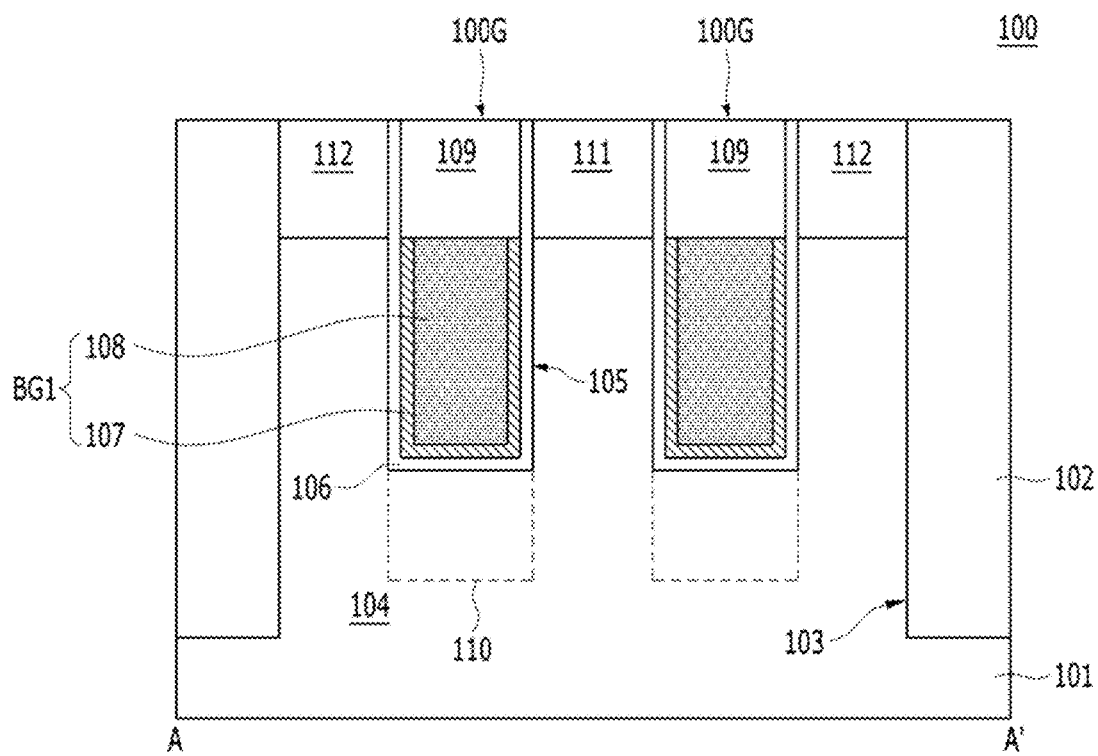
FIG. 2A is a cross-sectional view of the semiconductor device taken along a line A-A' shown in FIG. 1.
Figure 2B:
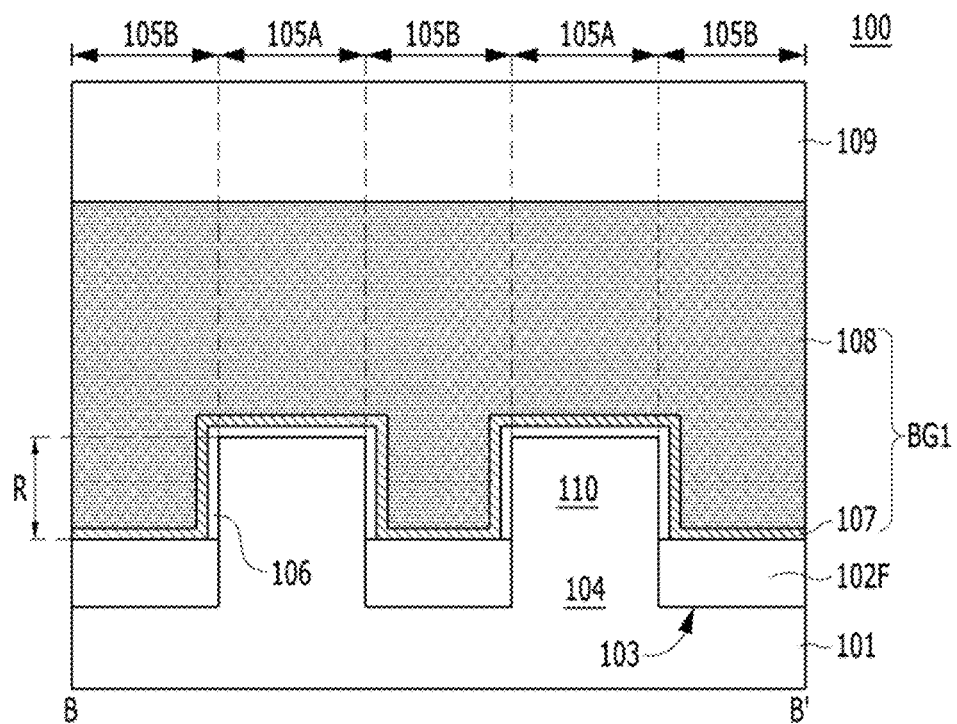
FIG. 2B is a cross-sectional view of the semiconductor device taken along a line B-B' shown in FIG. 1.

FIG. 1 is a plan view illustrating a semiconductor device in accordance with an embodiment of the present invention. FIG. 2A is a cross-sectional view of the semiconductor device taken along a line A-A' shown in FIG. 1. FIG. 2B is a cross-sectional view of the semiconductor device taken along a line B-B' shown in FIG. 1.

The semiconductor device 100 in accordance with an embodiment of the present invention may include a transistor.

The semiconductor device 100 may include a substrate 101, a gate trench 105, a fin region 110, a buried gate structure 100G, a first doping region 111, and a second doping region 112. The buried gate structure 100G may include a gate dielectric layer 106, a gate electrode BG1, and a capping layer 109.

The substrate 101 may be formed of a material that is appropriate for a semiconductor processing. The substrate 101 may include a semiconductor substrate. The substrate 101 may be formed of a silicon-containing material. The substrate 101 may include one selected from a group including silicon monocrystalline silicon, polysilicon, amorphous silicon, a silicon germanium, a monocrystalline silicon germanium a polycrystalline silicon germanium, a carbon-doped silicon, a combination thereof, or a multi-layer of two or more of them. The substrate 101 may include another semiconductor material, such as germanium. The substrate 101 may include a semiconductor substrate of a III/V-group material, e.g., a compound such as gallium arsenide (GaAs). The substrate 101 may include a Silicon-On-Insulator (SOI) substrate.

An isolation layer 102 and an active region 104 may be formed in the substrate 101. The isolation layer 102 may define a plurality of active regions 104. The isolation layer 102 may be a Shallow Trench Isolation (STI) region. The isolation layer 102 may be formed by filling a shallow trench, e.g., an isolation trench 103, with a dielectric material. The isolation layer 102 may be formed of any suitable material including, for example, a silicon oxide, a silicon nitride, or a combination thereof.

The active region 104 may include the fin region 110 the first doping region 111, and the second doping region 112. The first doping region 111 and the second doping region 112 may be regions doped with conductive dopants. For example, suitable conductive dopants may include phosphorus (P), arsenic (As), antimony (Sb), boron (B), or a combination thereof. The first doping region 111 and the second doping region 112 may be doped with dopants of the same conductive type. The first doping region 111 and the second doping region 112 may be isolated from each other by the gate trench 105, The first doping region 111 and the second doping region 112 may be disposed on both sides of the gate trench 105. The first doping region 111 and the second doping region 112 may be called a source) region and a drain region, respectively. The lower surfaces of the first doping region 111 and the second doping region 112 may be positioned at a predetermined level from the upper surface of the active region 104. The lower surfaces of the first doping region 111 and the second doping region 112 may be adjacent to a side wall of an upper portion of the gate trench 105. The lower surfaces of the first doping region 111 and the second doping region 112 may be higher than a bottom surface of the gate trench 105. The first doping region 111 and the second doping region 112 may be symmetrical. For example, the first doping region 111 and the second doping region 112 may form a junction of the same depth. According to another embodiment of the present invention, the first doping region 111 may be formed to be deeper than the second doping region 112.

A plurality of gate trenches 105 may be formed inside the substrate 101. Referring to FIG. 1, each of the gate trenches 105 may have a line shape extending in one direction that is intersecting with the active region 104 and the isolation layer 102. Referring to FIG. 2B, each of the gate trenches 105 may include a first trench 105A and a second trench 105B. The first trench 105A may be formed inside of the active region 104. The second trench 105B may be formed inside of the isolation layer 102. The gate trench 105 may have a shape that is continuously extended from the first trench 105A toward the second trench 105B. The gate trench 105 may have a shallower depth than the isolation trench 103. The bottom edges of the gate trench 105 as shown in FIGS. 2A and 2B may be substantially flat. However, the invention is not limited in this way and it is noted that the bottom edges of the gate trench 105 may have a round shape and then the shape of the gate trench 105 may be formed in a U shape. The gate trench 105 may be formed between the first doping region 111 and the second doping region 112. The bottom surfaces of the first trench 105A and the second trench 105B may be positioned at different levels. For example, the bottom surface of the first trench 105A may be at a higher level than the bottom surface of the second trench 105B. The height difference between the first trench 105A and the second trench 105B may be caused as the isolation layer 102 is recessed. Therefore, the second trench 105B may include a recessed region R having a bottom surface that is lower than the bottom surface of the first trench 105A.

The fin region 110 may be formed in the active region 104 due to the step height between the first trench 105A and the second trench 105B. Each fin region 110 may be positioned under a corresponding first trench 105A, and the side walls of the fin region 110 may be exposed through a recessed isolation layer 102F.

A channel region may be defined by the gate trench 105 and the fin region 110. The channel region may be formed in a U shape. The channel region may include a bottom channel and a side channel. The bottom channel may be defined by the fin region 110, and the side channel may be defined by the side walls of the gate trench 105. The bottom channel and the side channel may be in continuum. The U-shaped channel region may have a longer channel length than a general planar-type transistor. Therefore, it may prevent a short channel effect.

The fin region 110 may be called 'a saddle fin'. The fin region 110 may be able to increase the channel width and it prove the electrical characteristics.

The buried gate structure 100G may be extended into the inside of the substrate 101. For example, the buried gate structure 100G may be formed inside of the gate trench 105. The buried gate structure 100G may be disposed in the active region 104 between the first doping region 111 and the second doping region 112 and extended into the inside of the isolation layer 102. In the buried gate structure 100G, the bottom surface of a portion disposed inside of the active region 104 and the bottom surface of a portion disposed inside of the isolation layer 102 may be positioned at different levels.

The buried gate structure 100G may include the gate dielectric layer 106, the gate electrode BG1, and the capping layer 109.

The gate trench 105 may be lined with the gate dielectric layer 106. The gate trench 105 lined with the gate dielectric layer 106 may be called 'a lined trench' or 'a lined gate trench'. The gate dielectric layer 106 may be formed on the bottom and side walls of the gate trench 105. The gate dielectric layer 106 may be formed of any suitable material including, for example, a silicon oxide, a silicon nitride, a silicon oxynitride, a high-k material, or a combination thereof. The high-k material may include materials having greater dielectric constants than the dielectric constant of a silicon oxide. For example, the high-k material may be formed of any suitable material having a greater dielectric constant than 3.9. According to another embodiment of the present invention, the high-k material may be formed of any suitable material having a greater dielectric constant than 10. According to yet another embodiment of the present invention, the high-k material may be formed of any suitable material having a dielectric constant ranging from 10 to 30. The high-k material may include at least one metallic element. The high-k material may include a hafnium-containing material. The hafnium-containing material may include a hafnium oxide, a hafnium silicon oxide, a hafnium silicon oxynitride, or a combination thereof. According to another embodiment of the present invention, the high-k material may include a lanthanum oxide, a lanthanum aluminum oxide, a zirconium oxide, a zirconium silicon oxide, a zirconium silicon oxynitride, an aluminum oxide, and combinations thereof. As for the high-k material, other known high-k materials may be selected and used. According to the embodiment of the present invention, the gate dielectric layer 106 may be formed by oxidizing the surface of the gate trench 105. According to another embodiment of the present invention, the gate dielectric layer 106 may be formed by depositing a liner material and oxidizing the liner material. The liner material may include a liner polysilicon or a liner nitride.

The capping layer 109 may protect the upper portion of the gate electrode BG1. The capping layer 109 may be formed of any suitable dielectric material. Examples of suitable dielectric materials for the capping layer 109 may include a silicon nitride, a silicon oxynitride or a combination thereof. According to an embodiment of the present invention, the capping layer 109 may include a combination of a silicon nitride and a silicon oxide. For example, in order to form the capping layer 109, the inner sidewall of the gate dielectric layer 106 which extends over the top surface of the gate electrode BG1 and the top surface of the gate electrode BG1 may be lined with a silicon nitride and then filled with a Spin-On-Dielectric (SOD) material. According to another embodiment of the present invention, the capping layer 109 may have an ONO (Oxide-Nitride-Oxide) structure.

Hereafter, the gate electrode BG1 is described.

The upper surface of the gate electrode BG1 may be positioned at a lower level than the upper surface of the active region 104. In other words, the gate electrode BG1 may fill a portion of the gate trench 105. The gate electrode BG1 may not overlap with the first doping region 111 and the second doping region 112. The capping layer 109 may overlap with the first doping region 111 and the second doping region 112. Herein, "overlap" means overlapping in a horizontal direction. Since the gate electrode BG1 is buried inside of the gate trench 105 by the capping layer 109, the gate electrode BG1 may be called 'a buried gate electrode'.

The gate electrode BG1 may have a bi-layer structure. The gate electrode BG1 may have a bi-layer structure of the same material. The gate electrode BG1 may be formed of a polycrystalline material. The gate electrode BG1 may be formed of a polycrystalline material of columnar grains.

The gate electrode BG1 may include a polycrystalline material of different crystal grains. The gate electrode BG1 may include a first crystal grain layer 107 and a second crystal grain layer 108.

The first crystal grain layer 107 may be formed over the gate dielectric layer 106 along the internal wall of the gate trench 105. The first crystal grain layer 107 may be a thin layer. For example, the first crystal grain layer 107 may be a continuous layer that is formed in a uniform thickness along the internal wall of the gate trench 105. Therefore, the first crystal grain layer 107 may be called a liner layer. The first crystal grain layer 107 may cover most of the gate dielectric layer 106.

The second crystal grain layer 108 disposed over the first crystal grain layer 107 may fill the gate trench 105. Therefore the second crystal grain layer 108 may be called 'a filling gate conductor layer'. The second crystal gram layer 108 may fill most of the gate trench 105. The first crystal grain layer 107 may be disposed between the second crystal grain layer 108 and the gate dielectric layer 106. As a result, the second crystal grain layer 108 may not contact the gate dielectric layer 106. The first crystal grain layer 107 may be disposed to cover the side surface and lower surface of the gate dielectric layer 106 inside of the gate trench 105. The second crystal grain layer 108 may be disposed in such a manner that the side surface and lower surface of the second crystal grain layer 108 are surrounded by the first crystal grain layer 107 inside of the gate trench 105.

The first crystal grain layer 107 and the second crystal grain layer 108 may be formed of the same material. The first crystal grain layer 107 and the second crystal grain layer 108 may include a metal-based material to decrease the resistance of the gate electrode BG1. The first crystal grain layer 107 and the second crystal grain layer 108 may be formed of low-resistance metals. The first crystal grain layer 107 and the second crystal grain layer 108 may be formed of any suitable material including a metal, a metal nitride, or a combination thereof. According to the embodiment of the present invention, the first crystal grain layer 107 and the second crystal grain layer 108 may be formed of a titanium nitride (TiN). Since the first crystal grain layer 107 and the second crystal grain layer 108 are formed of the same material, the gate electrode BG1 may be called a buried gate electrode of a single material. For example, the gate electrode BG1 may be formed of a titanium nitride alone. In other words, the gate electrode BG1 may have 'a TiN-only structure.' The TiN-only structure may be able to decrease the resistance further lower than a TiN/W structure, which is a by-layer structure of a titanium nitride (TiN) and tungsten (W), and the TiN-only structure may perform gap-filling easily. Preferably, the first crystal grain layer 107 and the second crystal grain layer 108 may be formed of a fluorine-free material to prevent attacking the gate dielectric layer 106 by fluorine. The fluorine-free material refers to a material that does not contain fluorine.

Figure 3A:
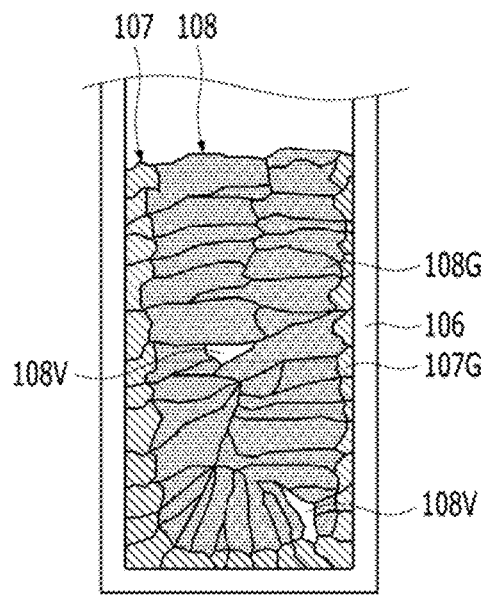
FIGS. 3A and 3B are cross-sectional views comparing the size of crystal grains of gate electrodes.
Figure 3B:
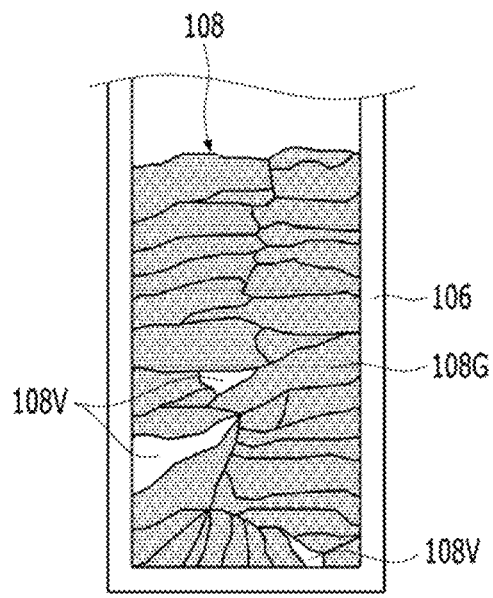

FIGS. 3A and 3B are cross-sectional views comparing the size of crystal grains of the gate electrodes BG1.

Referring to FIG. 3A, the first crystal grain layer 107 may include a plurality of first crystal grains 107G. The first crystal grains 107G may be able to cover most of the gate dielectric layer 106. The second crystal grain layer 108 may include a plurality of second crystal grains 108G. The second crystal grains 108G do not contact the gate dielectric layer 106 because of the first crystal grains 107G which are disposed between the second crystal grains 108G and the gate dielectric layer 106. The first crystal grains 107G and the second crystal grains 108G may have different crystal grain sizes. For example, the size of the crystal grains of the first crystal grains 107G may be smaller than the size of the crystal grains of the second crystal grains 108G. The first crystal grains 107G may have a small grain size, and the second crystal grains 108G may have a large grain size. The first crystal grains 107G and the second crystal grains 108G may be metal crystal grains or metal nitride crystal grains.

The size of crystal grains may be defined as an average grain size. Each of the first crystal grains 107G may have a different crystal grain size. Also, each of the second crystal grains 108G may have a different crystal grain size. Although the crystal grains have different sizes, the average crystal grain size of the first crystal grains 107G may be smaller than the average crystal grain size of the second crystal grains 108G. Although the first crystal grain layer 107 and the second crystal grain layer 108 include the same material, it may be possible to control the crystal grain sizes of the first crystal grains 107G and the second crystal grains 108G to be different from each other. When the first crystal grain layer 107 and the second crystal grain layer 108 be formed of a titanium nitride (TiN), the first crystal grains 107G may be TiN crystal grains having a small crystal grain size, and the second crystal grains 108G may be TiN crystal grains having a large crystal grain size. The first crystal grains 107G and the second crystal grains 108G may be of a columnar structure.

The crystal grain sizes of the first crystal grains 107G and the second crystal grains 108G may be controlled by employing an annealing process. For example, the initial material for forming the first crystal grains 107G and the second crystal grains 108G may be crystalized through a subsequent annealing process. Through the annealing process, the initial material may be converted into the first crystal grains 107G and the second crystal grains 108G. The first crystal grains 107G may have a small crystal grain size, and the second crystal grains 108G may have a large crystal grain size.

The second crystal grain layer 108 may include voids 108V. The first crystal grain layer 107 may not include the voids 108V. The voids 108V may be generated and grow up while a deposition process and the annealing process are performed to form the second crystal grain layer 108. For example, the voids 108V may be formed between the second crystal grains 108G.

FIG. 3B is a cross-sectional view describing a case where the gate trench 105 is filled only with the second crystal grain layer 108.

Referring to FIG. 3B, when the gate trench 105 is filled only with the second crystal grain layer 108, the voids 108V may be disposed on the interface between the second crystal grains 108G and the gate dielectric layer 106. Therefore, when the gate trench 105 is filled only with the second crystal grain layer 108, delamination may occur by the voids 108V.

Figure 4A:
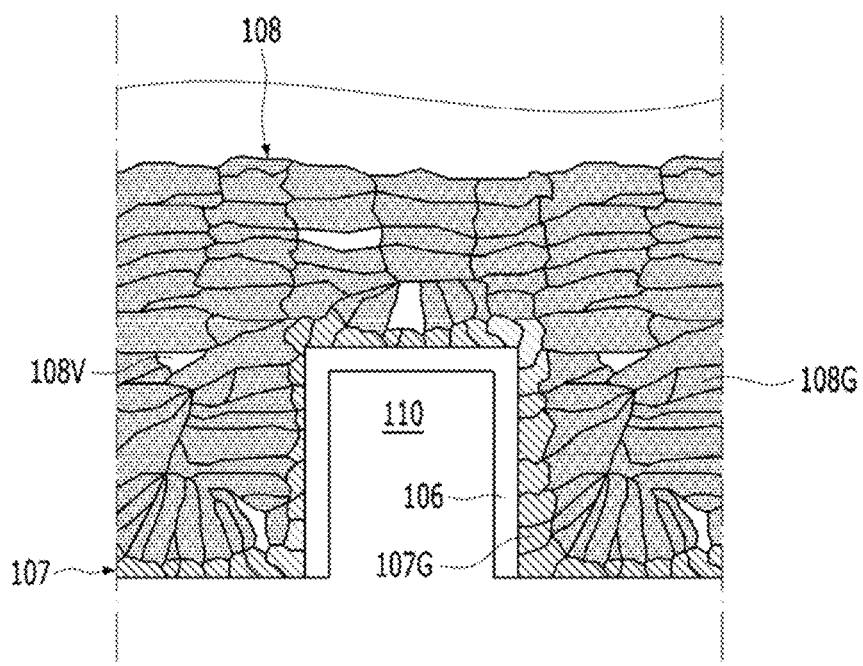
FIGS. 4A and 4B are cross-sectional views comparing the buried gate electrodes around a fin region.
Figure 4B:
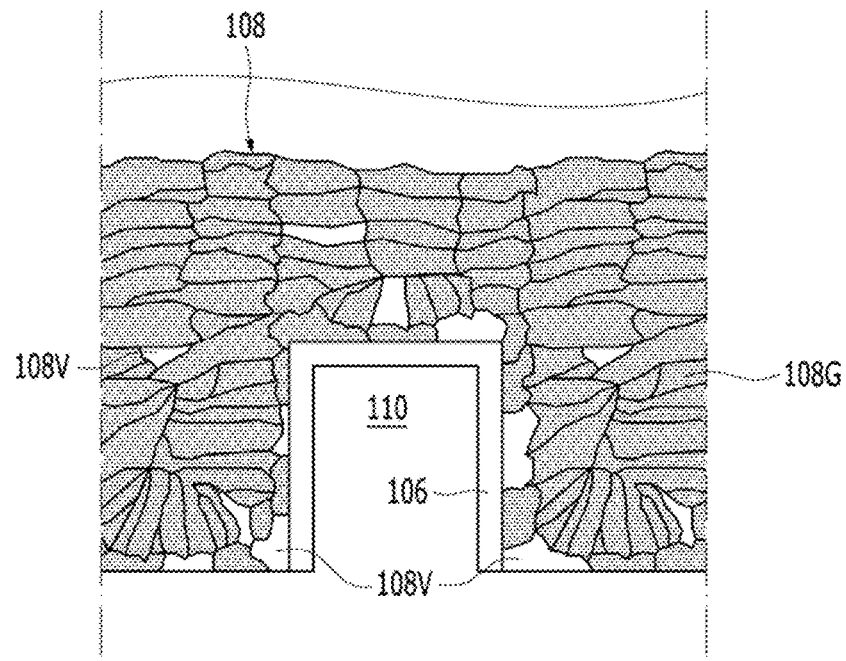

FIGS. 4A and 4B are cross-sectional views comparing the buried gate electrodes around the fin region. FIG. 4A shows a result of disposing the first crystal grain layer 107 between the gate dielectric layer 106 and the second crystal grain layer 108. FIG. 4B shows the gate trench 105 is filled only with the second crystal grain layer 108.

Referring to FIG. 4A, the upper surface and side walls of the fin region 110 may be covered by the second crystal grains 108G. Therefore, the voids 108V may be disposed on the interface between the second crystal grains 108G and the gate dielectric layer 106.

As illustrated in FIGS. 3A and 4A, the voids 108V may not be disposed between the gate dielectric layer 106 and the first crystal grain layer 107 due to the first crystal grains 107G. In this way, delamination may be suppressed. As a result, the interface characteristics between the gate electrode BG1 and the gate dielectric layer 106 may be improved.

Also, the second crystal grains 108G may decrease the resistance of the gate electrode BG1. Since most of the gate trench 105 is filled with the second crystal grains 108G having a large crystal grain size, the resistance of the gate electrode BG1 may be decreased.

As a comparative example, when the thickness of the first crystal grain layer 107 is increased, the resistance of the first crystal grain layer 107 may be increased due to the increase in the number of the first crystal grains 107G. In short, the small crystal grain size of the first crystal grains 107G may increase the resistance of the first crystal grain layer 107. Therefore, the first crystal grain layer 107 may be formed to be thin so that the voids 108V and the delamination may be improved. The first crystal grain layer 107 may preferably be formed in a thickness of approximately 100 Å or less.

Figure 5A:
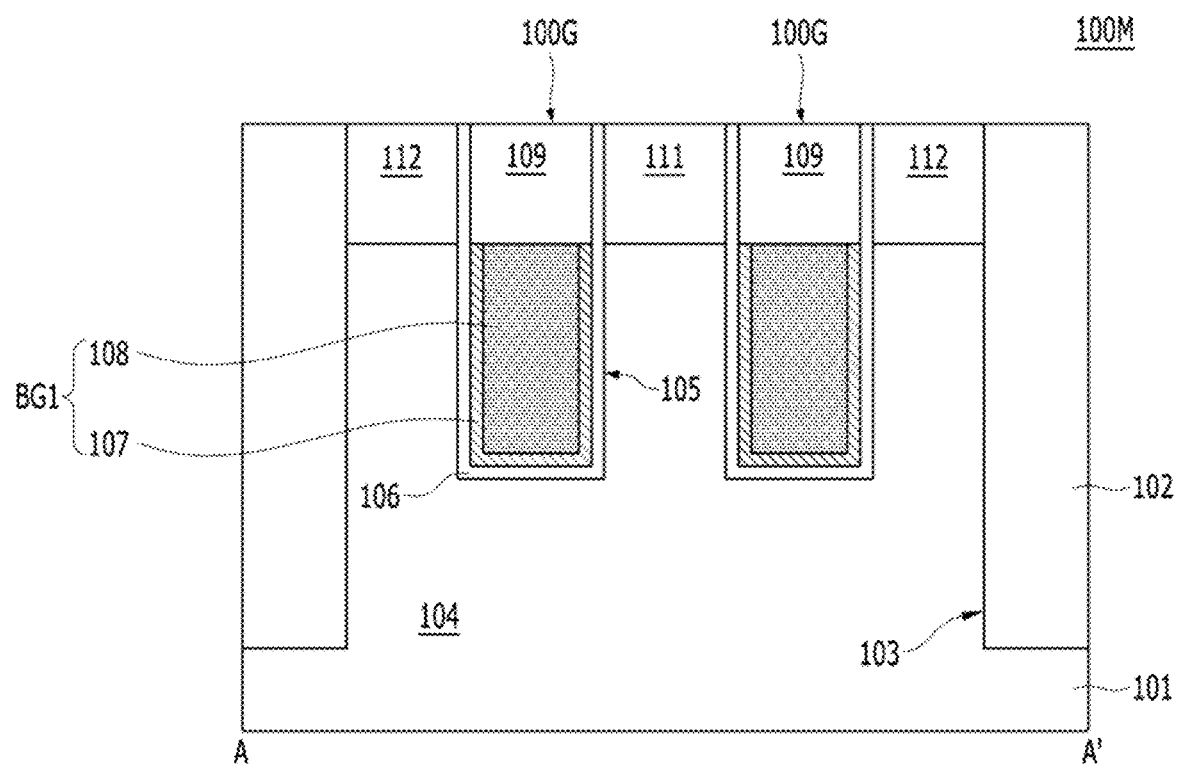
FIGS. 5A and 5B are cross-sectional views of a semiconductor device in accordance with a first modified example of an embodiment of the present invention.
Figure 5B:
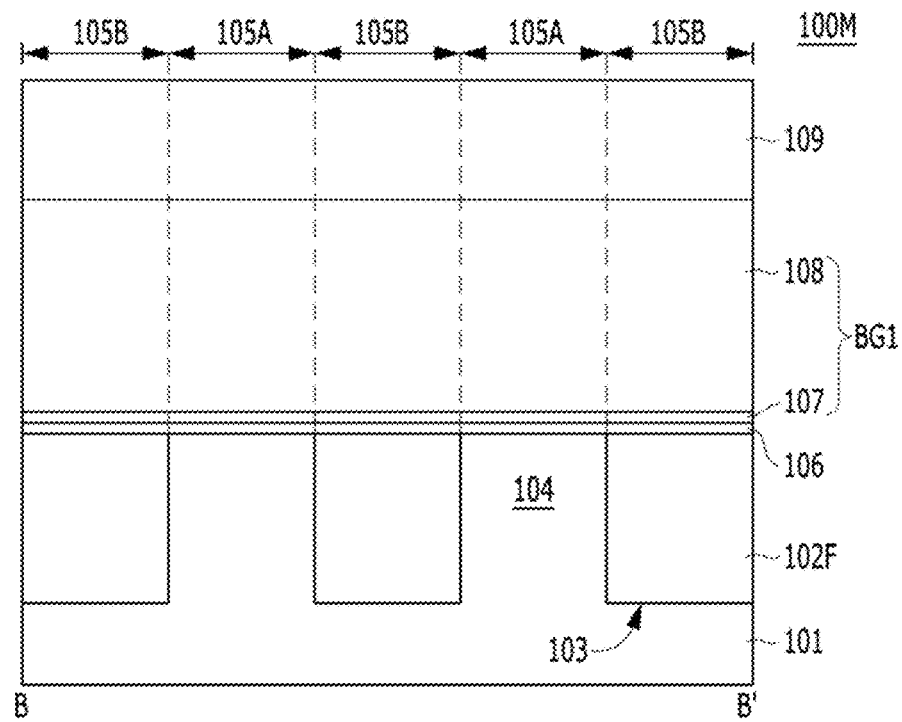

FIGS. 5A and 5B are cross-sectional views of a semiconductor device in accordance with a first modified example of an embodiment of the present invention. FIG. 5A is a cross-sectional view of the semiconductor device taken along a line A-A' in accordance with the first modified example of an embodiment of the present invention. FIG. 5B is a cross-sectional view of the semiconductor device taken along a line B-B' in accordance with the first modified example of an embodiment of the present invention.

Referring to FIGS. 5A and 5B, the semiconductor device 100M may not include the fin region 110. The constituent elements of the semiconductor device 100M may be the same as the semiconductor device 100 of FIG. 2A. In the semiconductor device 100M, the bottom surface of the first trench 105A and the bottom surface of the second trench 105B are positioned at the same level. Hence, according to the modified embodiment shown in FIGS. 5A and 5B the bottom surface of the first trench 105A may be positioned at the same level as the bottom surface of the second trench 105B.

Figure 6A:
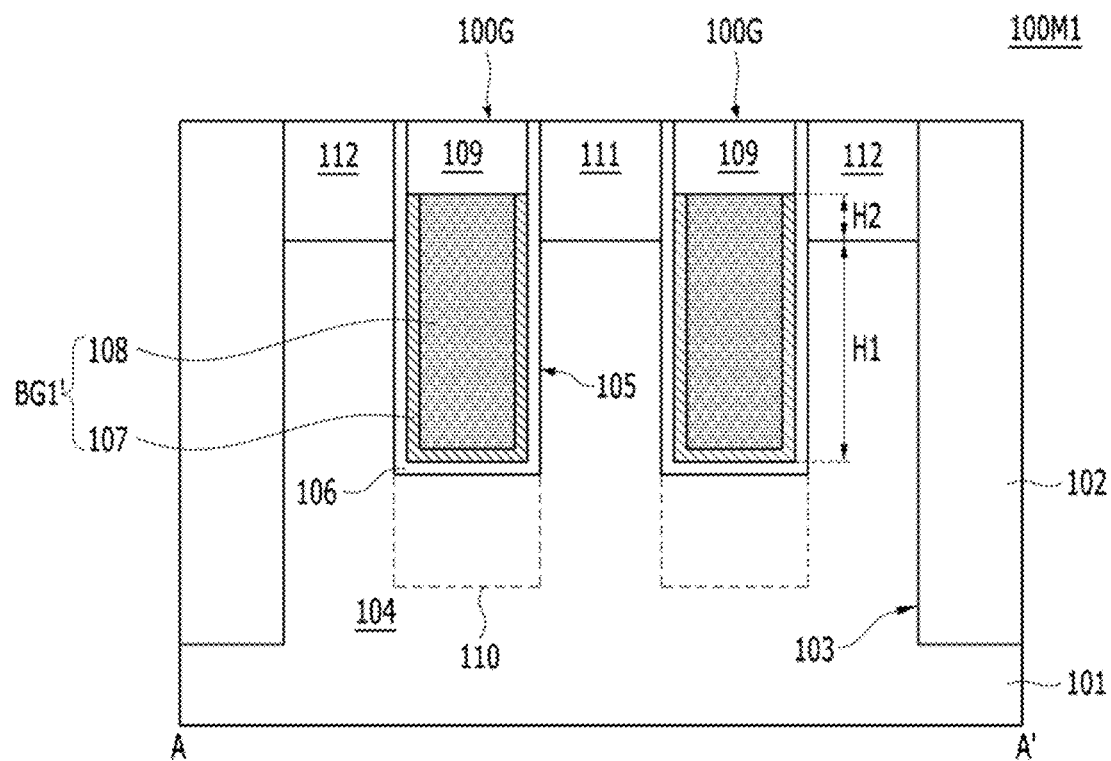
FIGS. 6A and 6B are cross-sectional views of semiconductor devices in accordance with second modified examples of an embodiment of the present invention.
Figure 6B:
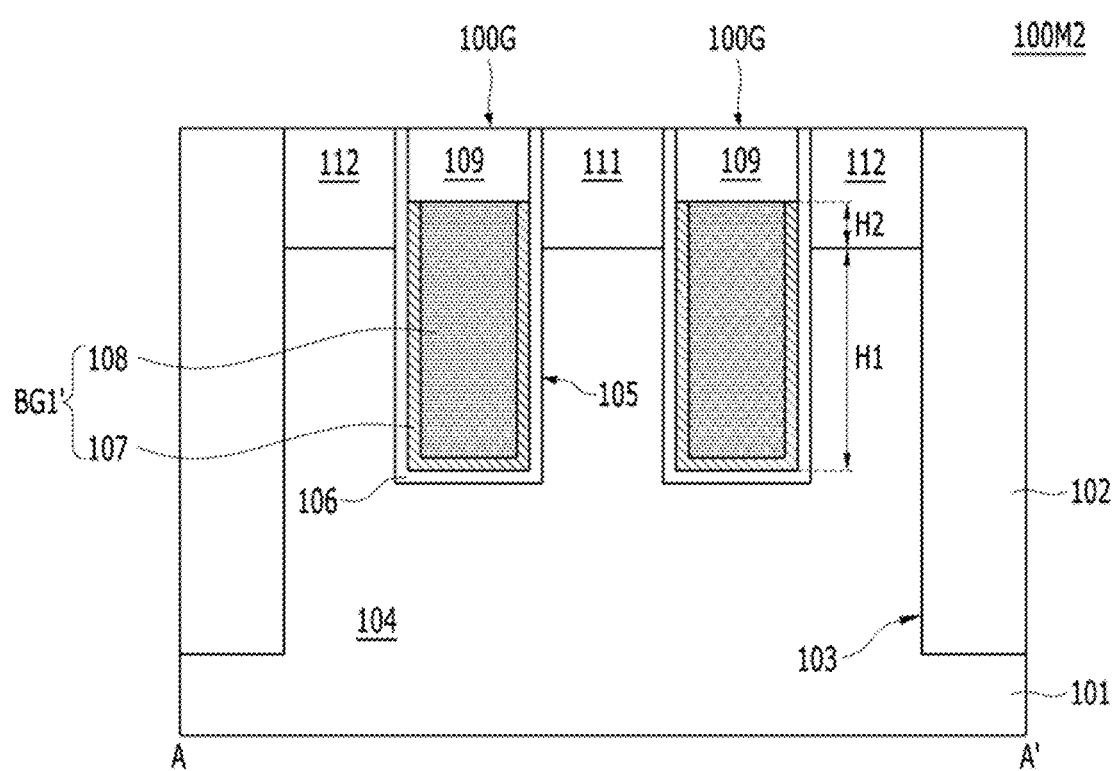

FIGS. 6A and 6B are cross-sectional views of semiconductor devices 100M1 and 100M2 in accordance with second modified examples of an embodiment of the present invention.

Referring to FIG. 6A, the constituent elements except for a gate electrode BG1' may be the same as the constituent elements of the semiconductor device 100 of FIG. 2A. In the semiconductor device 100M1, the upper portion of the gate electrode BG1' may partially overlap with the first doping region 111 and the second doping region 112. The lower portion of the gate electrode BG1 may overlap with a side wall of the gate trench 105 by a first height H1, The first height H1 may be defined as a height between the lower surfaces of the first doping region 111 and the second doping region 112 and the lowermost part of the gate trench 105. The upper portion of the gate electrode BG1' may overlap with the first doping region 111 and the second doping region 112 by a second height H2. The first height H1 may be longer than the second height H2.

Referring to FIG. 6B, the semiconductor device 100M2 is substantially identical to the semiconductor device 100M1 of FIG. 6A except that the semiconductor device 100M2 does not include the fin region 110.

FIGS. 7A to 8G are cross-sectional views illustrating a first example of a method for fabricating the semiconductor device in accordance with an embodiment of the present invention. Hereafter, FIGS. 7A to 8G illustrate the first example of the method for fabricating the semiconductor device 100 shown in FIGS. 2A and 2B. FIGS. 7A to 7G are cross-sectional views of the semiconductor device 100 taken along the line A-A' shown in FIG. 1. FIGS. 8A to 8G are cross-sectional views of the semiconductor device 100 taken along the line B-B' shown in FIG. 1.

Figure 7A:
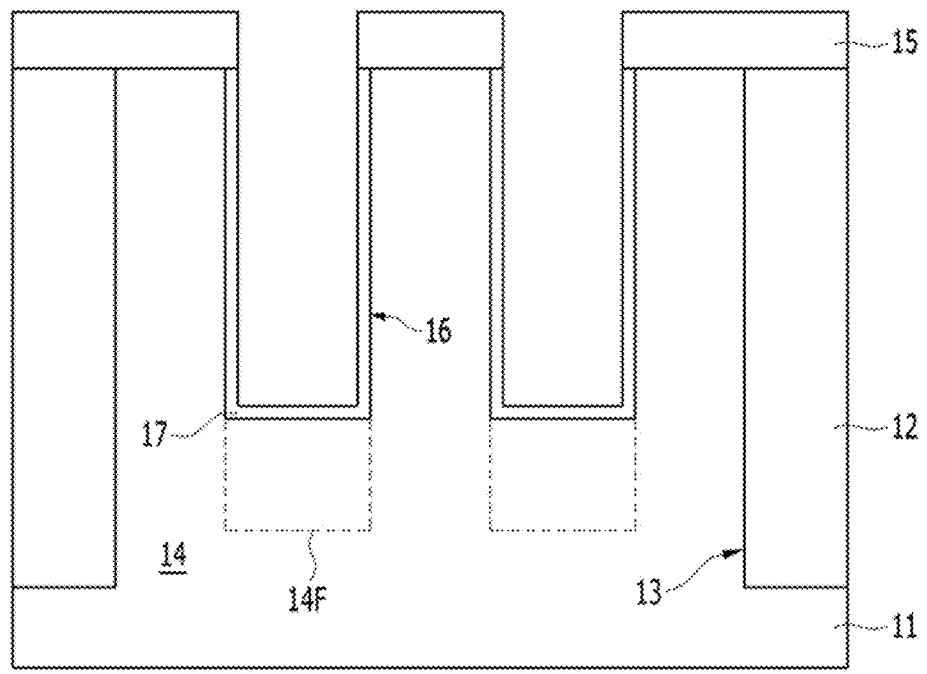
FIGS. 7A to 8G are cross-sectional views illustrating a first example of a method for fabricating the semiconductor device in accordance with an embodiment of the present invention.
Figure 8A:
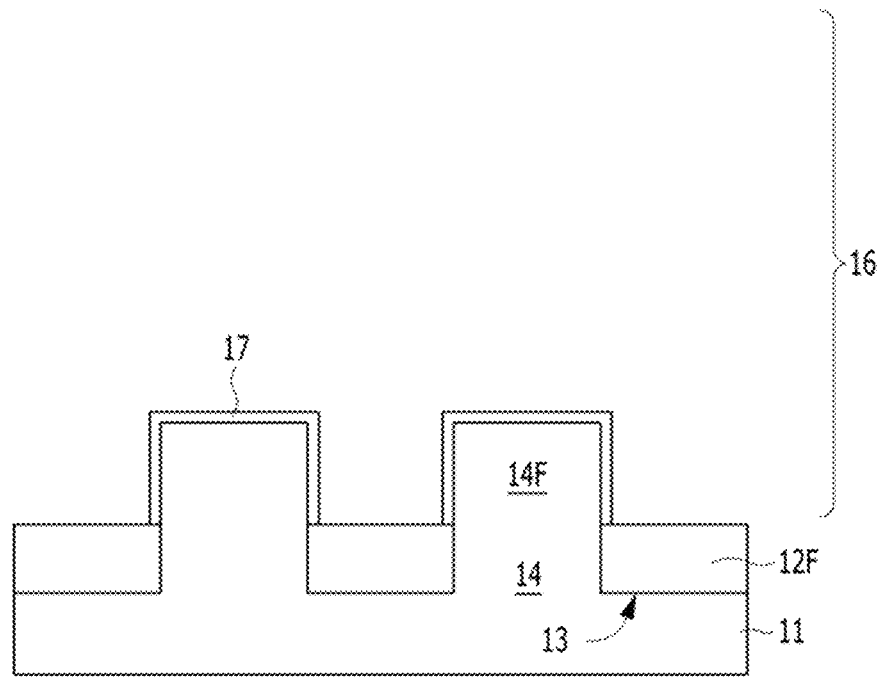

Referring to FIGS. 7A and 8A, an isolation layer 12 may be formed in a substrate 11. The isolation layer 12 may define an active region 14. The isolation layer 12 may be formed through a Shallow Trench Isolation (STI) process. The STI process may be performed as follows. An isolation trench 13 may be formed by etching the substrate 11. The isolation trench 13 may be filled with a dielectric material. As a result, the isolation layer 12 may be formed. The isolation layer 12 may be formed of any suitable material including, for example, a silicon oxide, a silicon nitride, or a combination thereof. The isolation trench 13 may be filled with a dielectric material through a Chemical Vapor Deposition (CVD) process or another deposition process. Also, a planarization process, such as Chemical-Mechanical Polishing (CMP) may be additionally performed following the deposition of the dielectric material.

A hard mask layer 15 may be formed over the substrate 11. The hard mask layer 15 may be formed of a material having an etch selectivity with respect to the substrate 11. The hard mask layer 15 may be formed of any suitable material including, for example, a silicon oxide. In an embodiment, the hard mask layer 15 may include TEAS (Tetra-Ethyl-Ortho-Silicate).

A gate trench 16 may be formed in the substrate 11. The gate trench 16 may have a shape of a line that intersects with the active region 14 and the isolation layer 12. The gate trench 16 may be formed by forming a mask pattern (not shown) over the substrate 11, and performing an etch process by using the mask pattern as an etch mask. The gate trench 16 may be formed to be shallower than the isolation trench 13. The depth of the gate trench 16 may be sufficiently deep to make a large average cross-sectional area of a buried gate electrode, which is to be formed subsequently. In this way, the resistance of the buried gate electrode may be decreased. The bottom edge of the gate trench 16 in FIG. 7A is substantially flat, however, the invention is not limited in this way. For example, in an embodiment, the bottom edge of the gate trench 16 may have a curvature. The curvature may reduce substantially the depression and protrusion in the bottom portion of the gate trench 16, and may thus facilitate the filling of the gate electrode.

A fin region 14F may be formed. The fin region 14F may be formed by recessing a portion of the isolation layer 12. For example, the fin region 14F may be formed by selectively removing the isolation layer 12 below the gate trench 16. The side wall of the fin region 14F may be exposed through the recessed isolation layer 12F.

Although not illustrated, after the fin region 14F is formed, a channel doping may be performed. The channel doping may be performed onto the bottom and side walls of the gate trench 16. In addition, a local channel doping may be performed onto the bottom of the gate trench 16. When the channel doping is performed, the doping concentration may be controlled.

Subsequently, a gate dielectric layer 17 may be formed onto the bottom surface and side walls of the gate trench 16. The gate dielectric layer 17 may cover the upper surface of the recessed isolation layer 12F and the side walls of the fin region 14F. Before the gate dielectric layer 17 is formed, the surface of the gate trench 16 that is damaged from the etch process may be recovered. For example, a sacrificial oxide may be formed through a thermal treatment and then the sacrificial oxide may be removed.

The gate dielectric layer 17 may be formed through a thermal oxidation process. For example, the gate dielectric layer 17 may be formed by oxidizing the bottom and side walls of the gate trench 16.

According to another embodiment of the present invention, the gate dielectric layer 17 may be formed through a deposition process, such as a Chemical Vapor Deposition (CVD) process or an Atomic Layer Deposition (ALD) process. When the gate dielectric layer 17 is formed through a deposition process, the gate dielectric layer 17 may cover the gate trench 16 and the hard mask layer 15. The gate dielectric layer 17 may include a high-k material, such as an oxide, a nitride, an oxynitride, or a combination thereof. The high-k material may include a hafnium-containing material. The hafnium-containing material may include a hafnium oxide, a hafnium silicon oxide, a hafnium silicon oxynitride, or a combination thereof. The high-k material may include a lanthanum oxide, a lanthanum aluminum oxide, a zirconium oxide, a zirconium silicon oxide, a zirconium silicon oxynitride, an aluminum oxide, and combinations thereof. Other known high-k materials may also be selected and used.

According to another embodiment of the present invention, the gate dielectric layer 17 may be formed by depositing a liner polysilicon layer and then radical-oxidizing the liner polysilicon layer.

According to another embodiment of the present invention, the gate dielectric layer 17 may be formed by forming a liner silicon nitride layer and then radical-oxidizing the liner silicon nitride layer.

Figure 7B:
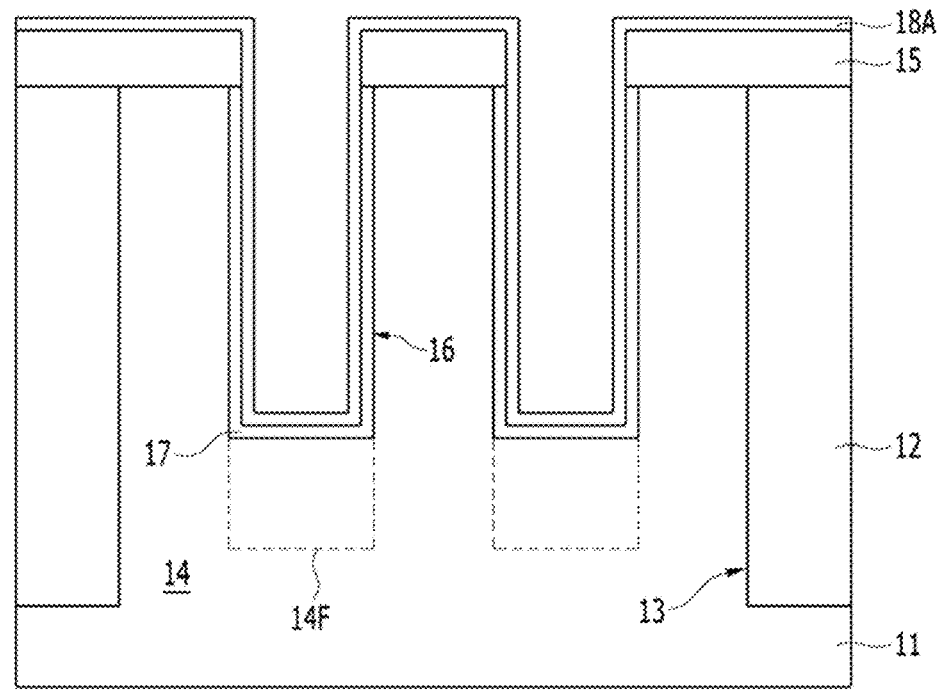
Figure 8B:
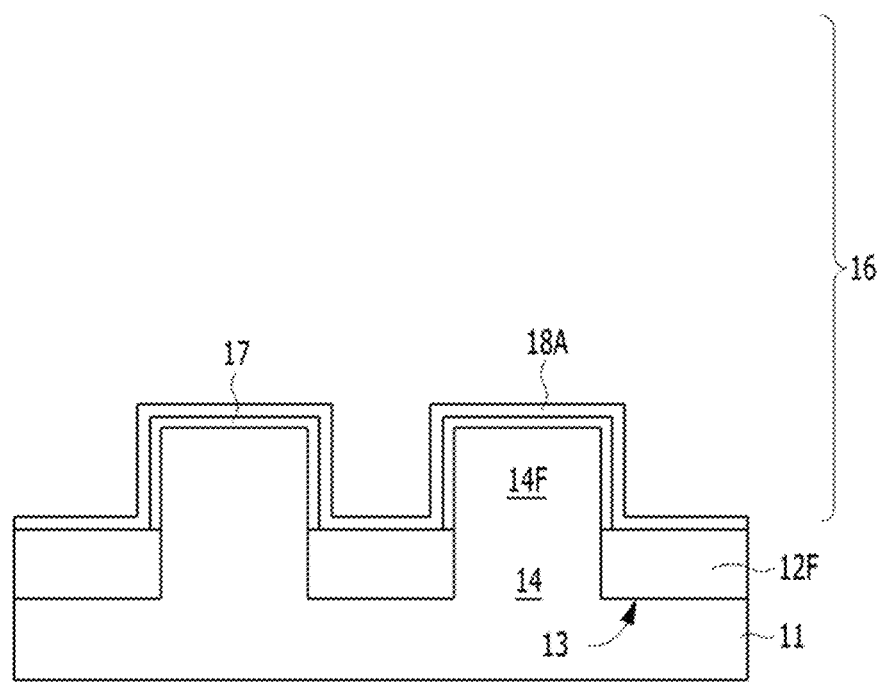

Referring to FIGS. 7B and 8B, a first conductive layer 18A may be formed over the gate dielectric layer 17. The first conductive layer 18A may be conformally formed on the surface of the gate dielectric layer 17. The first conductive layer 18A may be formed of a conductive material. The first conductive layer 18A may be formed through a CVD process or an ALD process. The first conductive layer 18A may be a thin layer. For example, the first conductive layer 18A may be a continuous layer that is formed in a uniform thickness over the gate dielectric layer 17 along the internal wall of the gate trench 16. The first conductive layer 18A may be formed of any suitable material having a lower resistance than polysilicon. The first conductive layer 18A may be formed of a metal-based material. The first conductive layer 18A may be formed of any suitable material including a metal, a metal nitride, or a combination thereof. According to an embodiment of the present invention, the first conductive layer 18A may include a metal nitride, or more specifically be formed of a titanium nitride (TiN). The first conductive layer 18A may be polycrystalline. The first conductive layer 18A may be of a titanium nitride having columnar crystal grains. In an embodiment, the first conductive layer 18A may be formed in a thickness ranging from approximately 30 Å to approximately 40 Å. The first conductive layer 18A may be deposited at a temperature ranging from approximately 500° C. to approximately 650° C. The temperature of approximately 500° C. to approximately 650° C. may be referred to as middle temperature MT. The first conductive layer 18A may be an ALD-TiN that is formed of $TiCl_4$ and $NH_3$. The ALD-TiN may be deposited at the temperature of approximately 500° C. to approximately 650° C. Therefore, in an embodiment, the first conductive layer 18A may include an MT-ALD TiN.

Figure 7C:
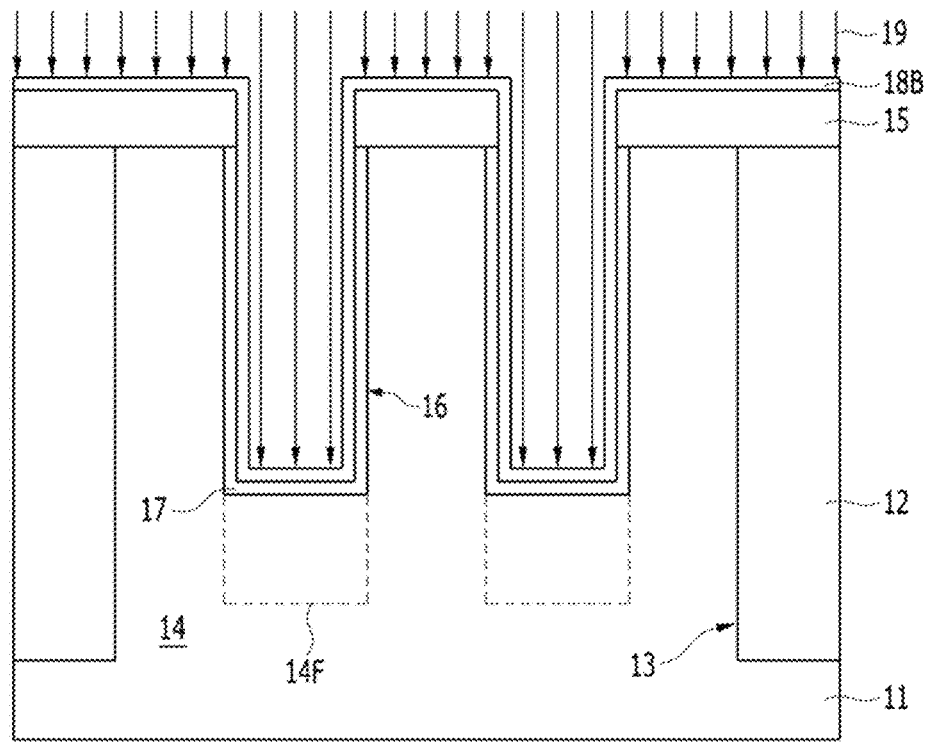
Figure 8C:
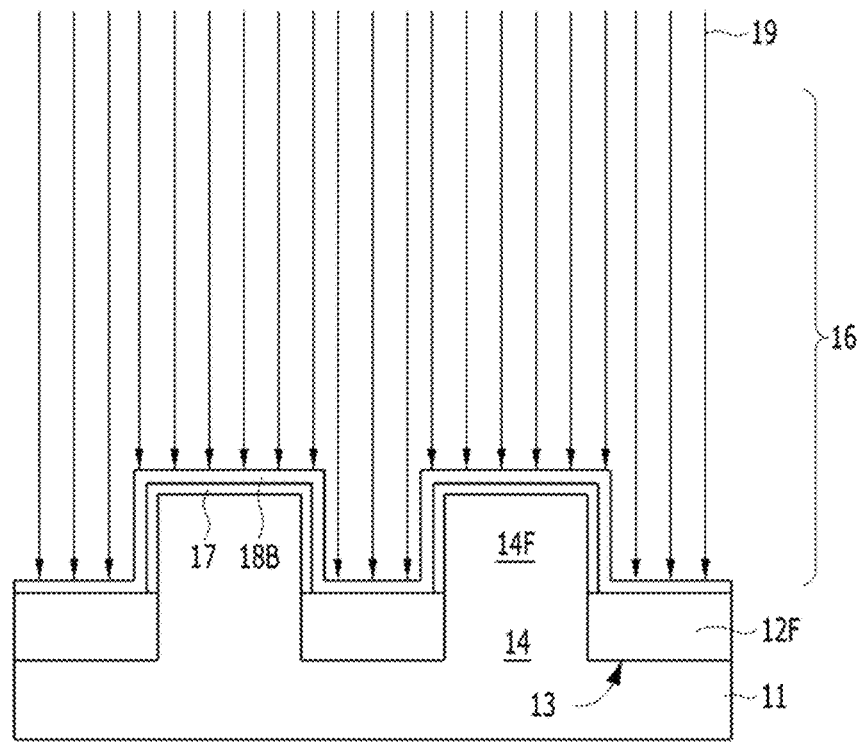

Referring to FIGS. 7C and 8C, a physical damage process 19 may be performed. The physical damage process 19 may include a process that may damage the first conductive layer 18A. The physical damage process 19 may include a Reactive Ion Etching (RIE) process or an ion implantation process.

Through the physical damage process 19, the first conductive layer 18A may be converted into a damaged first conductive layer 18B. The damaged first conductive layer 18B may be an amorphous layer. Hereafter, the damaged first conductive layer 18B may be referred to as an amorphous first conductive layer 18B'. The first conductive layer 18A before the physical damage) process 19 is polycrystalline, but the first conductive layer 18A that is exposed to the physical damage process 19 is converted into the amorphous first conductive layer 18B.

According to some embodiments of the present invention, the implantation process of the physical damage process 19 may use a dopant. Therefore the amorphous first conductive layer 18B may include a doped dopant. The dopant may be any suitable dopant including, for example, nitrogen (N), carbon (C), fluorine (F), ammonia ($NH_3$) and the like. The amorphous first conductive layer 18B may be doped with a dopant through the implantation process. According to some embodiments of the present invention, nitrogen (N), carbon (C), and fluorine (F) may be able to engineer the work function of the amorphous first conductive layer 18B. For example, the dopant doping the amorphous first conductive layer 18B may be able to engineer the work function of the amorphous first conductive layer 18B into a high work function. The high work function material that covers the fin region 14F may be able to improve the threshold voltage of a transistor.

Figure 7D:
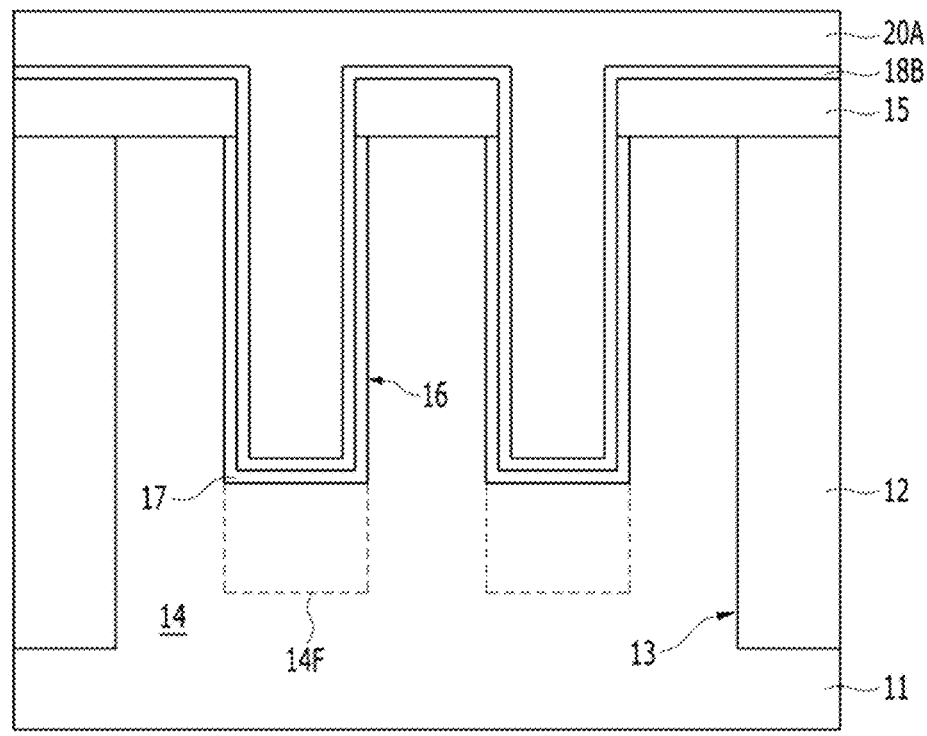
Figure 8D:
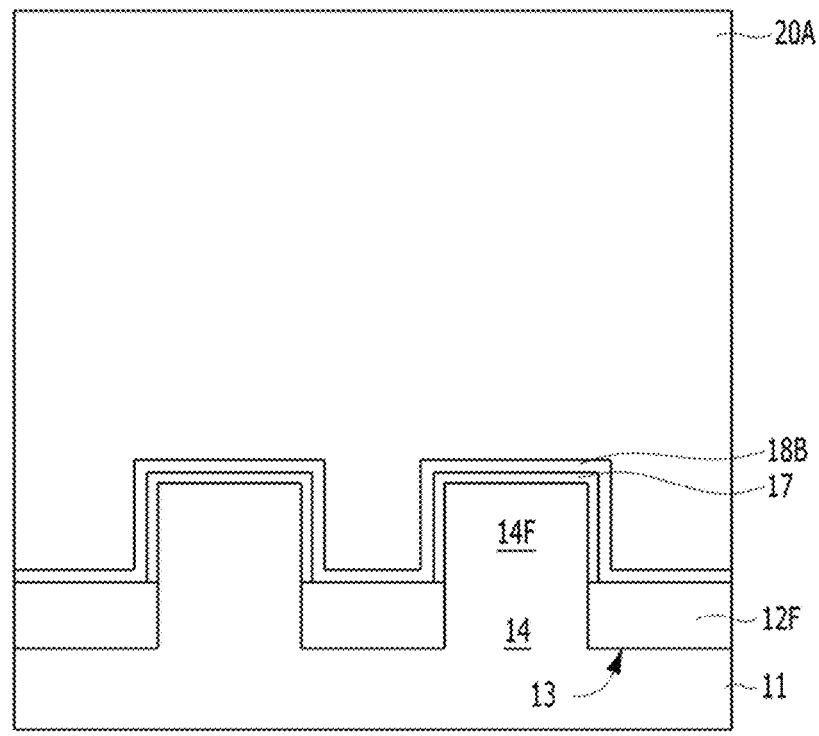

Referring to FIGS. 7D and 8D, a second conductive layer 20A may be formed over the amorphous first conductive layer 18B. The second conductive layer 20A over the amorphous first conductive layer 18B may fill the gate trench 16. The amorphous first conductive layer 18B and the second conductive layer 20A may be formed of the same material. The second conductive layer 20A may be formed through a CVD process or an ALD process. The second conductive layer 20A may be formed of any suitable material having a lower resistance than polysilicon. The second conductive layer 20A may be a metal-based material. The second conductive layer 20A may be formed of any suitable material including a metal, a metal nitride, or a combination thereof. The second conductive layer 20A may be formed of a titanium nitride (TiN). The second conductive layer 20A may be polycrystalline. The second conductive layer 20A may be a titanium nitride having columnar crystal grains. The second conductive layer 20A may fill the gate trench 16. The second conductive layer 20A may be formed in a thickness that is equal to or greater than approximately 200 Å. The second conductive layer 20A may be deposited at a temperature ranging from approximately 500° C. to approximately 600° C. The second conductive layer 20A may be an ALD-TiN that is formed of $TiCl_4$ and $NH_3$. The ALD-TiN may be deposited at the temperature of approximately 500° C. to approximately 600° C. Therefore, the second conductive layer 20A may include an MT-ALD TiN.

The damaged first conductive layer 18B, which is the amorphous first conductive layer 18B, may increase its interface energy, when the second conductive layer 20A is formed. Hence, during a subsequent annealing process, the growth of crystal grains may be delayed in the portion contacting the gate dielectric layer 17.

Figure 7E:
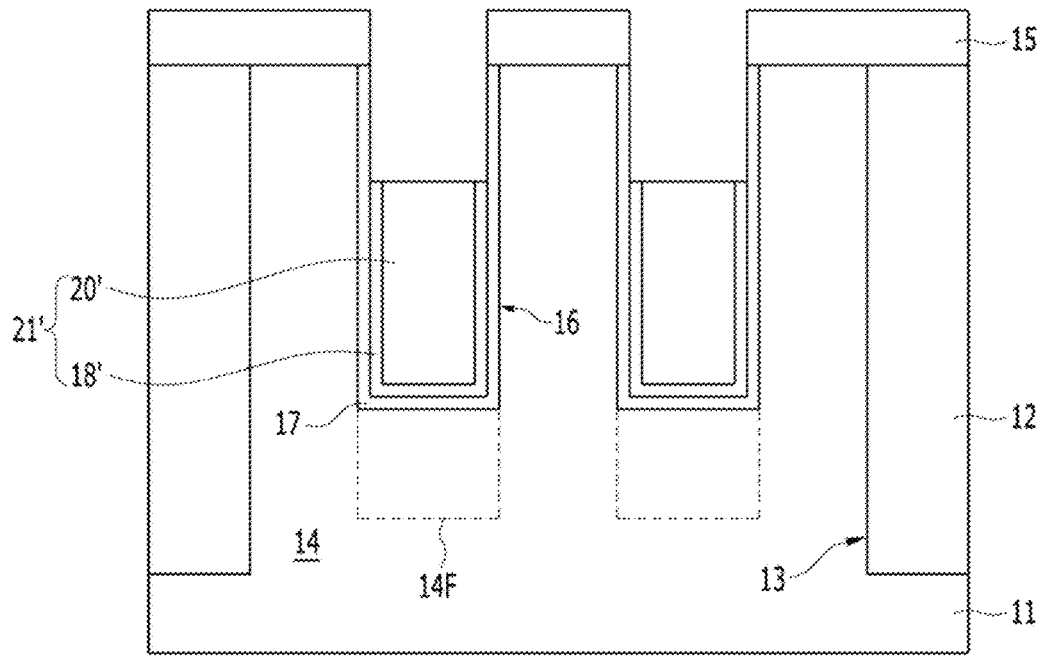
Figure 8E:
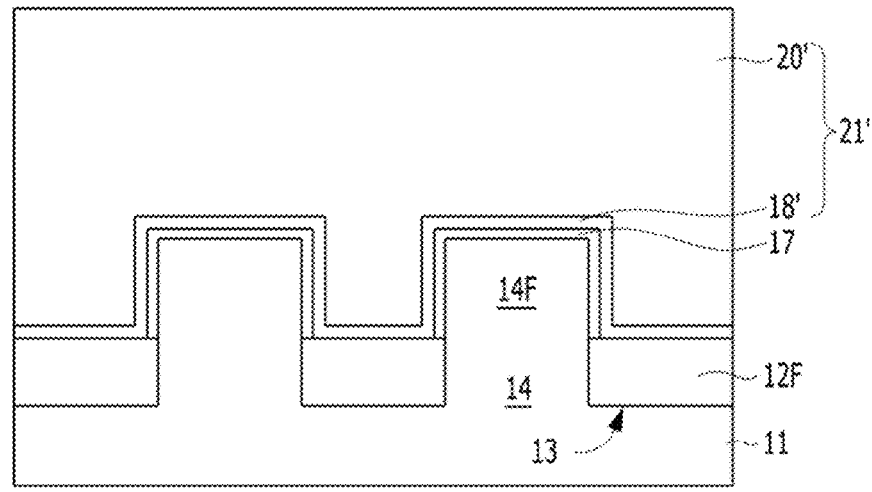

Referring to FIGS. 7E and 8E, a gate electrode 21' may be formed. The gate electrode 21' may include an amorphous first conductive layer pattern 18' and a second conductive layer pattern 20'. The gate electrode 21' may be formed by recessing the amorphous first conductive layer 18B and the second conductive layer 20A through an etch-back process. The gate electrode 21' may be positioned at a lower level than the upper surface of the active region 14. As a result, the gate electrode 21' may be positioned inside of the gate trench 16. Before the etch-back process is performed, a planarization process using a Chemical Mechanical Polishing (CMP) may be performed in advance. The CMP process may be performed by taking the hard mask layer 15 as an end point. As a result of performing the CMP process and the etch-back process onto the second conductive layer 20A, the second conductive layer pattern 20' may be performed. Also, the amorphous first conductive layer pattern 18' may be formed by performing the CMP process and the etch-back process onto the amorphous first conductive layer 18B.

The gate electrode 21' may include the amorphous first conductive layer pattern 18' and polycrystalline second conductive layer pattern 20'. The amorphous first conductive layer pattern 18' may cover the gate dielectric layer 17. The polycrystalline second conductive layer pattern 20' may not contact the gate dielectric layer 17.

Figure 7F:
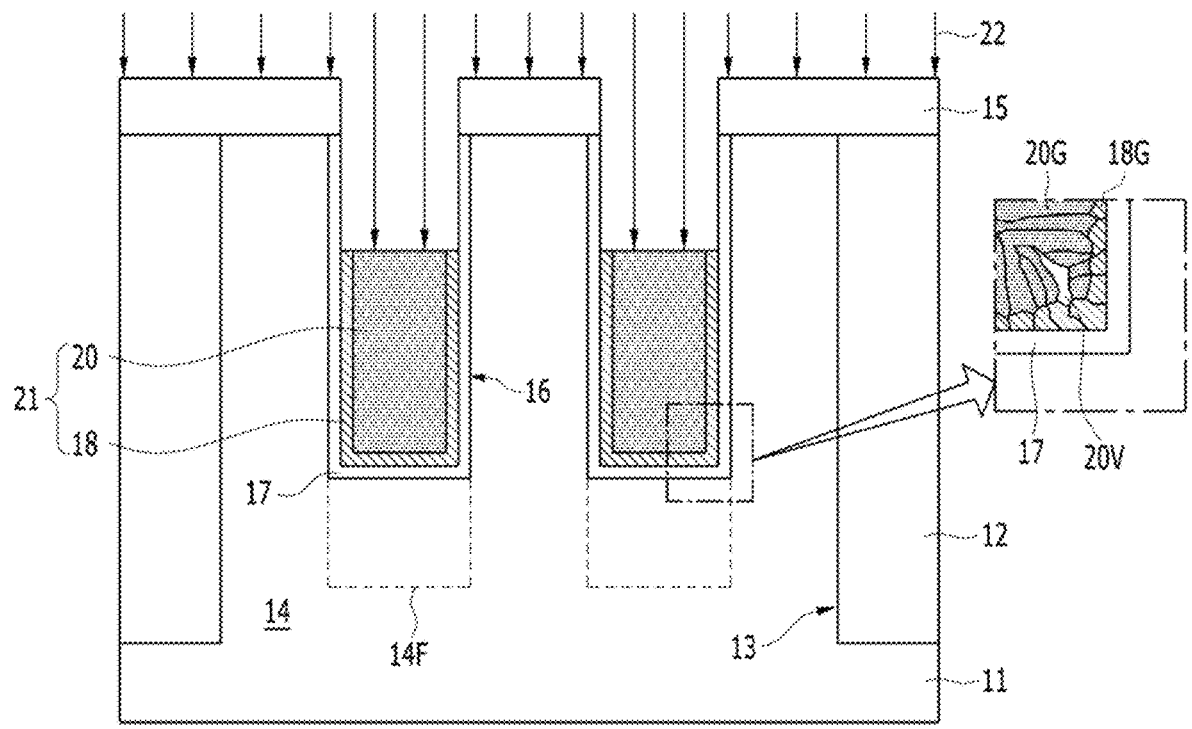
Figure 8F:
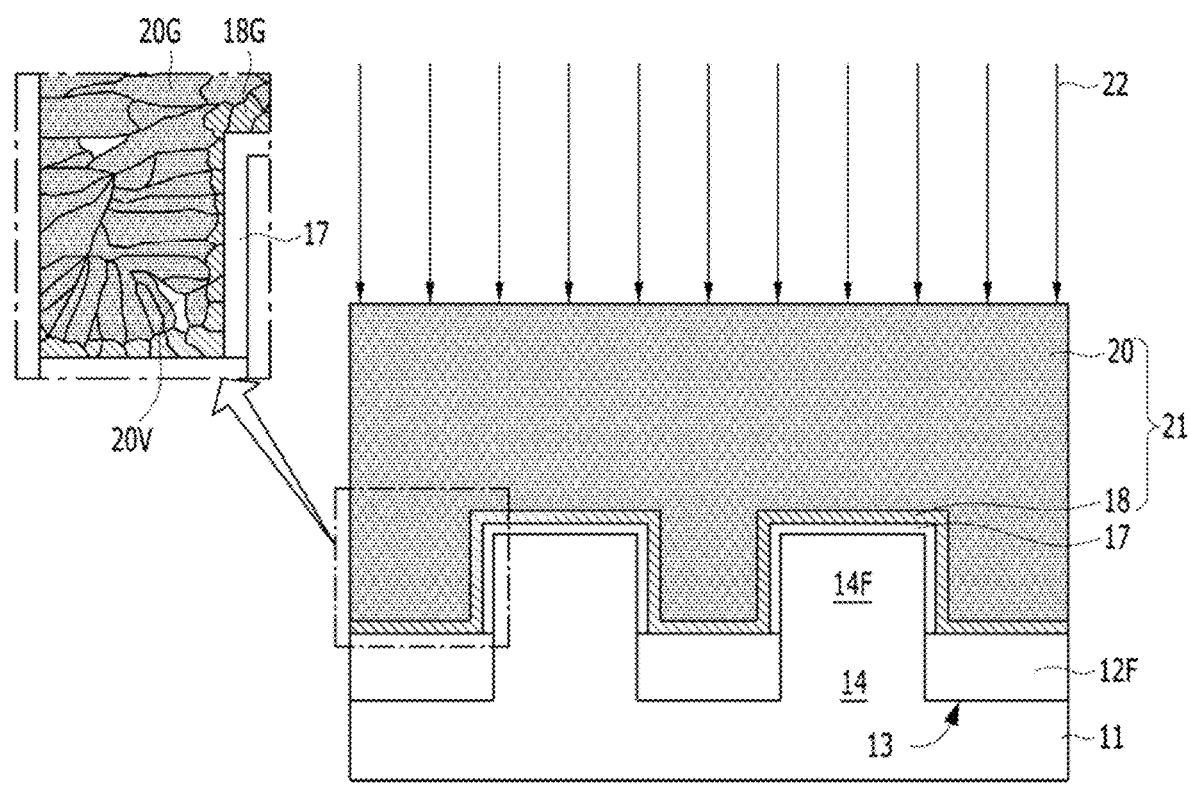

Referring to FIGS. 7F and 8F, an annealing process 22 may be performed. The second conductive layer pattern 20' and the amorphous first conductive layer pattern 18' may be exposed to the annealing process 22. Through the annealing process 22, crystal grains may grow up. In other words, the second conductive layer pattern 20' and the amorphous first conductive layer pattern 18' may be crystalized through the annealing process 22. The annealing process 22 may be performed at a high, temperature. For example, the annealing process 22 may be performed at a temperature of from approximately 300° C. to approximately 1100° C.

Through the annealing process 22, the gate electrode 21' may be converted into Polycrystalline gate electrode 21. For example, the amorphous first conductive layer pattern 18' may be converted into a polycrystalline material and the second conductive layer pattern 20' may be converted into a polycrystalline material having a larger crystal grain size.

As described above, when the amorphous first conductive layer pattern 18' and the second conductive layer pattern 20' are exposed to the annealing process 22, they may be converted into polycrystalline materials through a crystal grain growth. The amorphous first conductive layer pattern 18' may have a slower crystal grain growth speed than the second conductive layer pattern 20'.

The gate electrode 21 may include a first crystal grain layer 18 and a second crystal grain layer 20. The first crystal grain layer 18 may be formed through the crystal grain growth of the amorphous first conductive layer pattern 18'. The second crystal grain layer 20 may be formed through the crystal grain growth of the second conductive layer pattern 20'. The first crystal grain layer 18 may cover the gate dielectric layer 17. The first crystal grain layer 18 may cover the upper surface and side walls of the fin region 14F. The second crystal grain layer 20 may fill the gate trench 16 over the first crystal grain layer 18. The first crystal grain layer 18 may be disposed between the second crystal grain layer 20 and the gate dielectric layer 17.

The first crystal grain layer 18 may include a plurality of first crystal grains 18G. The second crystal grain layer 20 may include a plurality of second crystal grains 20G. The first crystal grains 18G may correspond to the first crystal grains 107G shown in FIG. 3A. The second crystal grains 20G may correspond to the second crystal grains 108G shown in FIG. 3A. For example, the first crystal grains 18G and the second crystal grains 20G may be metal crystal grains or metal nitride crystal grains. In an embodiment, the first crystal grains 18G and the second crystal grains 20G may be TiN crystal grains.

Since the first crystal grains 18G grow from the amorphous first conductive layer pattern 18', the first crystal grains 18G may have a small crystal grain size. Since the second crystal grains 20G grow from the polycrystalline second conductive layer pattern 20', the second crystal grains 20G may have a large crystal grain size. Therefore, the first crystal grains 18G may have a smaller crystal grain size than the second crystal grains 20G.

The polycrystalline second conductive layer (20A of FIG. 7D) may include a plurality of voids 20V that are generated during a deposition process. While the second crystal grains 20G grow through the annealing process 22, the voids 20V may grow or may be maintained. Therefore, the second crystal grain layer 20 may include the voids 20V. The voids 20V may have a relatively large size.

Since the first crystal grain layer 18 is formed through the growth of the crystal grains of the amorphous first conductive layer pattern 18', the first crystal grain layer 18 may be substantially free of any voids or if there are any voids their size is relatively small compared to the size of the voids 20V. The number of any voids in the first crystal grain layer 18, if there are any, may be small.

Figure 7G:
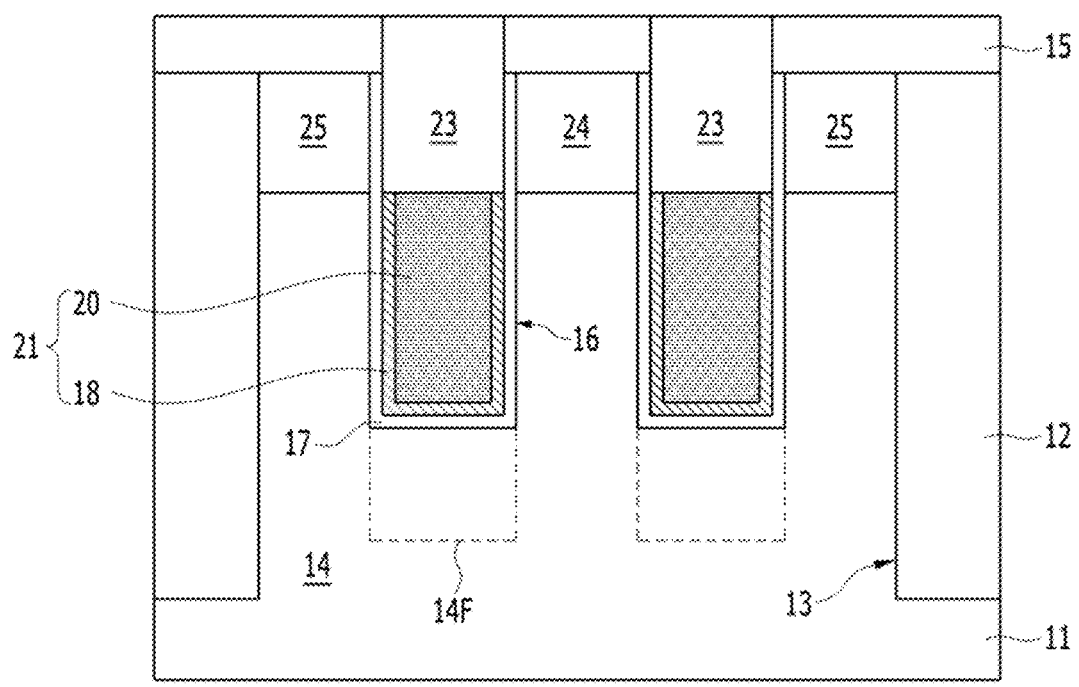
Figure 8G:
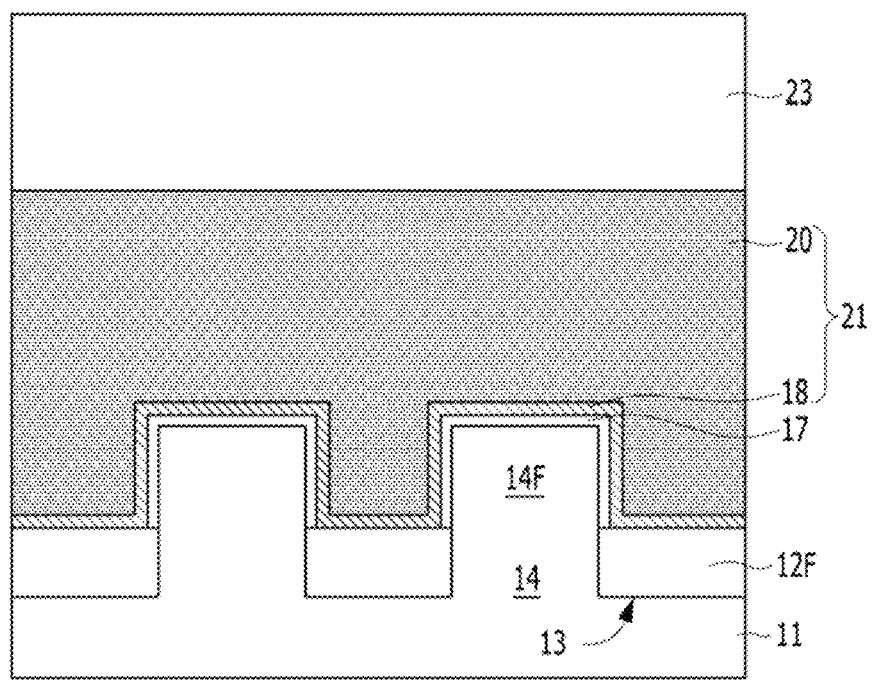

Referring to FIGS. 7G and 8G, a capping layer 23 may be formed over the gate electrode 21. The capping layer 23 may be formed of any suitable a dielectric material. The gate trench 16 may be filled with the capping layer 23 over the gate electrode 21. In an embodiment, the capping layer 23 may be formed of a silicon nitride. Subsequently, the capping layer 23 may be planarized in such a manner that the upper surface of the hard mask layer 15 is exposed. According to another embodiment of the present invention, the capping layer 23 may be formed of any suitable material including for example, a silicon oxide. According to another embodiment of the present invention, the capping layer 23 may have a NON (Nitride-Oxide-Nitride) structure.

As the capping layer 23 is formed, a buried gate structure may be formed. The buried gate structure may include the gate dielectric layer 17, the first crystal grain layer 18, the second crystal grain layer 20, and the capping layer 23. The buried gate structure may have a recessed shaped filling a portion of the gate trench 16. The buried gate structure may be positioned at a lower level than the uppermost surface of the active region 14.

Subsequently, a first doping region 24 and a second doping region 25 may be formed. The first doping region 24 and the second doping region 25 may be formed through any suitable doping process, such as, for example, an ion implantation process. The first doping region 24 and the second doping region 25 may have the same depth. According to another embodiment of the present invention, the first doping region 24 may be deeper than the second doping region 25.

As described above, the physical damage process 19 is performed after the first conductive layer 18A is deposited in the fabrication process according to the first example. For this reason, when the annealing process 22 is performed, the first crystal grains 18G may be formed on the interface with the gate dielectric layer 17 without voids.

FIGS. 9A to 9D are cross-sectional views illustrating a second example of a method for fabricating the semiconductor device in accordance with an embodiment of the present invention. Hereafter, FIGS. 9A to 9D illustrate the second example of the method for fabricating the semiconductor device 100 shown in FIG. 2A.

First of all, referring to FIG. 7A, the structures from the isolation layer 12 to the gate dielectric layer 17 may be formed over the substrate 11.

Figure 9A:
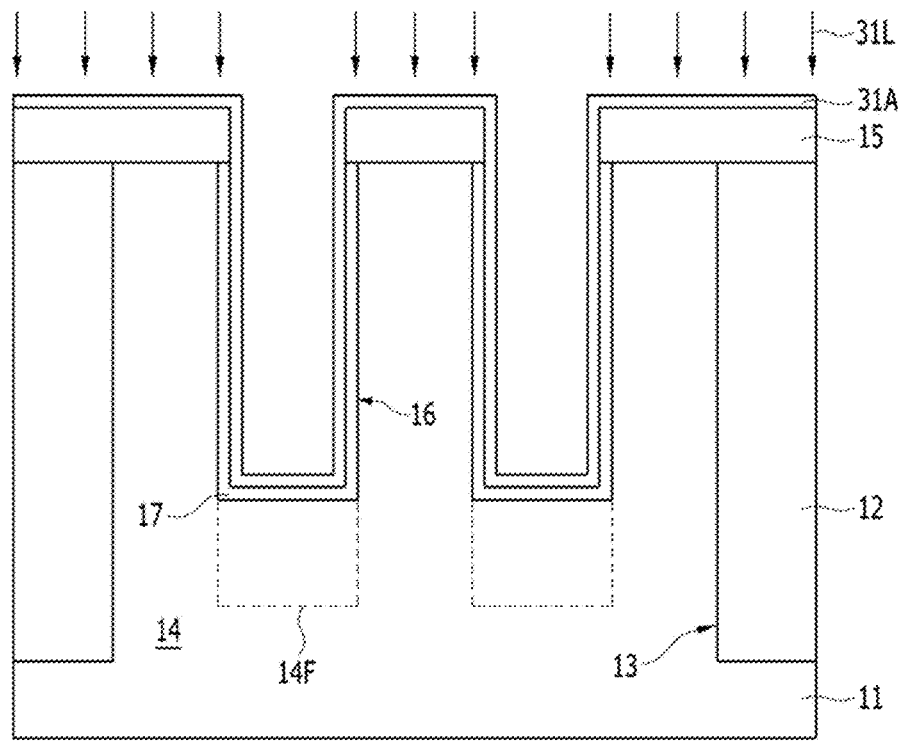
FIGS. 9A to 9D are cross-sectional views illustrating a second example of a method for fabricating the semiconductor device in accordance with an embodiment of the present invention.

Referring to FIG. 9A, a first conductive layer 31A may be formed over the gate dielectric layer 17. The first conductive layer 31A may be conformally formed on the surface of the gate dielectric layer 17. The first conductive layer 31A may be formed of any suitable material including a metal, a metal nitride, or a combination thereof. The first conductive layer 31A may be formed of a titanium nitride (TiN). The first conductive layer 31A may be polycrystalline. The first conductive layer 31A may be formed of a titanium nitride having columnar crystal grains. The first conductive layer 31A may be formed in a thickness ranging from approximately 30 Å to approximately 40 Å.

The first conductive layer 31A may be formed through a low-temperature process 31L. As a result of the low-temperature process 31L, the first conductive layer 31A may be formed to have a small crystal grain size. The first conductive layer 31A may be formed at a lower temperature than the temperature that the first conductive layer 18A shown in FIG. 75 is formed. The first conductive layer 31A may be deposited at a temperature that is equal to or lower than approximately 500° C. The temperature of approximately 500° C. or lower may be referred to as low temperature LT. The first conductive layer 31A may be formed of $TiCl_4$ and $NH_3$. The first conductive layer 31A may be formed of a titanium nitride (LT-TiN) that is, deposited at a low temperature. The first conductive layer 31A may be formed of a titanium nitride (ALD-TiN) that is formed through an Atomic Layer Deposition (ALD) process. The ALD-TiN may be deposited at a temperature ranging from approximately 50° C. to approximately 500° C. The first conductive layer 31A may include an LT-ALD-TiN.

As described above, agglomeration occurring on the interface between the first conductive layer 31A and the gate dielectric layer 17 may be delayed during a subsequent annealing process by forming the first conductive layer 31A to have a small crystal grain size. In short, the growth of crystal grains of the first conductive layer 31A may be delayed on the interface between the first conductive layer 31A and the gate dielectric layer 17.

When the first conductive layer 31A is deposited through the low-temperature process 31L, the crystal grain size of the first conductive layer 31A may be smaller than the crystal grain size of the first conductive layer 18A (see FIG. 7B) that is deposited at the middle temperature MT.

Figure 9B:
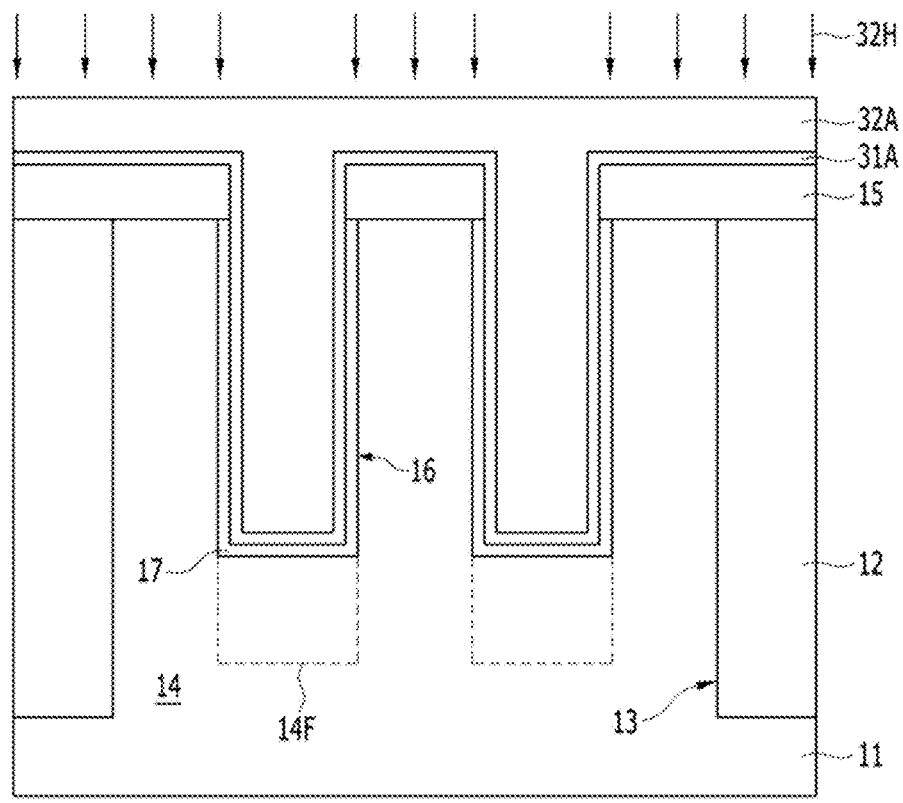

Referring to FIG. 9B, a second conductive layer 32A may be formed over the first conductive layer 31A. The second conductive layer 32A over the first conductive layer 31A may fill the gate trench 16. The second conductive layer 32A and the first conductive layer 31A may be formed of the same material. The second conductive layer 32A may be formed of any suitable material including a metal, a metal nitride, or a combination thereof. The second conductive layer 32A may be formed of a titanium nitride (TiN). The second conductive layer 32A may be polycrystalline. The second conductive layer 32A may be a titanium nitride having columnar crystal grains.

The second conductive layer 32A may be formed through a high-temperature process 32H. The second conductive layer 32A may be deposited at a higher temperature than the temperature that the first conductive layer 31A is deposited. When the second conductive layer 32A is deposited through the high-temperature process 32H, the crystal grain size of the second conductive layer 32A that is deposited through the high-temperature process 32H may be larger than the crystal grain size of the second conductive layer 32A that is deposited at the middle temperature MT. The second conductive layer 32A may be formed to have a larger crystal grain size than the crystal grain size of the first conductive layer 31A. The second conductive layer 32A may be formed at a temperature of from approximately 600° C. or higher. The temperature of approximately 600° C. or higher may be called high temperature HT. The second conductive layer 32A may be formed of $TiCl_4$ and $NH_3$. The second conductive layer 32A may be formed of a titanium nitride (HT-TiN) that is deposited at a high temperature. The second conductive layer 32A may be formed of a titanium nitride (ALD-TiN) that is formed through an Atomic Layer Deposition (ALD) process. The ALD-TiN may be deposited at a temperature of from approximately 600° C. or higher. The second conductive layer 32A may include a HT-ALD-TiN.

As described above, since the second conductive layer 32A is formed to have a large crystal grain size, the resistance may be decreased.

Figure 9C:
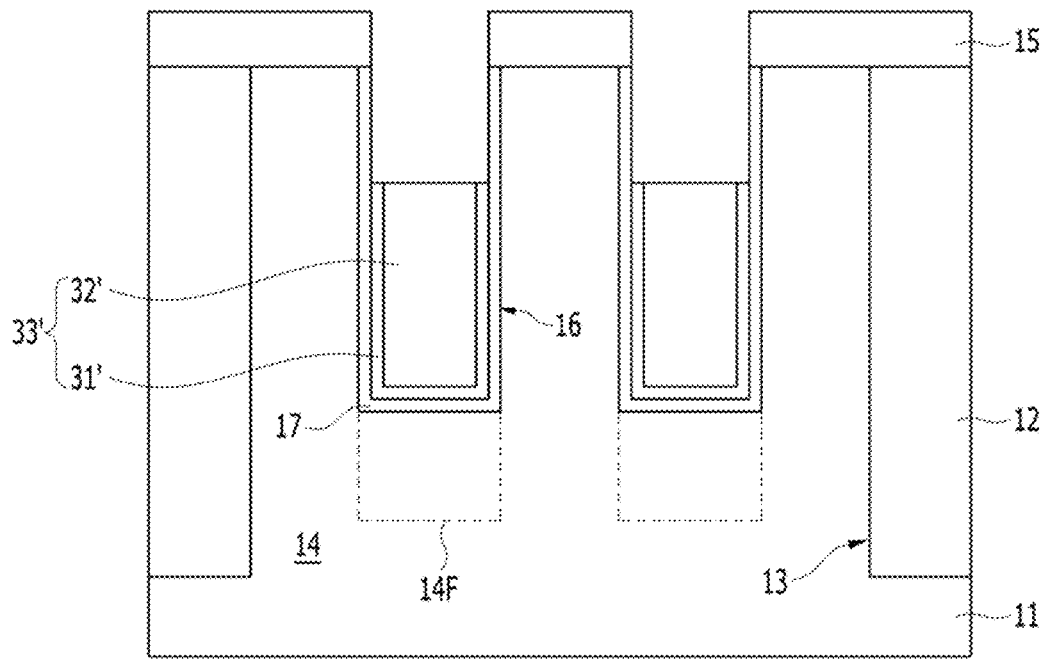

Referring to FIG. 9C, a gate electrode 33' may be formed. The gate electrode 33' may include a first conductive layer pattern 31' and a second conductive layer pattern 32'. The gate electrode 33' may be formed by recessing the first conductive layer 31A and the second conductive layer 32A through an etch-back process. The gate electrode 33' may be positioned at a lower level than the upper surface of the active region 14. As a result, the gate electrode 33' may be positioned inside of the gate trench 16 with the top surface of the gate electrode positioned at a lower level than the top of the gate trench. Before the etch-back process is performed, a planarization process using a Chemical Mechanical Polishing (CMP) may be performed in advance. The CMP process may be performed by taking the hard mask layer 15 as an end point.

As a result of performing the CMP process and the etch-back process onto the second conductive layer 32A, the second conductive layer pattern 32' may be performed. Also, the first conductive layer pattern 31' may be formed by performing the CMP process and the etch-back process onto the first conductive layer 31A.

The gate electrode 33' may include the first conductive layer pattern 31' and the second conductive layer pattern 32'.

The first conductive layer pattern 31' and the second conductive layer pattern 32' may be polycrystalline. The first conductive layer pattern 31' may include crystal gains of small crystal grain sizes. The second conductive layer pattern 32' may include crystal gains of large crystal grain sizes. The first conductive layer pattern 31' may include the LT-TiN. The second conductive layer pattern 32' may include the HT-TiN. The first conductive layer pattern 31' may cover and contact the gate dielectric layer 17. The second conductive layer pattern 32' may not contact the gate dielectric layer 17.

Figure 9D:
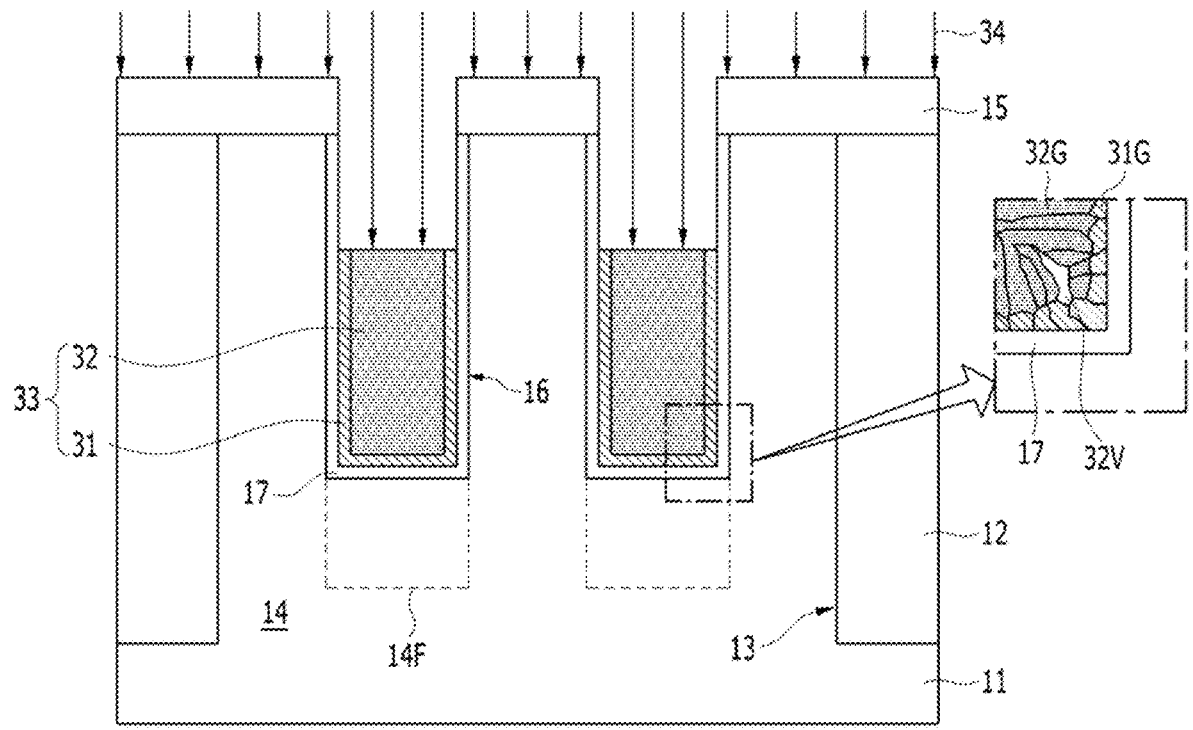

Referring to FIG. 9D, an annealing process 34 may be performed. The second conductive layer pattern 32' and the first conductive layer pattern 31' may be exposed to the annealing process 34. Through the annealing process 34, crystal grains may grow up. In other words the second conductive layer pattern 32' and the first conductive layer pattern 31' may be crystalized through the annealing process 34. The annealing process 34 may be performed at a temperature ranging from approximately 300° C. to approximately 1100° C.

Through the annealing process 34, the gate electrode 33' may be converted into a gate electrode 33 with grown crystal grains. The gate electrode 33 may include a first crystal grain layer 31 and a second crystal grain layer 32. The first crystal grain layer 31 may be formed as the crystal grains of the first conductive layer pattern 31' grow up. The second crystal grain layer 32 may be formed as the crystal grains of the second conductive layer pattern 32' grow up. The first crystal grain layer 31 may cover and contact the gate dielectric layer 17. The first crystal grain layer 31 may cover the upper surface and side walls of the fin region 14F. The second crystal grain layer 32 may fill the gate trench 16 over the first crystal grain layer 31. The first crystal grain layer 31 may be disposed between the second crystal grain layer 32 and the gate dielectric layer 17.

The first crystal grain layer 31 may include a plurality of first crystal grains 31G. The second crystal grain layer 32 may include a plurality of second crystal grains 32G. The first crystal grains 31G may correspond to the first crystal grains 107G of FIG. 3A. The second crystal grains 32G may correspond to the second crystal grains 108G of FIG. 3A. The first crystal grains 31G and the second crystal grains 32G may be TiN crystal grains.

Since the first crystal grains 31G grow up from the first conductive layer pattern 31', the first crystal grains 31G may have a small crystal grain size. Since the second crystal grains 32G grow up from the second conductive layer pattern 32', the second crystal grains 32G may have a large crystal grain size. Therefore the crystal grain size of the first crystal grains 31G may be smaller than the crystal grain size of the second crystal grains 32G.

The crystal grain size of the first crystal grains 31G may be larger than the crystal grain size of the first conductive layer 31A. Also, the crystal grain size of the second crystal grains 32G may be larger than the crystal grain size of the second conductive layer 32A, The difference between the crystal grain size after the deposition process and the crystal grain size after the annealing process 34 may originate from the growth of the crystal grains through the annealing process 34.

When the first conductive layer pattern 31' having a small crystal grain size is exposed to the annealing process 34, agglomeration occurring on the interface between the first conductive layer pattern 31' and the gate dielectric layer 17 may be delayed. As a result, the growth of the crystal grains of the first conductive layer pattern 31' may be delayed on the interface between the first conductive layer 31A and the gate dielectric layer 17. Hence, the first crystal grains 31G contacting the gate dielectric layer 17 may grow up in a small crystal grain size. Conversely, the second crystal grains 32G that do not contact the gate dielectric layer 17 may grow up in a large crystal grain size.

The second conductive layer (32A of FIG. 9B) may include a plurality of voids 32V that are generated during a deposition process. While the second crystal grains 32G grow through the annealing process 34, the voids 32V may grow or may be maintained. Therefore, the second crystal grain layer 32 may include the voids 32V. The voids 32V may have relatively large sizes.

Since the first crystal grain layer 31 is formed through the growth of the crystal grains of the first conductive layer pattern 31', the first crystal grain layer 31 may be substantially free of voids, According to another embodiment of the present invention, there may be some voids in the first crystal grain layer 31, however, their size and number may be substantially smaller than the size and number of the 32V voids.

Subsequently, through the method illustrated in FIG. 7G, the capping layer 23, the first doping region 24, and the second doping region 25 may be sequentially formed.

Figure 10:
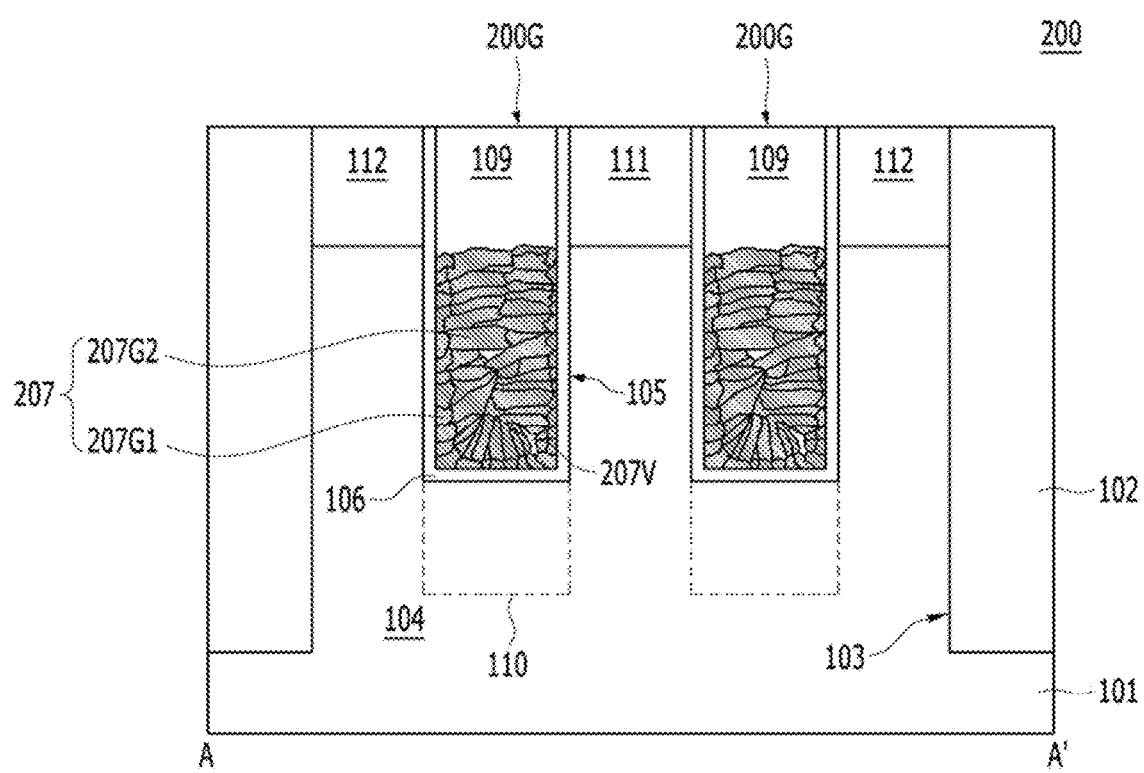
FIG. 10 is a cross-sectional view illustrating a semiconductor device in accordance with an embodiment of the present invention.

FIG. 10 is a cross-sectional view illustrating semiconductor device 200 in accordance with an embodiment of the present invention. The semiconductor device 200 is identical to the semiconductor device 100 of FIG. 2A except for a gate electrode 207.

The semiconductor device 200 may include a substrate 101, a gate trench 105, a fin region 110, a buried gate structure 200G, a first doping region 111, and a second doping region 112. The buried gate structure 200G may include a gate dielectric layer 106, a gate electrode 207, and a capping layer 109. Whereas the gate electrode BG1 of the semiconductor device 100 has a bi-layer structure, the gate electrode 207 has a single-layer structure. In other words, a conductive layer for forming the gate electrode 207 may be formed at a uniform temperature without a change in the deposition temperature or a physical damage process. The conductive layer may be able to fill the gate trench 105 through a low-temperature process or a high-temperature process.

Referring to FIG. 10, the gate electrode 207 may be polycrystalline. The gate electrode 207 may include first crystal grains 207G1 and second crystal grains 207G2. The first crystal grains 207G1 may have a small crystal grain size. The second crystal grains 207G2 may have a larger crystal grain size than the first crystal grains 207G1.

The gate electrode 207 may be formed of any suitable material including a metal, a metal nitride, or a combination thereof. According to an embodiment of the present invention, the gate electrode 207 may be formed of a titanium nitride (TiN). The first crystal grains 207G1 and the second crystal grains 207G2 may be TiN crystal grains. The first crystal grains 207G1 may be first TiN crystal grains having a small crystal grain size. The second crystal grains 207G2 may be second TiN crystal grains having a larger crystal grain size than the first TiN crystal grains. The first crystal grains 207G1 and the second crystal grains 207G2 may be TiN crystal grains that are deposited at a low temperature, that is TiN crystal grains that grow up from LT-TiN. According to another embodiment of the present invention, the first crystal grains 207G1 and the second crystal grains 207G2 may be TiN crystal grains that are deposited at a high temperature, that is. TiN crystal grains that grow up from HT-TiN. Although TiN crystal grains are deposited at a low temperature or a high temperature, the crystal grains may grow at different growth speeds on the interface that the crystal grains contact the gate dielectric layer 106 and in a portion that the crystal grains fill the gate trench 105. Therefore, the crystal grain size of the first crystal grains 207G1 contacting the gate dielectric layer 106 may be smaller than the crystal grain size of the second crystal grains 207G2 filling the gate trench 105.

As described above, no voids may be positioned on the interface with the gate dielectric layer 106 due to the first crystal grains 207G1. In this way, delamination may be suppressed. As a result, the first crystal grains 207G1 may improve the interface characteristics between the gate electrode 207 and the gate dielectric layer 106. Meanwhile, there may be voids 207V among the second crystal grains 207G2.

Also, since most of the gate trench 105 is filled with the second crystal grains 207G2, the resistance of the gate electrode 207 may be decreased.

FIGS. 11A to 11D are cross-sectional views illustrating a first example of a method for fabricating the semiconductor device 200 in accordance with an embodiment of the present invention shown in FIG. 10.

First of all, as illustrated in FIG. 7A, the structures from the isolation layer 12 to the gate dielectric layer 17 may be formed over the substrate 11.

Figure 11A:
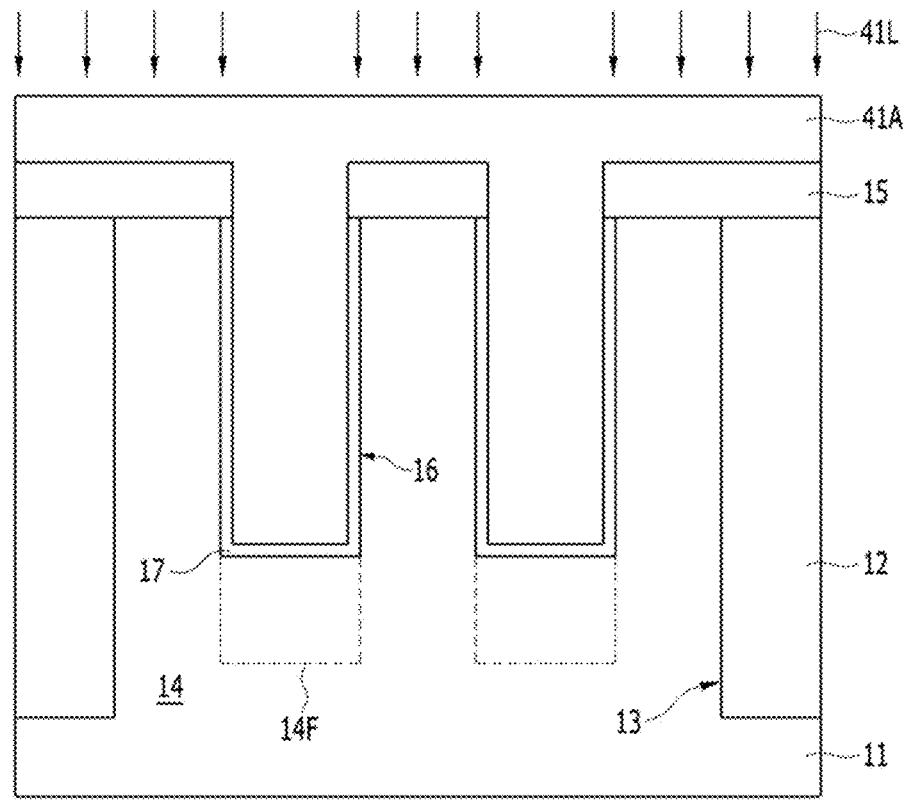
FIGS. 11A to 11D are cross-sectional views illustrating a first example of a method for fabricating the semiconductor device in accordance with an embodiment of the present invention shown in FIG. 10.

Subsequently, referring to FIG. 11A, a conductive layer 41A may be formed over the gate dielectric layer 17. The conductive layer 41A over the gate dielectric layer 17 may completely fill the gate trench 16. The conductive layer 41A may be formed of any suitable material including a metal, a metal nitride, or a combination thereof. The conductive layer 41A may be formed of a titanium nitride (TiN). The conductive layer 41A may be a polycrystalline layer. The conductive layer 41A may be formed of a titanium nitride (TiN) of columnar crystal grains.

The conductive layer 41A may be formed through a low-temperature process 41L. As a result of the low-temperature process 41L, the conductive layer 41A may include crystal grains of a small crystal grain size. As the conductive layer 41A is formed to have a small crystal grain size, agglomeration on the interface between the conductive layer 41A and the gate dielectric layer 17 may be delayed during a subsequent annealing process. In short, the growth of crystal grains of the conductive layer 41A may be delayed on the interface between the conductive layer 41A and the gate dielectric layer 17.

The conductive layer 41A may be formed at a temperature that is, equal to or lower than approximately 500° C., The conductive layer 41A may be formed by reacting TiCl$_4$ and NH$_3$. The conductive layer 41A may be formed of a titanium nitride (LT-TiN) that is deposited at a low temperature. The conductive layer 41A may be formed of a titanium nitride (ALD-TiN) that is formed through an Atomic Layer Deposition (ALD) process. The ALD-TiN may be deposited at a temperature ranging from approximately 50° C. to approximately 500° C. The conductive layer 41A may include an LT-ALD-TiN.

According to the embodiment of the present invention, which is described above, the gate trench 16 may be completely filled with the conductive layer 41A through the low-temperature process 41L.

Figure 11B:
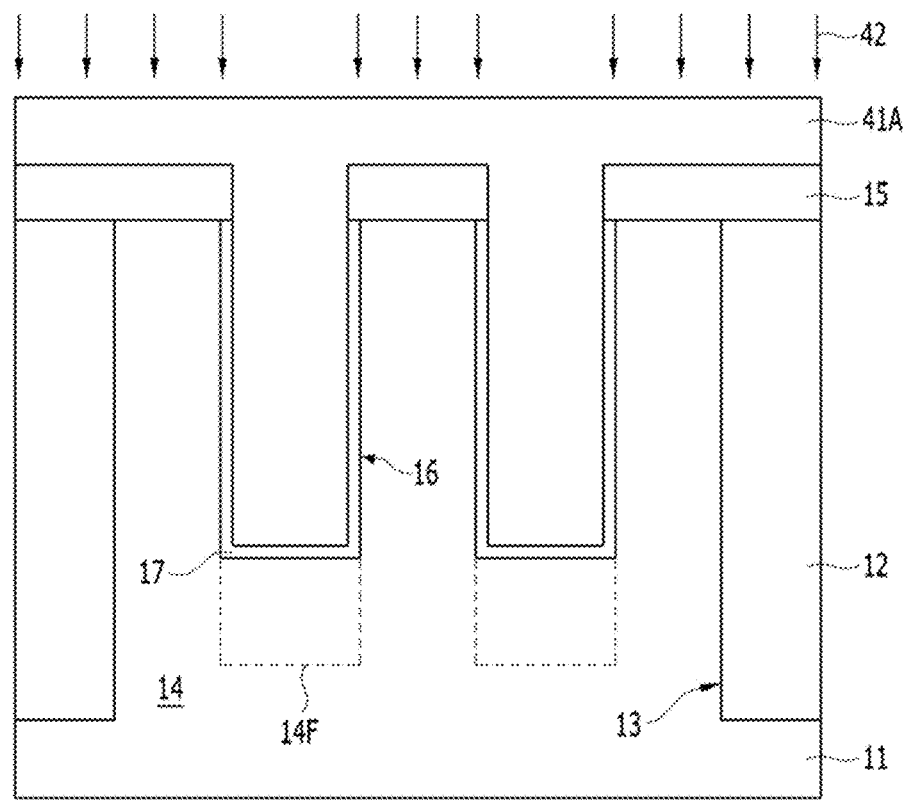

Referring to FIG. 11B, a post-process 42 may be performed. Through the post-process 42, impurities of the conductive layer 41A may be removed. For example, an impurity contained in the conductive layer 41A, such as chlorine (Cl), may be removed from the conductive layer 41A.

The post-process 42 may be performed in an atmosphere of hydrogen. The post-process 42 may include a Rapid Thermal Annealing (RTA) process. The post-process 42 may include a hydrogen Rapid Thermal Annealing (H-RTA) process. According to another embodiment of the present invention, the post-process 42 may include a Rapid Thermal Annealing (NH$_3$-RTA) process that is performed in the atmosphere of ammonia (NH$_3$) or a helium (He) plasma treatment.

As described above, it is possible to remove the impurities from the conductive layer 41A by performing the post-process 42 onto the conductive layer 41A that is deposited through the low-temperature process 41L. When the impurities are removed from the conductive layer 41A, the agglomeration on the interface between the conductive layer 41A and the gate dielectric layer 17 may be further delayed during the subsequent annealing process, Therefore, the growth of the crystal grains of the conductive layer 41A may be further delayed on the interface between the conductive layer 41A and the gate dielectric layer 17.

Figure 11C:
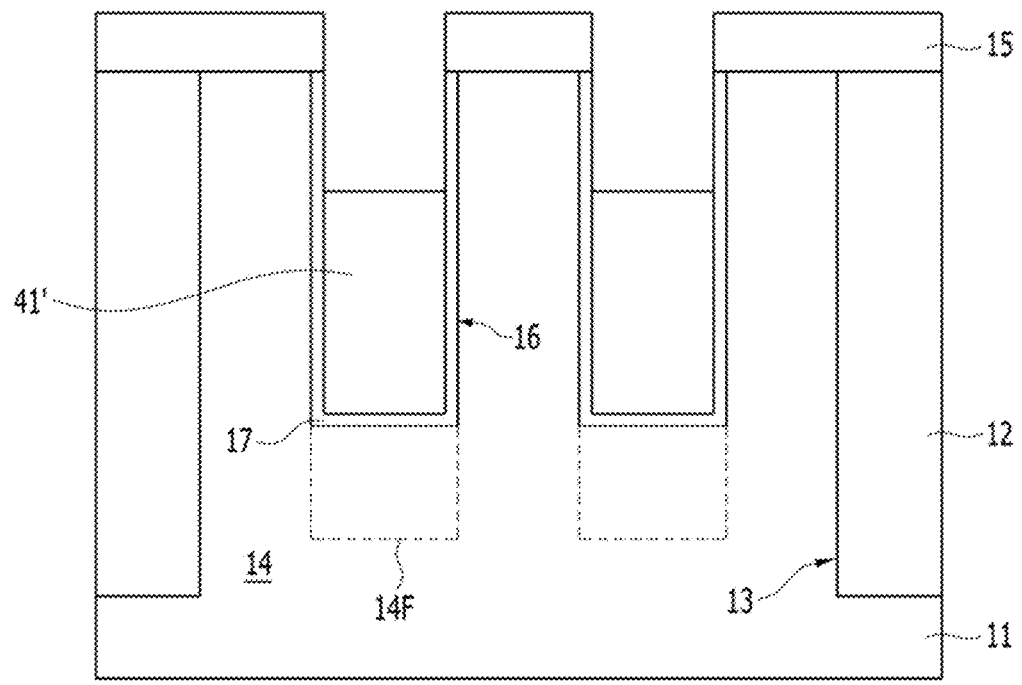

Referring to FIG. 11C, a conductive layer pattern 41' may be formed. The conductive layer pattern 41' may be formed by recessing the conductive layer 41A through an etch-back process. The conductive layer pattern 41' may be positioned at a lower level than the upper surface of the active region 14, As a result, the conductive layer pattern 41' may be positioned inside of the gate trench 16 with the top surface of the gate electrode positioned at a lower level than the top of the gate trench. Before the etch-back process is performed, a planarization process using a Chemical Mechanical polishing (CMP) may be performed in advance.

Figure 11D:
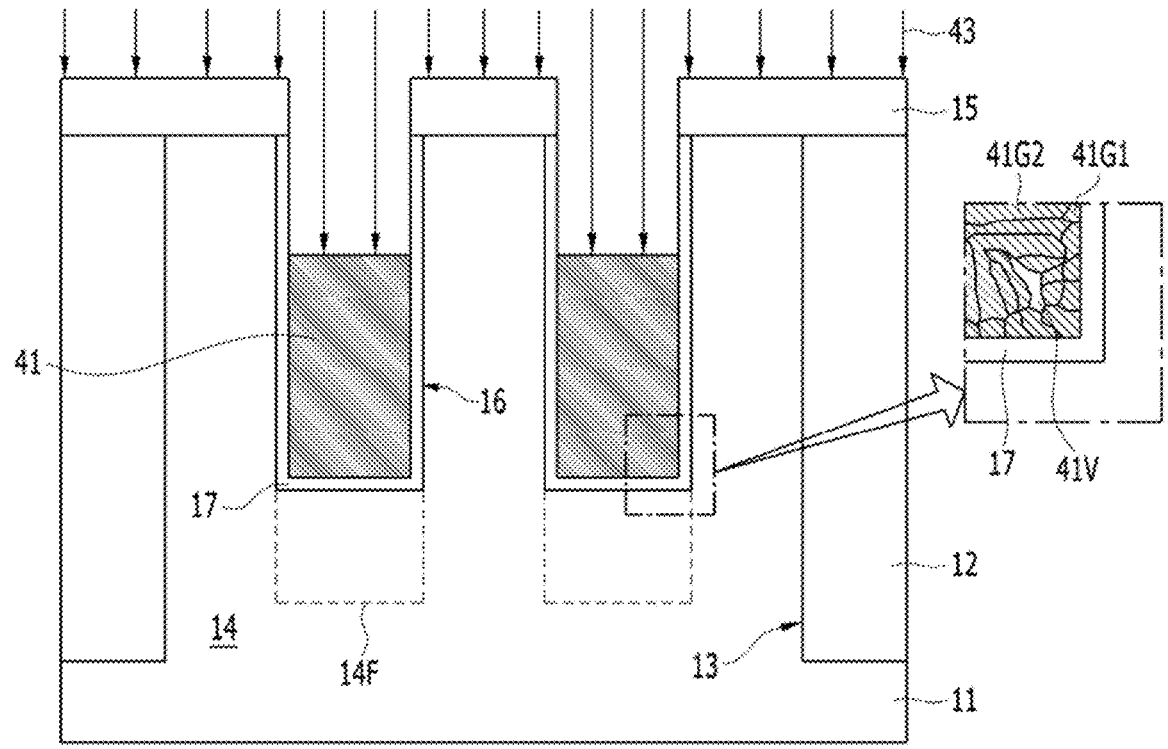

Referring to FIG. 11D an annealing process 43 may be performed. The conductive layer pattern 41' may be exposed to the) annealing process 43. Through the annealing process 43 crystal grains may grow up. In other words, the conductive layer pattern 41' may be crystalized through the annealing process 43. The annealing process 43 may be performed at a temperature ranging from approximately 300° C. to approximately 1100° C.

Through the annealing process 43, the conductive layer pattern 41' may be converted into a polycrystalline gate electrode 41, The gate electrode 41 may include first crystal grains 41G1 and second crystal grains 41G2. The first crystal grains 41G1 and the second crystal grains 41G2 may be formed through the growth of the crystal grains of the conductive layer pattern 41'. The first crystal grains 41G1 may be able to cover and contact the gate dielectric layer 17. The first crystal grains 41G1 may be able to cover the upper surface and side walls of the fin region 14F. The second crystal grains 41G2 are crystal grains formed over the first crystal grains 41G1 and may fill the gate trench 16. The first crystal grains 41G1 may be positioned between the second crystal grains 41G2 and the gate dielectric layer 17. The first crystal grains 41G1 and the second crystal grains 41G2 may be TiN crystal grains.

The first crystal grains 41G1 may correspond to the first crystal grains 207G1 shown in FIG. 10. The second crystal grains 41G2 may correspond to the second crystal grains 207G2 shown in FIG. 10.

When the conductive layer pattern 41' deposited at a low temperature is exposed to the annealing process 43, agglomeration occurring on the interface between the conductive layer pattern 41' and the gate dielectric layer 17 may be delayed. As a result, the growth of the crystal grains of the conductive layer pattern 41' may be delayed on the interface between the conductive layer pattern 41' and the gate dielectric layer 17. As a result, the first crystal grains 41G contacting the gate dielectric layer 17 may grow up in a small crystal grain size. Conversely, the second crystal grains 42G that do not contact the gate dielectric layer 17 may grow up in a large crystal grain size.

The second crystal grains 41G2 may include voids 41V. The first crystal grains 41G1 may be substantially free of any voids. Even if there are some voids among the first crystal grains 41G1, their size and number may be substantially smaller than that of the voids 41V in the second crystal grains 41G2.

Subsequently, through the method illustrated in FIG. 7G, the capping layer 23, the first doping region 24, and the second doping region 25 may be formed.

FIGS. 12A to 12D are cross-sectional views illustrating a second example of a method for fabricating the semiconductor device 200 in accordance with an embodiment of the present invention shown in FIG. 10.

First of all, as illustrated in FIG. 7A, the structures from the isolation layer 12 to the gate dielectric layer 17 may be formed over the substrate 11.

Figure 12A:
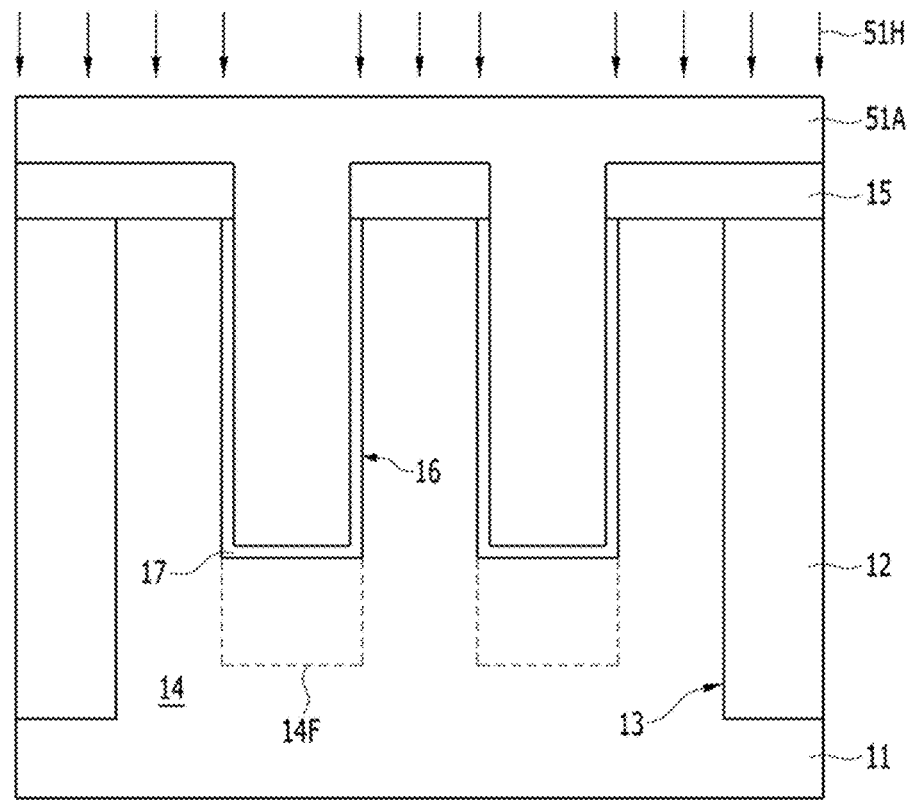
FIGS. 12A to 12D are cross-sectional views illustrating a second example of a method for fabricating the semiconductor device in accordance with an embodiment of the present invention shown in FIG. 10.

Subsequently, referring to FIG. 12A, a conductive layer 51A may be formed over the gate dielectric layer 17. The conductive layer 51A may be formed over the gate dielectric layer 17 and may completely fill the gate trench 16. The conductive layer 51A may be formed of any suitable material including a metal, a metal nitride, or a combination thereof. The conductive layer 51A may be formed of a titanium nitride (TiN). The conductive layer 51A may be polycrystalline. The conductive layer 51A may be formed of a titanium nitride (TiN) of columnar crystal grains.

The conductive layer 51A may be formed through a high-temperature process 51H. When the conductive layer 51A is deposited through the high-temperature process 51H, the amount of impurities in the conductive layer 51A may be decreased. The conductive layer 51A may be formed at a high temperature HT of approximately 600° C. or higher. The conductive layer 51A may be formed by reacting $TiCl_4$ and $NH_3$. The conductive layer 51A may be formed of a titanium nitride (HT-TiN) that is deposited at a high temperature. In the HT-TiN the amount of impurity, such as chlorine (Cl), may be decreased. To decrease the amount of the impurities, when the $TiCl_4/NH_3$ are employed, the amount of purge of $NH_3$ may be increased. The conductive layer 51A may be formed of a titanium nitride (ALD-TiN) that is formed through an Atomic Layer Deposition (ALD) process. The ALD-TiN may be deposited at a temperature of from approximately 600° C. or higher. The conductive layer 51A may include an HT-ALD-TiN.

As the conductive layer 51A is formed to have a decreased amount of impurities in the conductive layer 51A through the high-temperature process 51H, agglomeration on the interface between the conductive layer 51A and the gate dielectric layer 17 may be delayed during a subsequent annealing process.

Figure 12B:
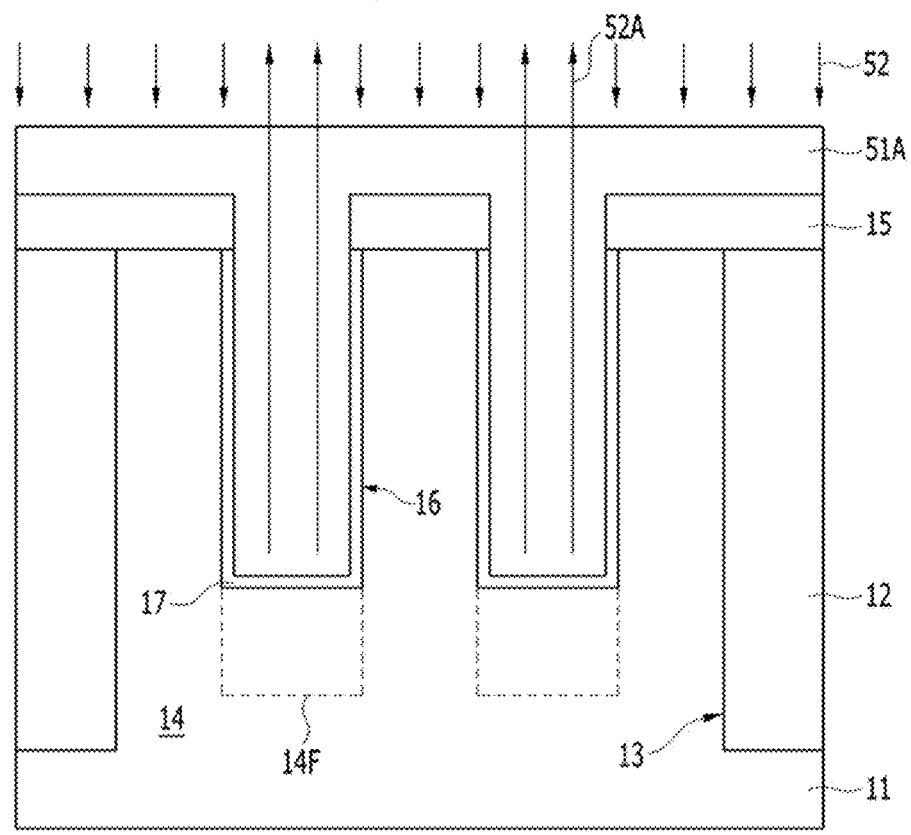

Referring to FIG. 12B, a post-process 52 may be performed. Through the post-process 52, the remaining impurities of the conductive layer 51A may be removed. For example, an impurity contained in the conductive layer 51A, such as chlorine (Cl), may be discharged 52A to the outside.

The post-process 52 may be performed in the atmosphere of hydrogen. The post-process 52 may include a Rapid Thermal Annealing (RTA) process. According to another embodiment of the present invention, the post-process 52 may include a Rapid Thermal Annealing ($NH_3$-RTA) process that is performed in the atmosphere of ammonia ($NH_3$), or a helium (He) plasma treatment.

As described above, it is possible to remove the impurities from the conductive layer 51A by performing the high-temperature process 51H and the post-process 52 onto the conductive layer 51A. When the impurities are removed from the conductive layer 51A, the agglomeration on the interface between the conductive layer 51A and the gate dielectric layer 17 may be further delayed during the subsequent annealing process. Therefore, the growth of the crystal grains of the conductive layer 51A may be further delayed on the interface between the conductive layer 51A and the gate dielectric layer 17.

Figure 12C:
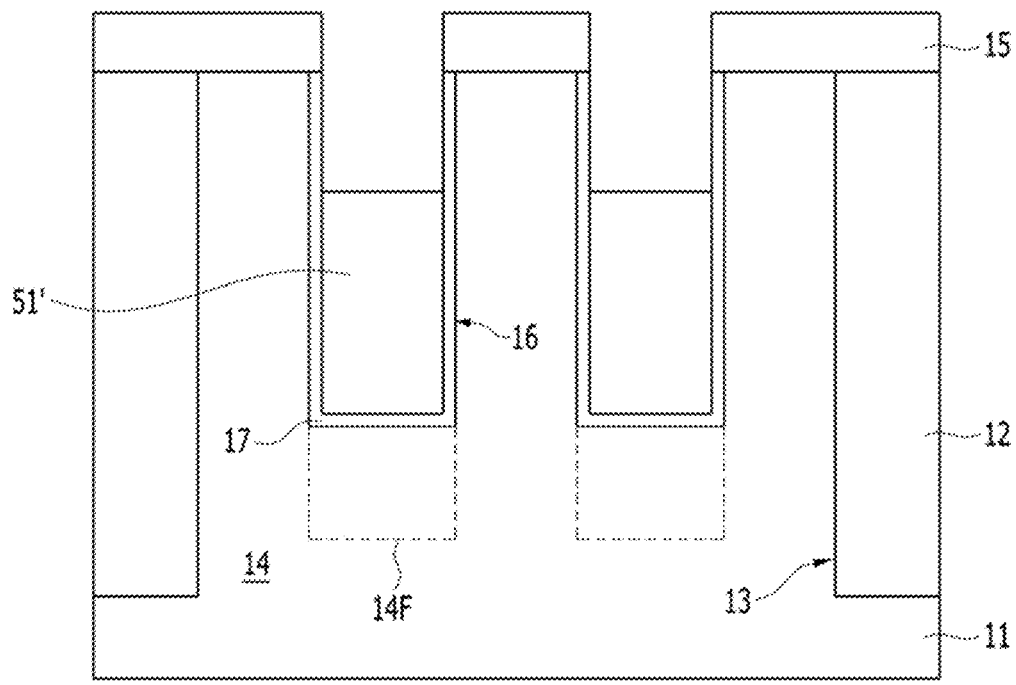

Referring to FIG. 12C, a conductive layer pattern 51' may be formed. The conductive layer pattern 51' may be formed by recessing the conductive layer 51A through an etch-back process. The conductive layer pattern 51' may be positioned at a lower level than the upper surface of the active region 14. As a result, the conductive layer pattern 51' may be positioned inside the gate trench 16 with the top surface of the gate electrode positioned at a lower level than the top of the gate trench, Before the etch-back process is performed, a planarization process using a Chemical Mechanical Polishing (CMP) may be performed in advance.

Figure 12D:
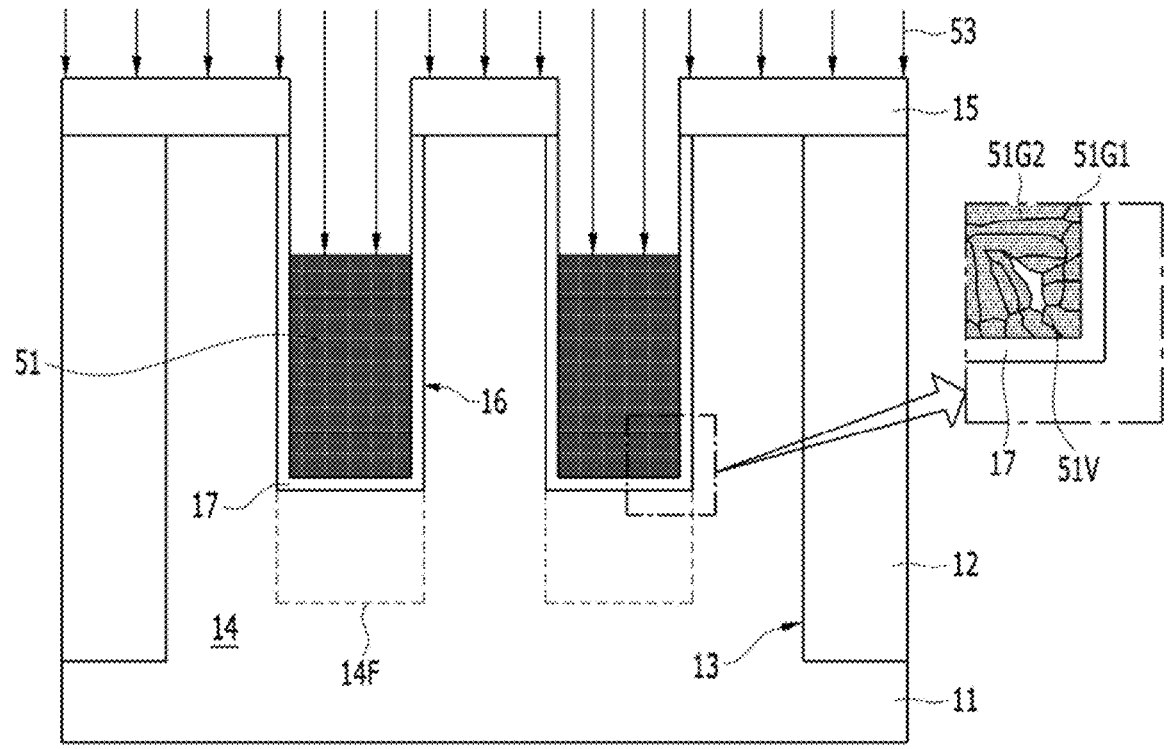

Referring to FIG. 12D, an annealing process 53 may be performed. The conductive layer pattern 51' may be exposed to the annealing process 53. Through the annealing process 53, crystal grains may grow up. In other words, the conductive layer pattern 51' may be crystalized through the annealing process 53. The annealing process 53 may be performed at a temperature ranging from approximately 300° C. to approximately 1100° C.

Through the annealing process 53, the conductive layer pattern 51' may be converted into a polycrystalline gate electrode 51. The gate electrode 51 may include first crystal grains 51G1 and second crystal grains 51G2. The first crystal grains 51G1 and the second crystal grains 51G2 may be formed through the growth of the crystal grains of the conductive layer pattern 51'. The first crystal grains 51G1 may be able to cover and contact the gate dielectric layer 17. The first crystal grains 51G1 may be able to cover the upper surface and side walls of the fin region 14F. The second crystal grains 51G2 over the first crystal grains 51G1 may fill the gate trench 16. The first crystal grains 51G1 may be positioned between the second crystal grains 51G2 and the gate dielectric layer 17.

The first crystal grains 51G1 may correspond to the first crystal grains 207G1 shown in FIG. 10. The second crystal grains 51G2 may correspond to the second crystal grains 207G2 shown in FIG. 10.

When the conductive layer pattern 51' onto which the high-temperature process 51H and the post-process 52 are performed is exposed to the annealing process 53, agglomeration occurring on the interface between the conductive layer pattern 51' and the gate dielectric layer 17 may be delayed. As a result, the growth of the crystal grains of the conductive layer pattern 51' may be delayed on the interface between the conductive layer pattern 51' and the gate dielectric layer 17. After all, the first crystal grains 51G contacting the gate dielectric layer 17 may grow up in a small crystal grain size. Conversely, the second crystal grains 52G that do not contact the gate dielectric layer 17 may grow up in a large crystal grain size.

The second crystal grains 51G2 may include voids 51V. The first crystal grains 51G1 may be substantially free of any voids. In another embodiment, even though there may be some voids in the first crystal grains 51G1, their size and number may be substantially smaller than the voids 51V in the second crystal grains 51G2. Subsequently, through the method illustrated in FIG. 7G, the capping layer 23, the first doping region 24, and the second doping region 25 may be formed.

Figure 13:
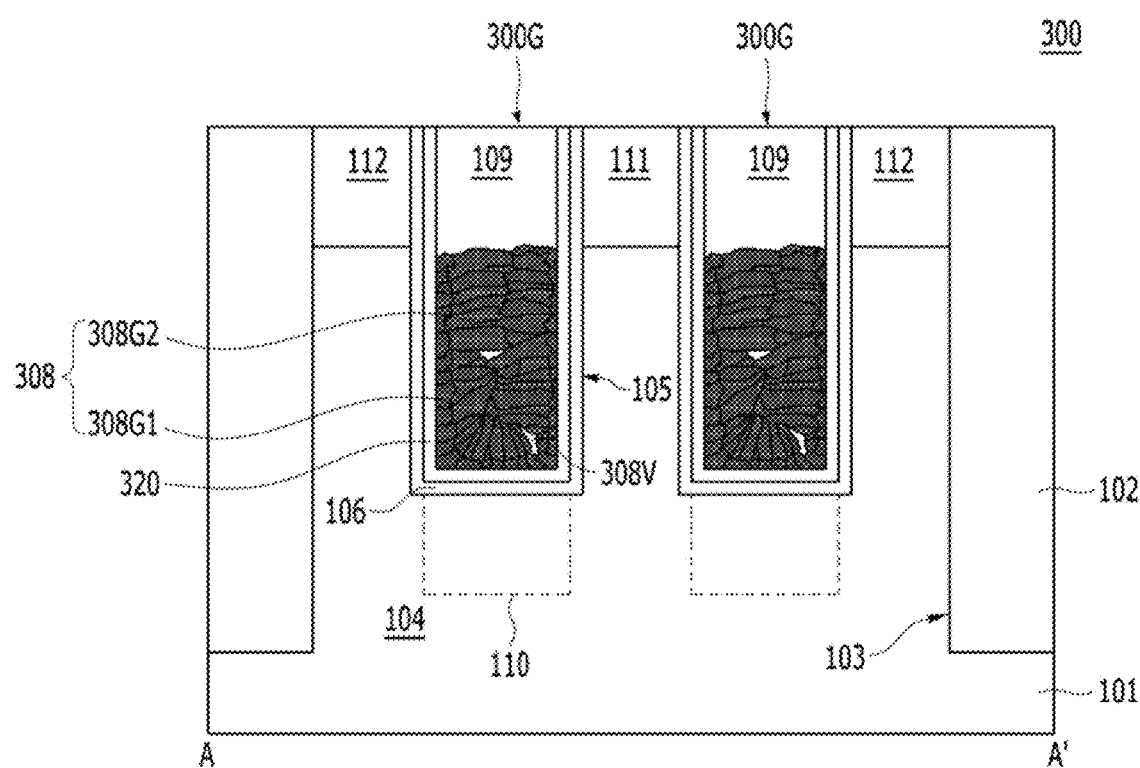
FIG. 13 is a cross-sectional view illustrating a semiconductor device in accordance with an embodiment of the present invention.

FIG. 13 is cross-sectional view illustrating semiconductor device 300 in accordance with a third embodiment of the present invention. The semiconductor device 300 in accordance with the third embodiment of the present invention may be similar to the semiconductor device 100 of FIG. 2A except for a buried gate structure 300G.

Referring to FIG. 1.3, the semiconductor device 300 may include the buried gate structure 300G. The buried gate structure 300G may be formed inside of a gate trench 105. The buried gate structure 300G may include a gate dielectric layer 106, a crystallization delay layer 320, a gate electrode 308 and a capping layer 109.

The gate dielectric layer 106 may be formed of any suitable dielectric material including, for example, an oxide. In an embodiment, the gate dielectric layer 106 may be formed of a silicon oxide.

The crystallization delay layer 320 may include a nitrogen-rich layer that contains a high concentration of nitrogen. The crystallization delay layer 320 may include a nitrogen-rich silicon oxynitride (N-rich SiON) or a nitrogen-rich silicon nitride. The crystallization delay layer 320 may include approximately 30 to 40 at % of nitrogen.

The crystallization delay layer 320 may be formed by nitriding the upper surface of the gate dielectric layer 106 (see FIGS. 14A to 14E). According to another embodiment of the present invention, the crystallization delay layer 320 may be formed through an Atomic Layer Deposition (ALD) process (see FIGS. 15A to 15E).

The gate electrode 308 may be polycrystalline. The gate electrode 308 may include first crystal grains 308G1 and second crystal grains 308G2. The first crystal grains 308G1 may have a smaller crystal grain size than the second crystal grains 308G2.

The gate electrode 308 may have a single-layer structure. In other words, a conductive layer for forming the gate electrode 308 may be formed at a uniform temperature without a change in the temperature for a deposition process. The conductive layer may fill the gate trench 105 through a low-temperature process, a middle-temperature process, or a high-temperature process.

The gate electrode 308 may be, formed of any suitable material including a metal, a metal nitride, or a combination thereof. According to an embodiment of the present invention, the gate electrode 308 may be formed of a titanium nitride (TiN). The first crystal grains 308G1 and the second crystal grains 207G2 may be TiN crystal grains. The first crystal grains 308G1 may be TiN crystal grains having a small crystal grain size. The second crystal grains 308G2 may be TiN crystal grains having a large crystal grain size.

The small crystal grain size of the first crystal grains 308G1 may be controlled by employing the crystallization delay layer 320. The high nitrogen concentration of the crystallization delay layer 320 may increase an interface trap charge density (Qit) and a fixed charge density (Qf). As the interface trap charge density (Qit) and the fixed charge density (Qf) are increased, the interface energy may be raised. The high interface energy may delay the growth of the crystal grains of the first crystal grains 308G1 contacting the crystallization delay layer 320.

Since the first crystal grains 308G1 having a small crystal grain size is formed by the crystallization delay layer 320, there may be substantially no voids on the interface between the gate electrode 308 and the gate dielectric layer 106. In this way, delamination may be suppressed.

Also, since the second crystal grains 308G2 having a relatively large crystal grain size fill most of the gate trench 105, the resistance of the gate electrode 308 may be decreased.

FIGS. 14A to 14E are cross-sectional views illustrating a first example of a method for fabricating the semiconductor device 300 in accordance with the third embodiment of the present invention shown in FIG. 13.

First of all, as illustrated in FIG. 7A, the structures up to the gate dielectric layer 17 may be formed. The gate dielectric layer 17 may be formed of any suitable material including, for example, a silicon oxide.

Subsequently, referring to FIG. 14A, a crystallization delay layer 61A may be formed over the gate dielectric layer 17. The crystallization delay layer 61A may include a nitrogen-rich layer containing a high concentration of nitrogen. The crystallization delay layer 61A may include a nitrogen-rich silicon oxynitride (N-rich SiON). The nitrogen-rich silicon oxynitride may include approximately 30 to 40 at % of nitrogen.

The crystallization delay layer 61A may be formed through a plasma nitridation 61P may be performed. The plasma nitridation 61P may be performed by raising the flow rate of a nitrogen-containing gas. As a result, the concentration of nitrogen of the crystallization delay layer 61A may be increased. Through the plasma nitridation 61P, the surface of the gate dielectric layer 17 may be nitrided. Therefore, the crystallization delay layer 61A may be formed over the gate dielectric layer 17 and a hard mask layer 15.

Figure 14A:
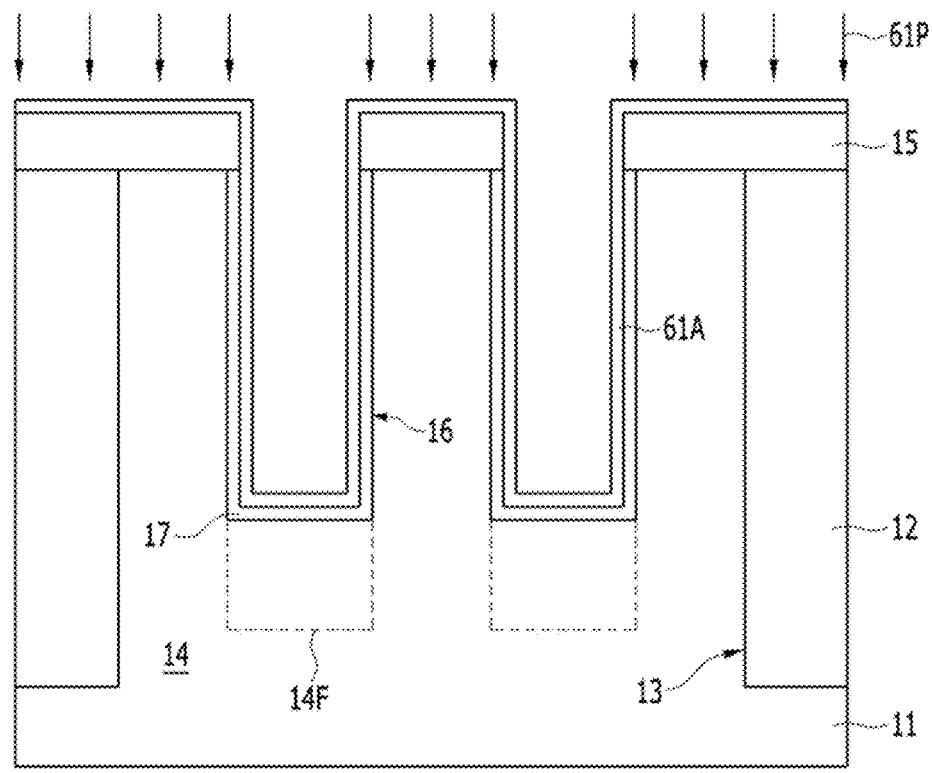
FIGS. 14A to 14E are cross-sectional views illustrating a first example of a method for fabricating the semiconductor device in accordance with an embodiment of the present invention shown in FIG. 13.
Figure 14B:
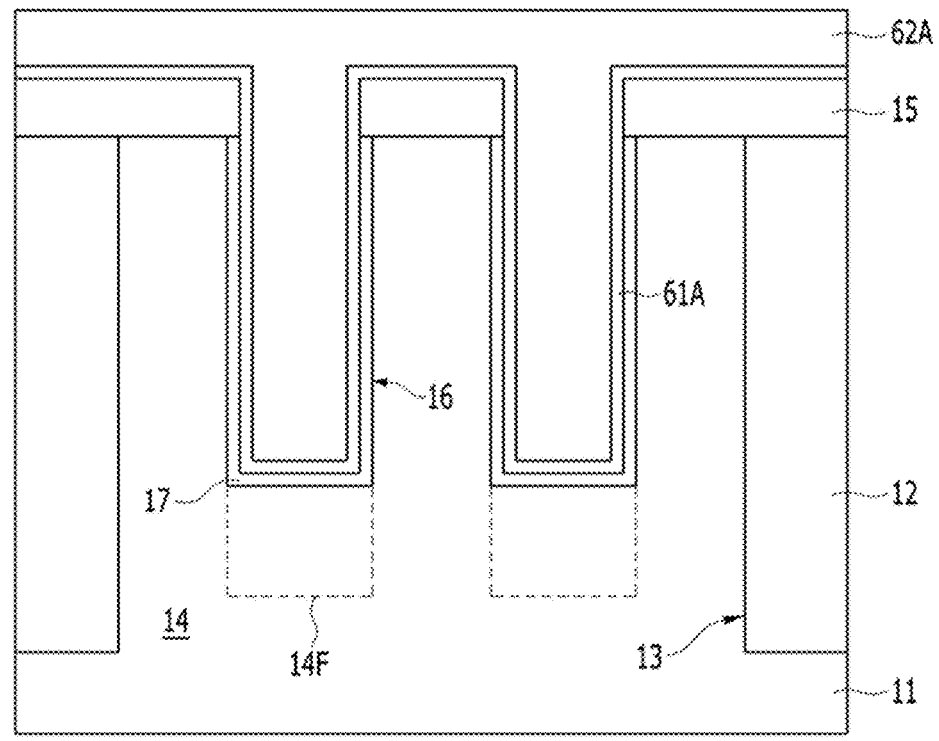

Referring to FIG. 14B, a conductive layer 62A may be formed over the crystallization delay layer 61A. The conductive layer 62A over the crystallization delay layer 61A may completely fill the gate trench 16. The conductive layer 62A may be formed of any suitable material including a metal, a metal nitride, or a combination thereof. The conductive layer 62A may be formed of a titanium nitride (TiN). The conductive layer 62A may be polycrystalline. The conductive layer 62A may be formed of a titanium nitride (TiN) of columnar crystal grains. The conductive layer 62A may be formed at a temperature which is a low-temperature process, a high-temperature process, or a middle-temperature process. The conductive layer 62A may be a titanium nitride (ALD-TiN) that is formed of $TiCl_4$ and $NH_3$. The conductive layer 62A may include an LT-ALD TiN, an MT-ALD TiN, or an HT-ALD TiN.

As described above, as the conductive layer 62A is formed over the crystallization delay layer 61A, agglomeration on the interface between the conductive layer 62A and the crystallization delay layer 61A may be delayed during a subsequent annealing process. In short, the growth of crystal grains of the conductive layer 62A may be delayed on the interface between the conductive layer 62A and the crystallization delay layer 61A.

Figure 14C:
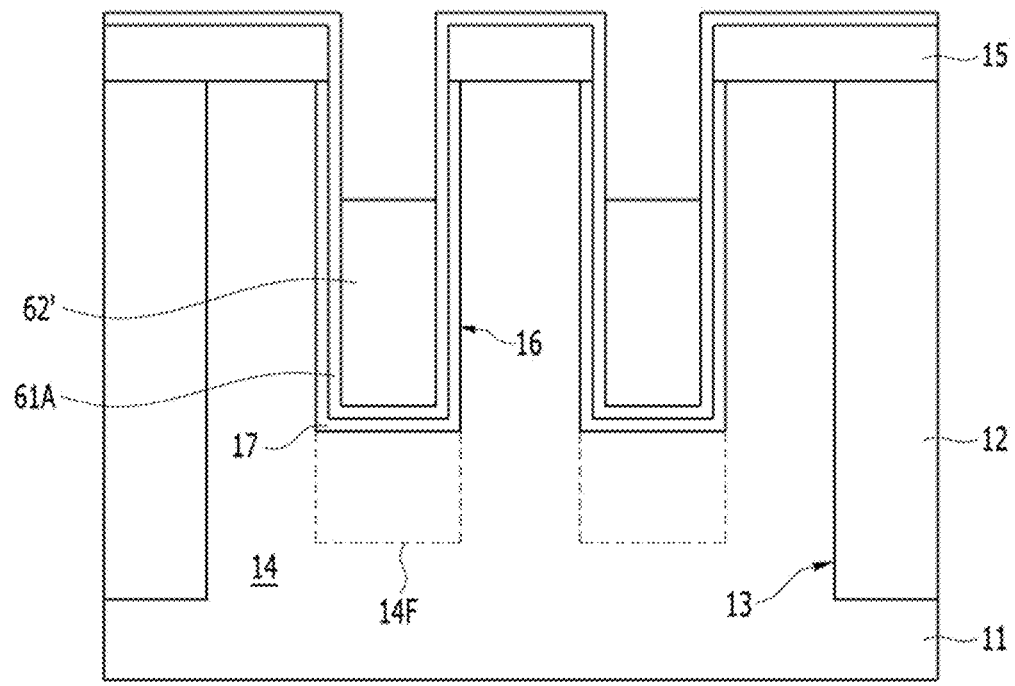

Referring to FIG. 14C, a conductive layer pattern 62' may be formed. The conductive layer pattern 62' may be formed by recessing the conductive layer 62A through an etch-back process. The conductive layer pattern 62' may be positioned at a lower level than the upper surface of the active region 14. As a result, the conductive layer pattern 62' may be positioned inside of the gate trench 16 with the top surface of the gate electrode positioned at a lower level than the top of the gate trench. Before the etch-back process is performed, a planarization process using a Chemical Mechanical Polishing (CMP) may be performed in advance.

During the etch-back process for forming the conductive layer pattern 62', the gate dielectric layer 17 may be protected by the crystallization delay layer 61A. Therefore, it is possible to protect the gate dielectric layer 17 from being damaged on the side wall of the upper portion of the gate trench 16.

According to another embodiment of the present invention, after the conductive layer pattern 62' is formed, the crystallization delay layer 61A may be recessed. In this case, the upper surface of the crystallization delay layer 61A and the upper surface of the conductive layer pattern 62' may be positioned at the same level.

Figure 14D:
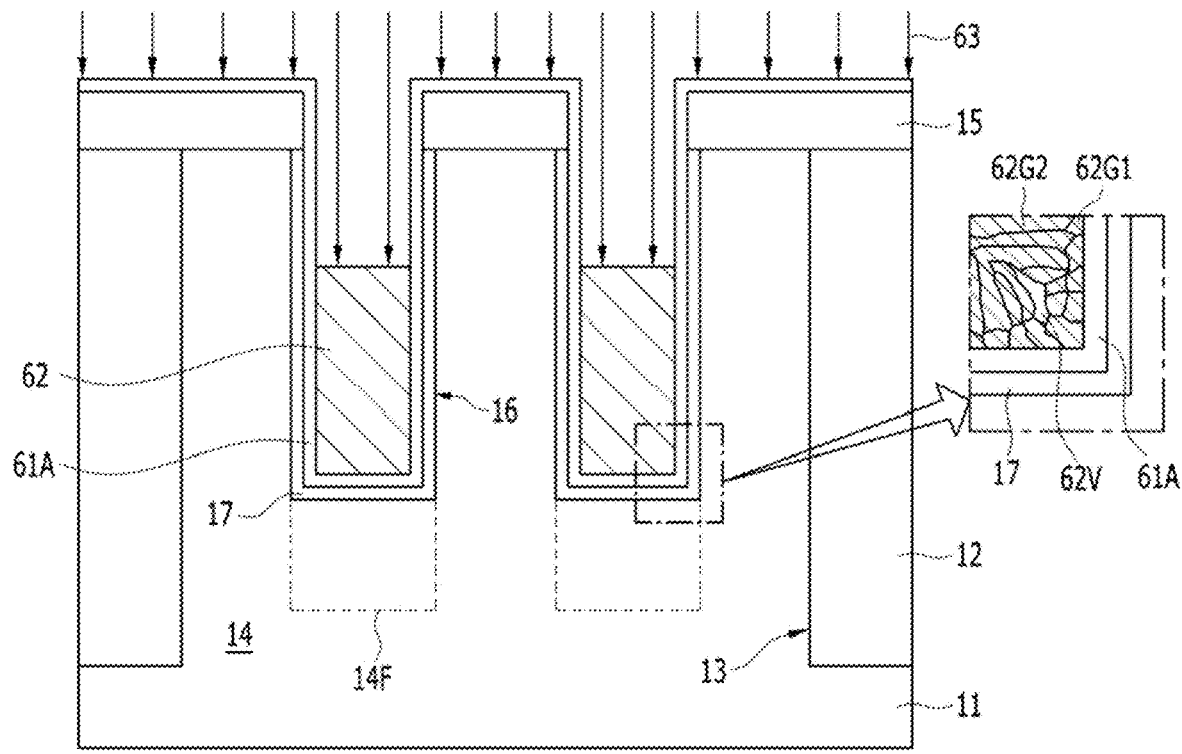

Referring to FIG. 14D, an annealing process 63 may be performed. The conductive layer pattern 62' may be exposed to the annealing process 63. Through the annealing process 63, crystal grains may grow up. In other words, the conductive layer pattern 62' may be crystalized through the annealing process 63. The annealing process 63 may be performed at a temperature ranging from approximately 300° C. to approximately 1100° C.

Through the annealing process 63, a polycrystalline gate electrode 62 may be formed. The gate electrode 62 may be formed through the growth of the crystal grains of the conductive layer pattern 62'. The gate electrode 62 may include first crystal grains 62G1 and second crystal grains 62G2.

The first crystal grains 62G1 may contact the crystallization delay layer 61A. The first crystal grains 62G1 may cover and contact the crystallization delay layer 61A. While the annealing process 63 is performed, the growth of the crystal grains may be delayed by the crystallization delay layer 61A. Therefore, the first crystal grains 62G1 may be formed to have a small crystal grain size. The second crystal grains 62G2 do not contact the crystallization delay layer 61A and, hence, may grow to have a larger crystal grain size than the first crystal grains 62G1.

A plurality of voids 62V may be formed among the second crystal grains 62G2. The voids 62V may be generated during the deposition process for forming the conductive layer 62A. While the crystal grains grow, the voids 62V may grow as well or may be maintained.

There may be substantially no voids formed among the first crystal grains 62G1. Or even if, in an embodiment, there are some voids among the first crystal grains 62G1, their size and their number may be substantially smaller than the voids among the second crystal grains 62G2.

The gate electrode 62 may fill a portion of the gate trench 16.

Figure 14E:
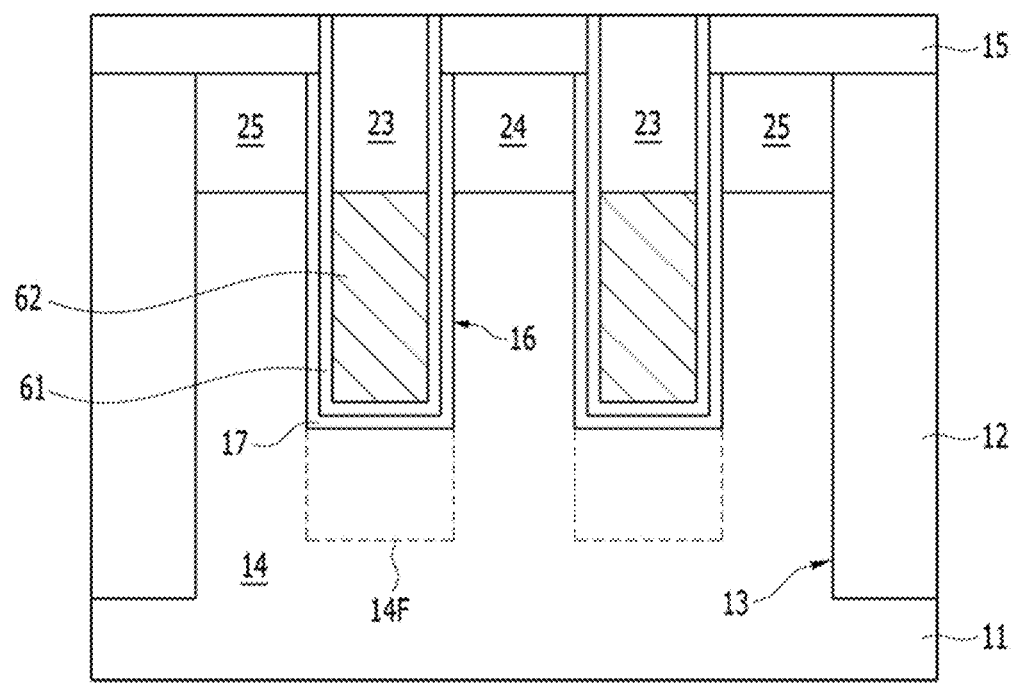

Referring to FIG. 14E a capping layer 23 may be formed over the gate electrode 62. The capping layer 23 may include a dielectric material. The gate trench 16 may be filled with the capping layer 23 over the gate electrode 62. The capping layer 23 may be formed of any suitable material including, for example, a silicon nitride. Subsequently, the capping layer 23 may be planarized in such a manner that the upper surface of the hard mask layer 15 may be exposed. According to another embodiment of the present invention, the capping layer 23 may be formed a silicon oxide. According to yet another embodiment of the present invention, the capping layer 23 may have an NON (Nitride-Oxide-Nitride) structure.

After the capping layer 23 is planarized, the crystallization delay layer 61A may be planarized. As a result, the crystallization delay layer 61 may be positioned inside of the gate trench 16 with the top surface of the gate electrode positioned at a lower level than the top of the gate trench. The upper surfaces of the crystallization delay layer 61, the capping layer 23, and the hard mask layer 15 may be positioned at the same level.

A buried gate structure may be completed by forming the capping layer 23. The buried gate structure may include the gate dielectric layer 17, the crystallization delay layer 61, the gate electrode 62, and the capping layer 23. The buried gate structure may have a recessed shape that fills a portion of the gate trench 16. The buried gate structure may be positioned at a lower level than the uppermost surface of the active region 14.

Subsequently, a first doping region 24 and a second doping region 25 may be formed. The first doping region 24 and the second doping region 25 may be formed any suitable doping process, such as an ion implantation process. The first doping region 24 and the second doping region 25 may have the same depth. According to another embodiment of the present invention, the first doping region 24 may be deeper than the second doping region 25.

FIGS. 15A to 15E are cross-sectional views illustrating a second example of a method for fabricating the semiconductor device 300 in accordance with the third embodiment of the present invention shown in FIG. 13.

First of all, referring to FIG. 7A, the structures from the isolation layer 12 to the gate dielectric layer 17 may be formed over the substrate 11. The gate dielectric layer 17 may be formed of any suitable material including, for example, a silicon oxide.

Figure 15A:
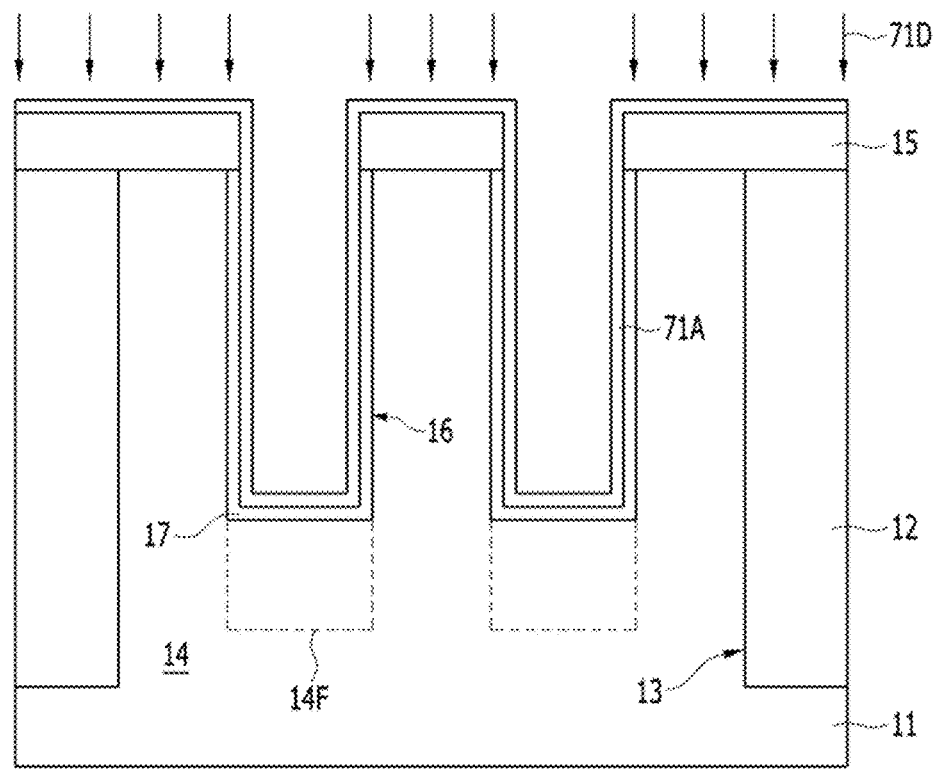
FIGS. 15A to 15E are cross-sectional views illustrating a second example of a method for fabricating the semiconductor device in accordance with an embodiment of the present invention shown in FIG. 13.

Subsequently, as illustrated in FIG. 15A, a crystallization delay layer 71A may be formed over the gate dielectric layer 17. The crystallization delay layer 71A may include a nitrogen-rich layer that contains a high concentration of nitrogen. The crystallization delay layer 71A may include a nitrogen-rich silicon nitride (N-rich SiN). The nitrogen-rich silicon nitride may include approximately 30 to 40 at % of nitrogen.

The crystallization delay layer 71A may be formed through an Atomic Layer Deposition (ALD) process 71D. The ALD process 71D may use a silicon source gas and a nitrogen source gas (e.g., $NH_3$). The ALD process 71D may be performed by increasing the flow rate of the nitrogen source gas. In this way, the nitrogen concentration of the crystallization delay layer 71A may be raised. The crystallization delay layer 71A may be formed in a thickness thinner than approximately 10 Å. When the crystallization delay layer 71A is thick, the gap-filling performance of a conductive layer which is to be performed subsequently, becomes poor. Therefore, it is appropriate to form the crystallization delay layer 71A as thin as possible.

The crystallization delay Payer 71A may be formed through a method that is different from the method of forming the crystallization delay layer 61A of FIG. 14A. Whereas the crystallization delay layer 61A is formed through the plasma nitridation 61P, the crystallization delay layer 71A is formed through an ALD process 71D.

Figure 15B:
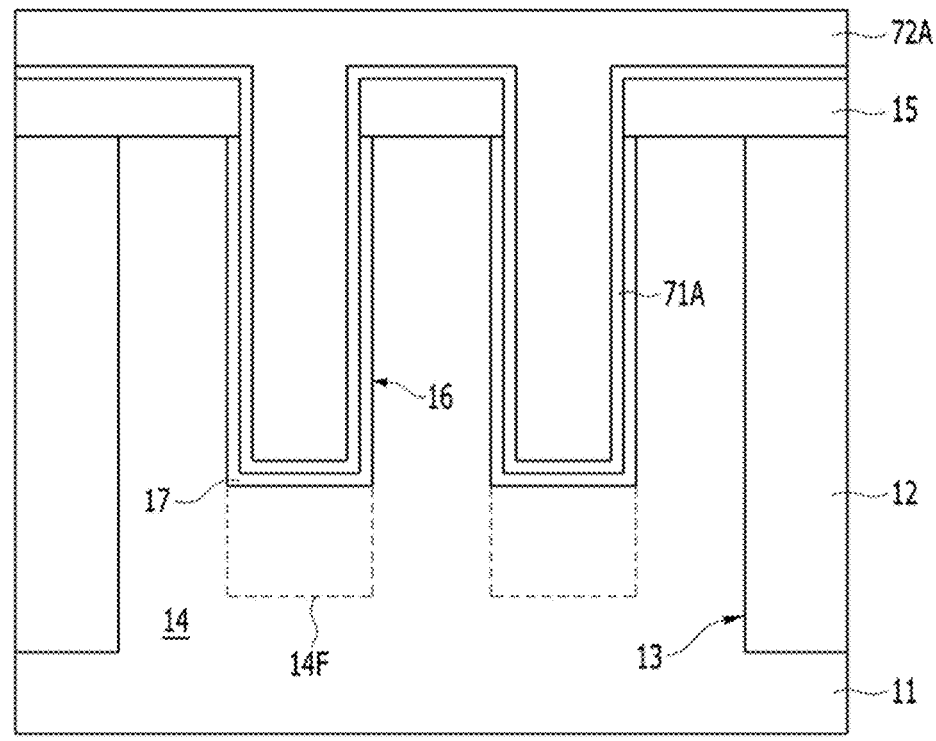

Referring to FIG. 15B, a conductive layer 72A may be formed over the crystallization delay layer 71A. The conductive layer 72A over the crystallization delay ayes 71A may completely fill the gate trench 16. The conductive layer 72A may be formed of any suitable material including a metal, a metal nitride, or a combination thereof. The conductive layer 72A may be formed of a titanium nitride (TiN). The conductive layer 72A may be polycrystalline. The conductive layer 72A may be formed of a titanium nitride (TiN) of columnar crystal grains. The conductive layer 72A may be formed at a temperature which is a low-temperature process, a high-temperature process, or a middle-temperature process. The conductive layer 72A may be a titanium nitride (ALD-TiN) that is formed by reacting $TiCl_4$ and $NH_3$.

The conductive layer 72A may include an LT-ALD TiN, an MT-ALD TiN, or an HT-ALD TiN.

As described above, as the conductive layer 72A is formed over the crystallization delay layer 71A, agglomeration on the interface between the conductive layer 72A and the crystallization delay layer 71A may be delayed during a subsequent annealing process. In short, the growth of crystal grains of the conductive layer 72A may be delayed on the interface between the conductive layer 72A and the crystallization delay layer 71A.

Figure 15C:
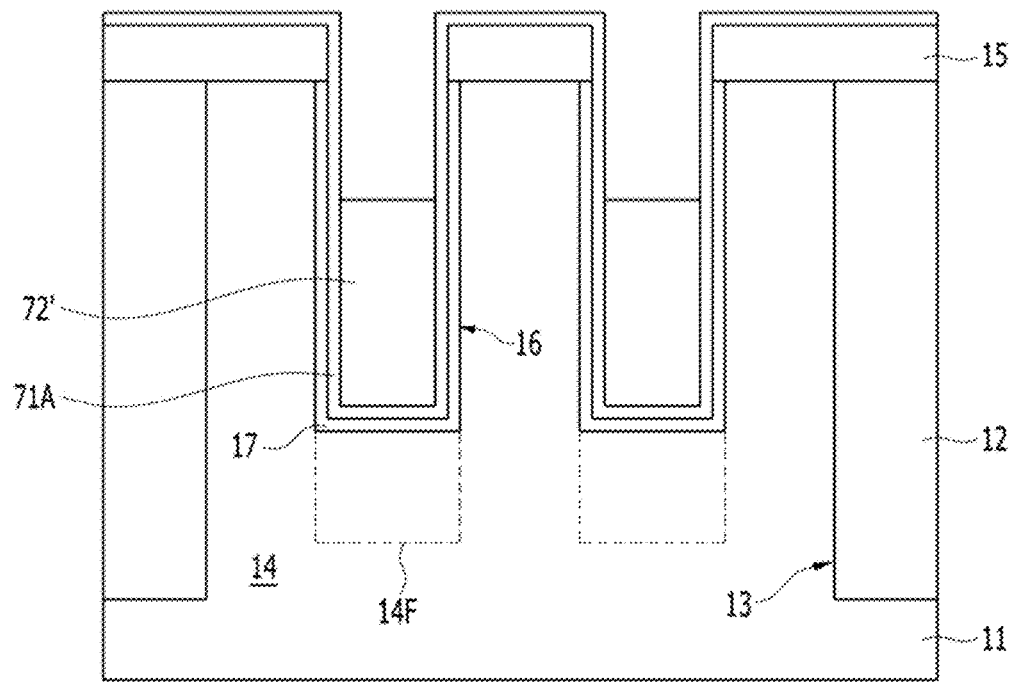

Referring to FIG. 15C, a conductive layer pattern 72' may be formed. The conductive layer pattern 72' may be formed by recessing the conductive layer 72A through an etch-back process. The conductive layer pattern 72' may be positioned at a lower level than the upper surface of the active region 14. As a result, the conductive layer pattern 72' may be positioned inside of the gate trench 16 with the top surface of the gate electrode positioned at a lower level than the top of the gate trench. Before the etch-back process is performed, a planarization process using a Chemical Mechanical Polishing (CMP) may be performed in advance.

Figure 15D:
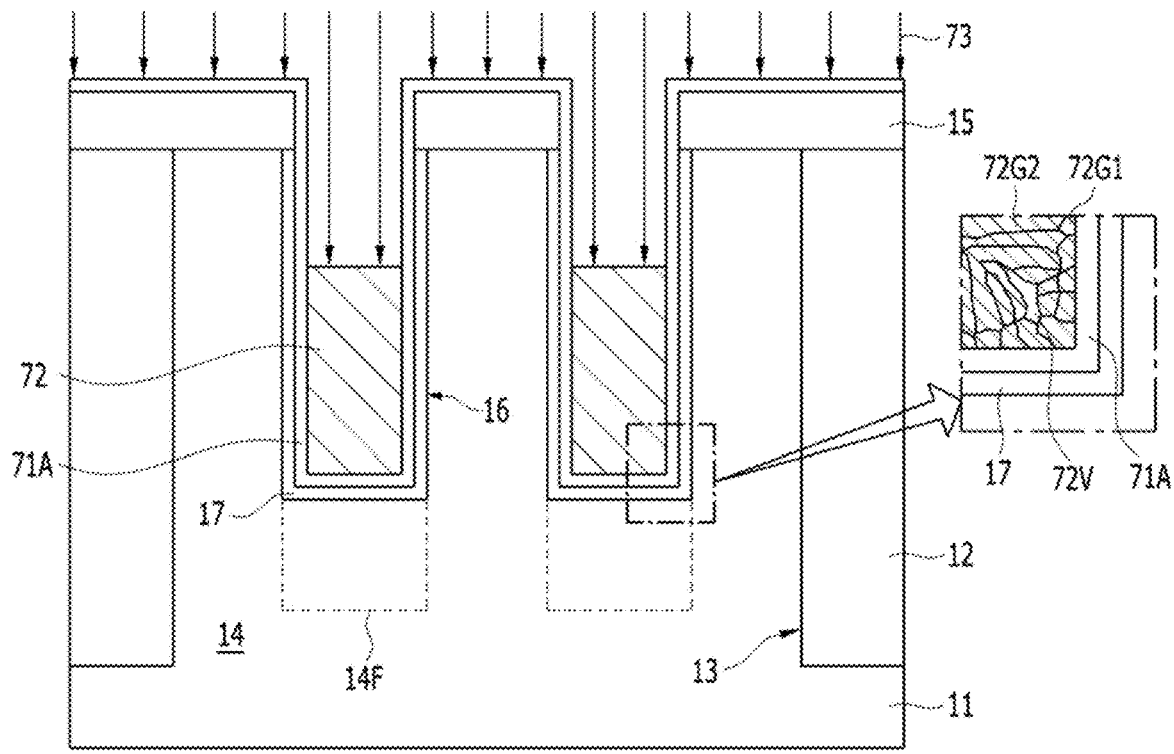

Referring to FIG. 15D, an annealing process 73 may be performed. The conductive layer pattern 72' may be exposed to the annealing process 73. Through the annealing process 73, crystal grains may grow up. In other words, the conductive layer pattern 72' may be crystalized through the annealing process 73. The annealing process 73 may be performed at a temperature ranging from approximately 300° C. to approximately 1100° C.

Through the annealing process 73, a polycrystalline gate electrode 72 may be formed. The gate electrode 72 may be formed through the growth of the crystal grains of the conductive layer pattern 72'. The gate electrode 72 may include first crystal grains 72G1 and second crystal grains 72G2.

The first crystal grains 72G1 may contact the crystallization delay layer 71A. The first crystal grains 72G1 may cover the crystallization delay layer 71A. While the annealing process 73 is performed the growth of the crystal grains may be delayed by the crystallization delay layer 71A. Therefore, the first crystal grains 72G1 may be formed to have a small crystal grain size by the crystallization delay layer 71A. The second crystal grains 72G2 that do not contact the crystallization delay layer 71A may have a larger crystal grain size than the first crystal grains 72G1.

A plurality of voids 72V may be formed among the second crystal grains 72G2. The voids 72V may be generated during the deposition process for forming the conductive layer 72A. While the crystal grains grow, the voids 62V may grow as well or may be maintained.

There may be substantially no voids formed among the first crystal grains 72G1. Even if, in an embodiment, there are some voids among the first crystal grains 72G1, their size and number may be substantially smaller than the size and number of the voids 62V which are formed among the second crystal grains.

The gate electrode 72 may fill a portion of the gate trench 16.

Figure 15E:
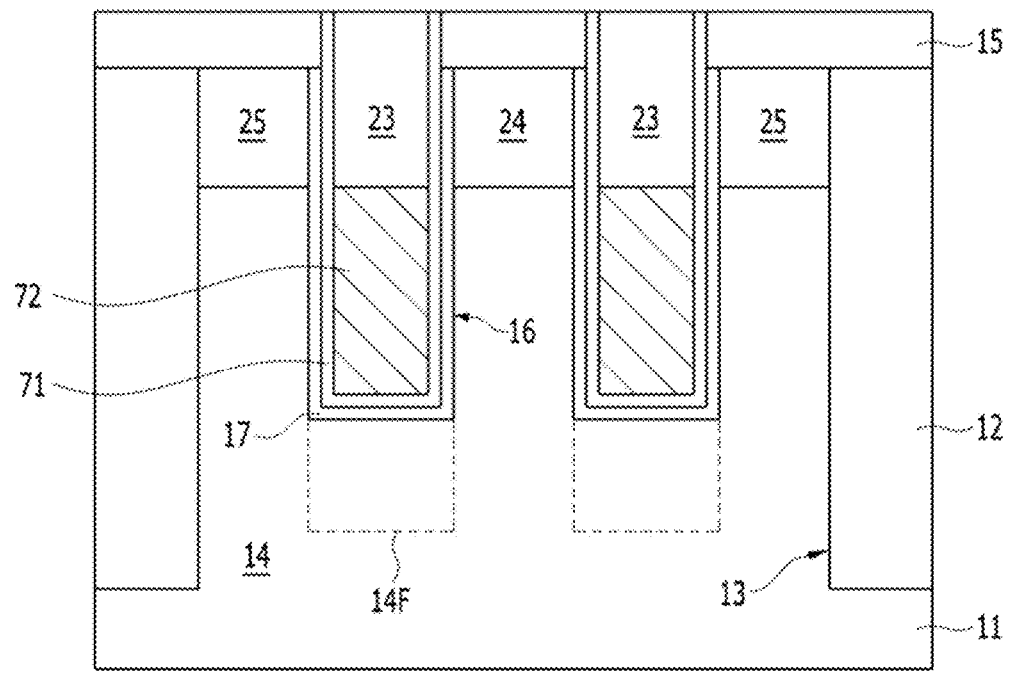

Referring to FIG. 15E, a capping layer 23 may be formed over the gate electrode 72. The capping layer 23 may include a dielectric material. The gate trench 16 may be filled with the capping layer 23 over the gate electrode 72. The capping layer 23 may be formed of any suitable material including, for example, a silicon nitride. Subsequently, the capping layer 23 may be planarized in such a manner that the upper surface of the hard mask layer 15 may be exposed. According to another embodiment of the present invention, the capping layer 23 may be formed of a silicon oxide. According to another embodiment of the present invention, the capping layer 23 may have an NON (Nitride-Oxide-Nitride) structure.

After the capping layer 23 is planarized, the crystallization delay layer 61A may be planarized. As a result the crystallization delay layer 71A may be positioned inside the gate trench 16 with the top surface of the gate electrode positioned at a lower level than the top of the gate trench. The upper surfaces of the crystallization delay layer 71, the capping layer 23, and the hard mask layer 15 may be positioned at the same level.

A buried gate structure may be completed by forming the capping layer 23. The buried gate structure may include the gate dielectric layer 17, the crystallization delay layer 71, the gate electrode 72, and the capping layer 23. The buried gate structure may have a recessed shape that fills a portion of the gate trench 16, The buried gate structure may be positioned at a lower level than the uppermost surface of the active region 14.

Subsequently, a first doping region 24 and a second doping region 25 may be formed. The first doping region 24 and the second doping region 25 may be formed through any suitable doping process, such as, for example, an ion implantation process. The first doping region 24 and the second doping region 25 may have the same depth. According to another embodiment of the present invention, the first doping region 24 may be deeper than the second doping region 25.

Figure 16:
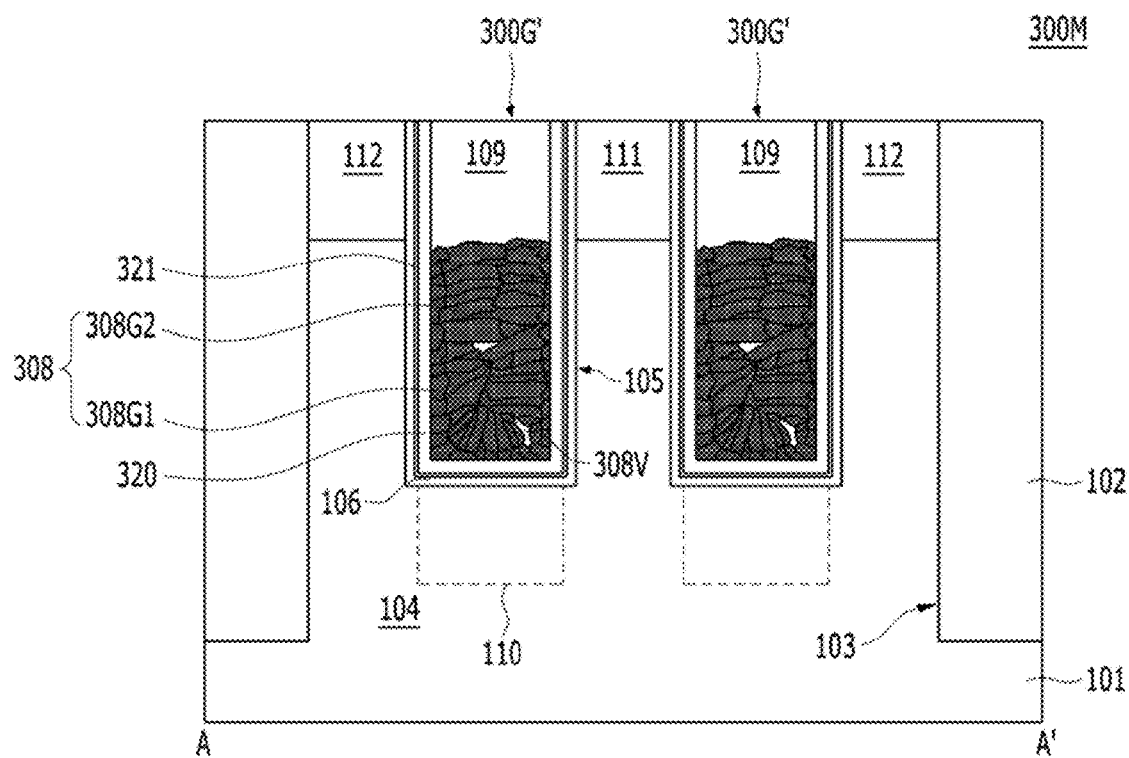
FIG. 16 is a cross-sectional view illustrating a semiconductor device in accordance with a modified example of an embodiment of the present invention.

FIG. 16 is a cross-sectional view illustrating a semiconductor device in accordance with a modified example of the third embodiment of the present invention.

Referring to FIG. 16, the semiconductor device 300M may include a buried gate structure 300G'. The buried gate structure 300G' may be formed inside a gate trench 105. The buried gate structure 300G' may include a gate dielectric layer 106, an interface layer 321, a crystallization delay layer 320, a gate electrode 308, and a capping layer 109.

The gate dielectric layer 106 may be formed of any suitable dielectric material including, for example, an oxide. The gate dielectric layer 106 may include, for example, a silicon oxide.

The interface layer 321 may be a nitrogen-containing layer. The interface layer 321 may be formed by nitriding the upper surface of the gate dielectric layer 106. The interface layer 321 and the crystallization delay layer 320 may have different nitrogen concentrations. The crystallization delay layer 320 may be formed with a high nitrogen concentration, and the interface layer 321 may be formed with a lower nitrogen concentration than the nitrogen concentration of the crystallization delay layer 320. The interface layer 321 may be formed through a plasma nitridation.

The crystallization delay layer 320 may include a nitrogen-rich layer that contains a high concentration of nitrogen. The crystallization delay layer 320 may include a nitrogen-rich silicon nitride. The crystallization delay layer 320 may include approximately 30 to 40 at % of nitrogen. The crystallization delay layer 320 may be formed through an Atomic Layer Deposition (ALD) process.

The gate electrode 308 may be the same as the gate electrode 308 of FIG. 13.

The gate electrode 308 may be polycrystalline. The gate electrode 308 may include first crystal grains 308G1 and second crystal grains 308G2. The first crystal grains 308G1 may have a smaller crystal grain size than the second crystal grains 308G2.

The gate electrode 308 may be formed of any suitable material including a metal a metal nitride, or a combination thereof. According to the embodiment of the present invention the gate electrode 308 may be formed of a titanium nitride (TiN). The first crystal grains 308G1 may be TiN crystal grains having a small crystal grain size. The second crystal grains 308G2 may be TiN crystal grains having a large crystal grain size.

The small crystal grain size of the first crystal grains 308G1 may be controlled by employing the crystallization delay layer 320. The high nitrogen concentration of the crystallization delay layer 320 may increase an interface trap charge density (Qit) and a fixed charge density (Qf). As the interface trap charge density (Qit) and the fixed charge density (Qf) are increased, interface energy may be raised. The high interface energy may delay the growth of the crystal grains of the first crystal grains 308G1.

As described above, since the first crystal grains 308G1 having a small crystal grain size are formed by the crystallization delay layer 320, there may be substantially no voids on the interface between the gate electrode 308 and the gate dielectric layer 106. In this way, delamination may be suppressed.

Also, since the second crystal grains 308G2 having a relatively large crystal grain size fill most of the gate trench 105, the resistance of the gate electrode 308 may be decreased.

FIGS. 17A to 17F are cross-sectional views illustrating an example of a method for fabricating the semiconductor device 300M in accordance with the modified example of the third embodiment of the present invention shown in FIG. 16.

First of all, as illustrated in FIG. 7A, the structures from the isolation layer 12 to the gate dielectric layer 17 may be formed. The gate dielectric layer 17 may be formed of any suitable material including, for example, a silicon oxide.

Figure 17A:
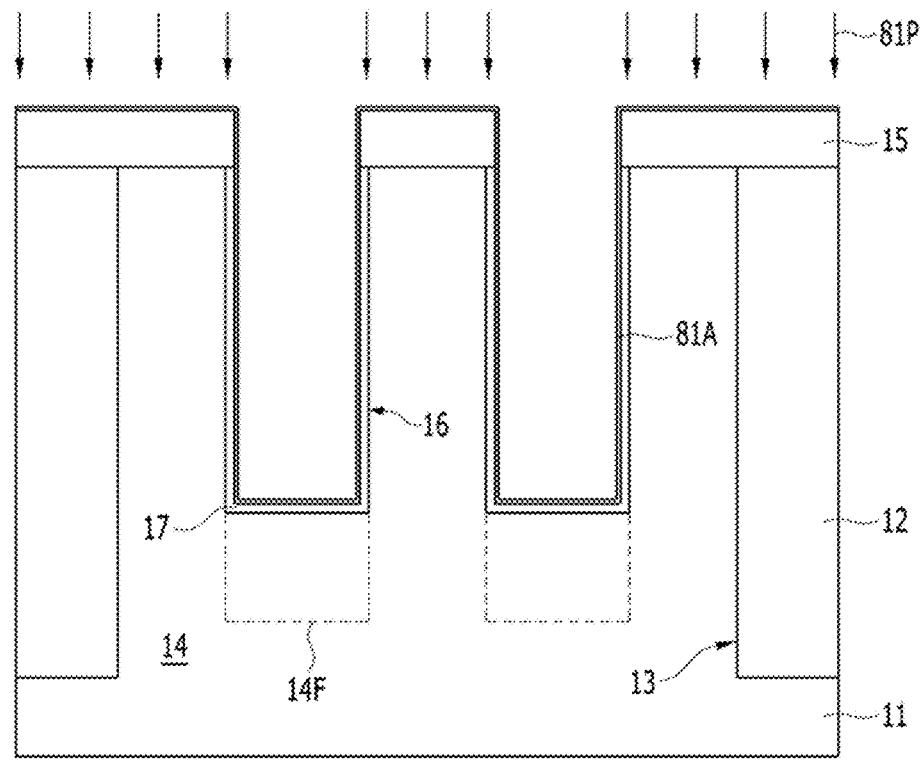
FIGS. 17A to 17F are cross-sectional views illustrating an example of a method for fabricating the semiconductor device in accordance with the modified example of an embodiment of the present invention shown in FIG. 16.

Subsequently, referring to FIG. 17A, an interface layer 81 may be formed over the gate dielectric layer 17. The interface layer 81 may include a silicon oxynitride (SiON).

The interface layer 81 may be formed through a plasma nitridation 81P. The upper surface of the gate dielectric layer 17 may be nitrided through the plasma nitridation 81P. The plasma nitridation 81P may be performed under the conditions that are different from the conditions of the plasma nitridation 61P of FIG. 15A. The plasma nitridation 81P may be performed under a condition where the nitrogen concentration is not high. For example, the plasma nitridation 81P may be performed at a lower nitrogen concentration than the plasma nitridation 61P of FIG. 15A. Therefore, the interface layer 81 may have a lower nitrogen concentration than the crystallization delay layer 61A of FIG. 15A. Since the interface layer 81 is formed, the electrical characteristics of the gate dielectric layer 17 may be improved.

Figure 17B:
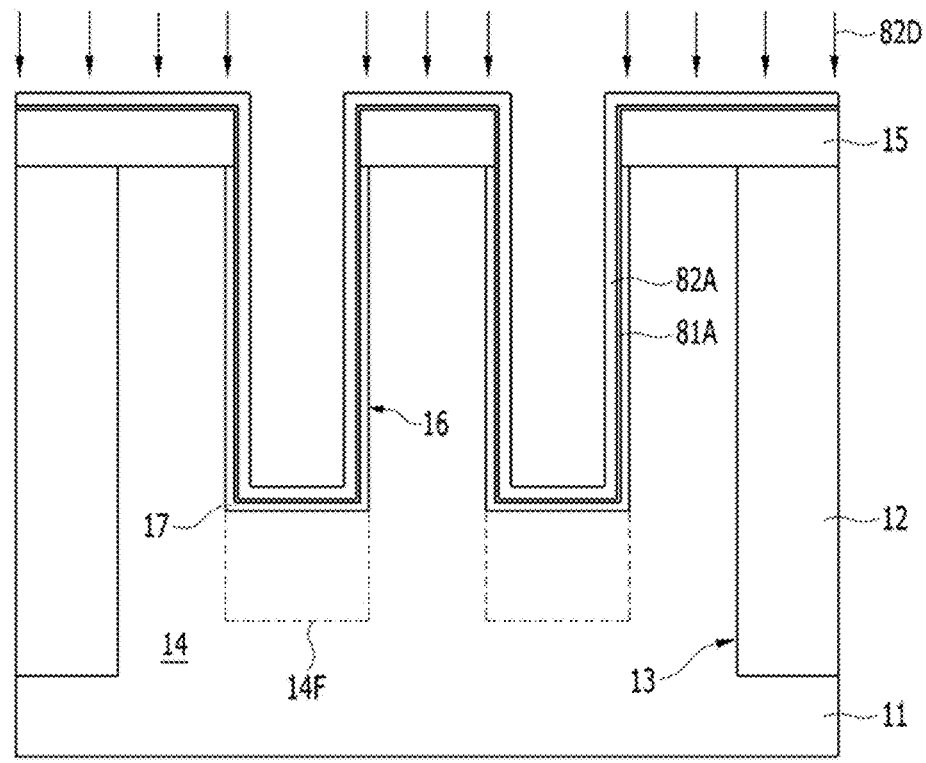

Referring to FIG. 17B, a crystallization delay layer 82A may be formed over an interface layer 81. The crystallization delay layer 82A may include a nitrogen-rich layer containing a high concentration of nitrogen. The crystallization delay layer 82A may include a nitrogen-rich silicon nitride (N-rich SiN). The nitrogen-rich silicon nitride may include approximately 30 to 40 at % of nitrogen.

The crystallization delay layer 82A may be formed through an ALD process 82D. The ALD process 82D may be performed using a silicon source gas and a nitrogen source gas (e.g., NH$_3$). The ALD process 71D may be performed by increasing the flow rate of the nitrogen source gas. In this way, the nitrogen concentration of the crystallization delay layer 82A may be raised. The crystallization delay layer 82A may be formed in a thickness thinner than approximately 10 Å. When the crystallization delay layer 82A is thick, the gap-filling performance of a conductive layer, which is to be performed subsequently, becomes poor. Therefore, it is appropriate to form the crystallization delay layer 71A as thin as possible.

Figure 17C:
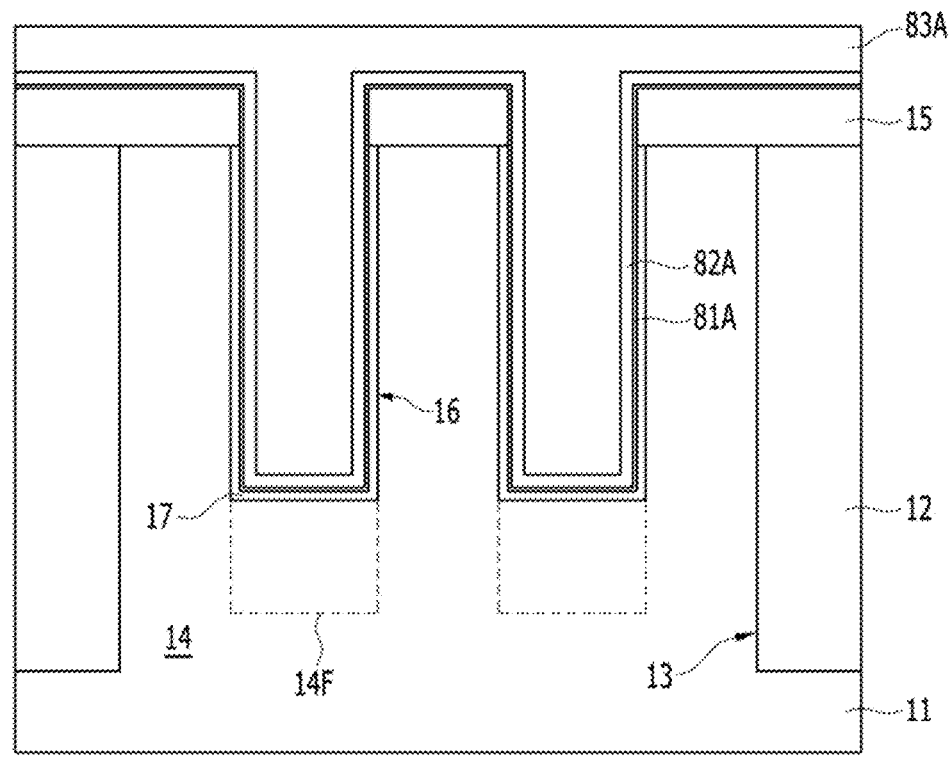

Referring to FIG. 17C, a conductive layer 83A may be formed over the crystallization delay layer 82A. The conductive layer 83A over the crystallization delay layer 82A may completely fill the gate trench 16. The conductive layer 83A may be formed of any suitable material including a metal, a metal nitride, or a combination thereof. The conductive layer 83A may be formed of a titanium nitride (TiN). The conductive layer 83A may be polycrystalline. The conductive layer 83A may be formed of a titanium nitride (TiN) of columnar crystal grains. The conductive layer 83A may be formed at a temperature which is a low-temperature process, a high-temperature process, or a middle-temperature process. The conductive layer 83A may be a titanium nitride (ALD-TiN) that is formed by reacting TiCl$_4$ and NH$_3$. The conductive layer 83A may include an LT-ALD TiN, an MT-ALD TiN, or an HT-ALD TiN.

As described above, as the conductive layer 83A is formed over the crystallization delay layer 82A, agglomeration on the interface between the conductive layer 83A and the crystallization delay layer 82A may be delayed during a subsequent annealing process. In short, the growth of crystal grains of the conductive layer 83A may be delayed on the interface between the conductive layer 83A and the crystallization delay layer 82A.

Figure 17D:
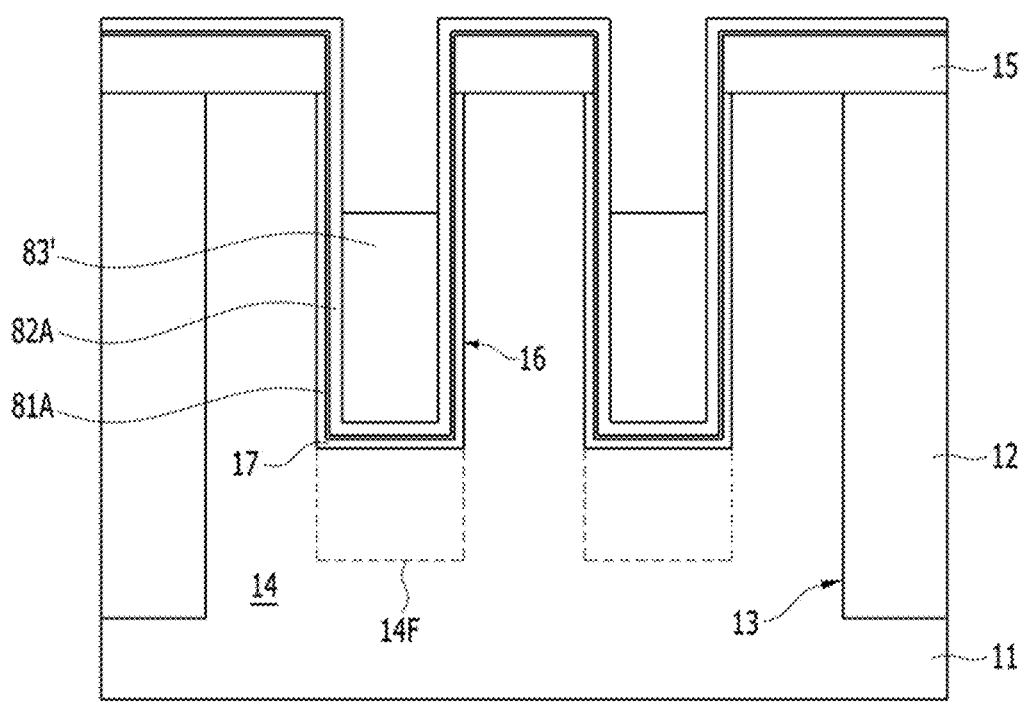

Referring to FIG. 17D a conductive layer pattern 83' may be formed. The conductive layer pattern 83' may be formed by recessing the conductive layer 83A through an etch-back process. The conductive layer pattern 83' may be positioned at a lower level than the upper surface of the active region 14. As a result, the conductive layer pattern 83 may be positioned inside the gate trench 16 with the top surface of the gate electrode positioned at a lower level than the top of the gate trench. Before the etch-back process is performed, a planarization process using a Chemical Mechanical Polishing (CMP) may be performed in advance.

Figure 17E:
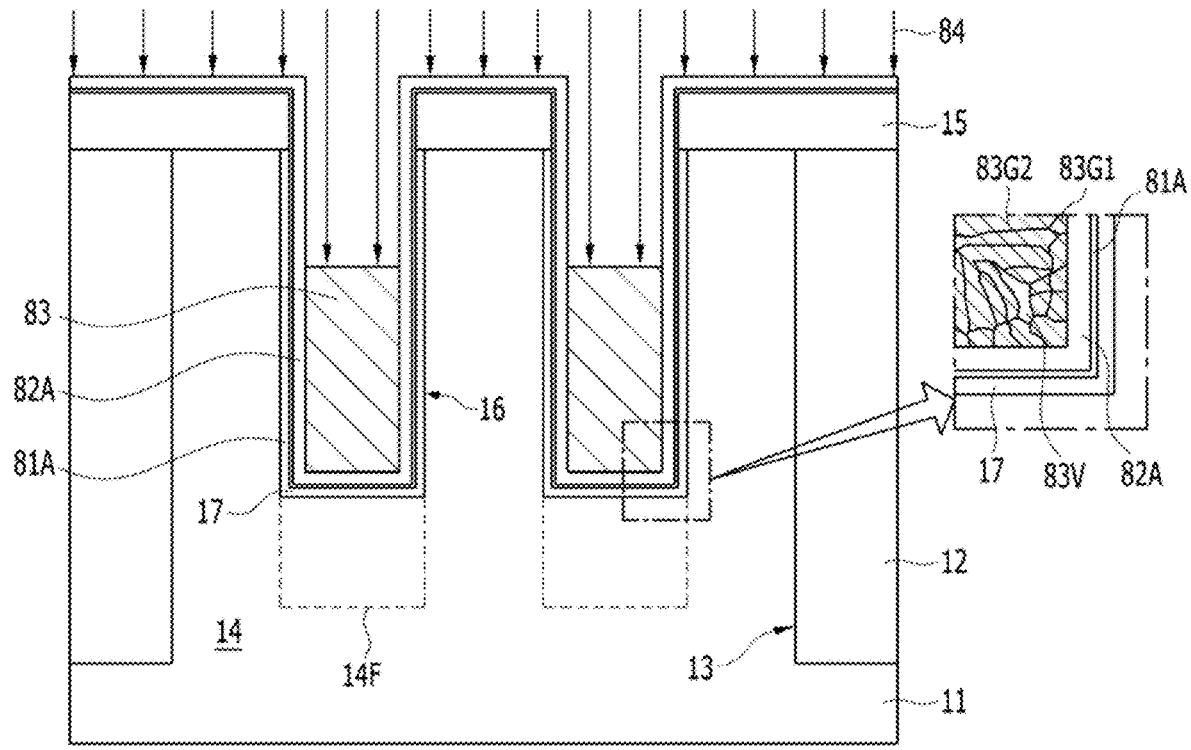

Referring to FIG. 17E, an annealing process 84 may be performed. The conductive layer pattern 83' may be exposed to the annealing process 84. Through the annealing process 84, crystal grains may grow up. In other words, the conductive layer pattern 83' may be crystalized through the annealing process 84. The annealing process 84 may be performed at a temperature ranging from approximately 300° C. to approximately 1100° C.

Through the annealing process 84, the conductive layer pattern 83' may be converted into a polycrystalline gate electrode 83. The gate electrode 83 may include first crystal grains 83G1 and second crystal grains 83G2. The first crystal grains 83G1 and the second crystal grains 83G2 may be formed through the growth of the crystal grains of the conductive layer pattern 83'. The first crystal grains 83G1 may contact the crystallization delay layer 82A. The first crystal grains 83G1 may be able to cover the upper surface and side walls of the fin region 14F. The second crystal grains 83G2 over the first crystal grains 83G1 may fill the gate trench 16. The first crystal grains 83G1 may be positioned between the second crystal grains 83G2 and the gate dielectric layer 17.

The first crystal grains 83G1 may correspond to the first crystal grains 308G1 shown in FIG. 16. The second crystal grains 83G2 may correspond to the second crystal grains 308G2 shown in FIG. 16. The first crystal grains 83G1 and the second crystal grains 83G2 may be TiN crystal grains.

While the annealing process 84 is performed, the growth of the crystal grains may be delayed by the crystallization delay layer 82A. Therefore, the first crystal grains 83G1 may grow up to have a small crystal grain size due to the crystallization delay layer 82A. The second crystal grains 83G2 that do not contact the crystallization delay layer 82A may have a larger crystal grain size than the first crystal grains 83G1.

A plurality of voids 83V may be formed among the second crystal grains 83G2. The voids 83V may be generated during the deposition process for forming the conductive layer 83A. While the crystal grains grow, the voids 83V may grow as well or may be maintained.

There may be substantially no voids formed among the first crystal grains 83G1. Even through there are voids, the size and the number of the voids may be small.

Figure 17F:
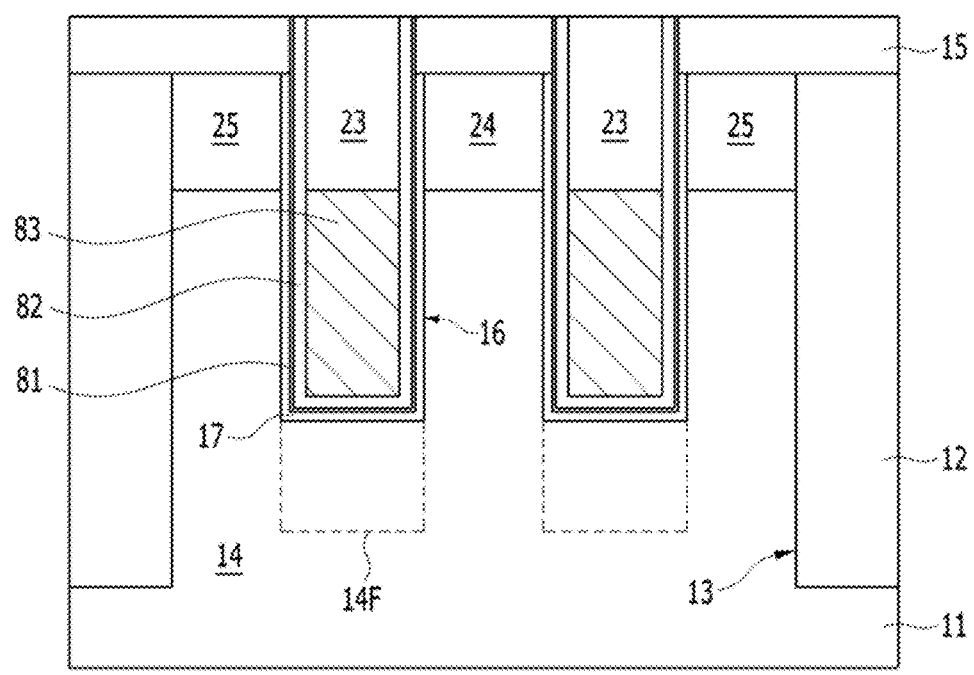

Referring to FIG. 17F, a capping layer 23 shay be formed over the gate electrode 83. The capping layer 23 may include a dielectric material. The gate trench 16 may be filled with the capping layer 23 over the gate electrode 83. The capping layer 23 may be formed of any suitable dielectric material including, for example, a silicon nitride. Subsequently, the capping layer 23 may be planarized in such a manner that the upper surface of the hard mask layer 15 may be exposed. According to another embodiment of the present invention, the capping layer 23 may be formed of a silicon oxide. According to yet another embodiment of the present invention, the capping layer 23 may have an NON (Nitride-Oxide-Nitride) structure.

After the capping layer 23 is planarized, the crystallization delay layer 82A and the interface layer 81A may be planarized. As a result, the interface layer 81 and the crystallization delay layer 82 may be positioned inside the gate trench 16 with the top surface of the gate electrode positioned at a lower level than the top of the gate trench. The upper surfaces of the interface layer 81, the crystallization delay layer 82, the capping layer 23, and the hard mask layer 15 may be positioned at the same level.

A buried gate structure may be completed by forming the capping layer 23. The buried gate structure may include the gate dielectric layer 17, the interface layer 81, the crystallization delay layer 82, the gate electrode 83, and the capping layer 23. The buried gate structure may have a recessed shape that fills a portion of the gate trench 16. The buried gate structure may be positioned at a lower level than the uppermost surface of the active region 14.

Subsequently, a first doping region 24 and a second doping region 25 may be formed. The first doping region 24 and the second doping region 25 may be formed through any suitable doping process, such as an ion implantation process. The first doping region 24 and the second doping region 25 may have the same depth. According to another embodiment of the present invention, the first doping region 24 may be deeper than the second doping region 25.

Figure 18:
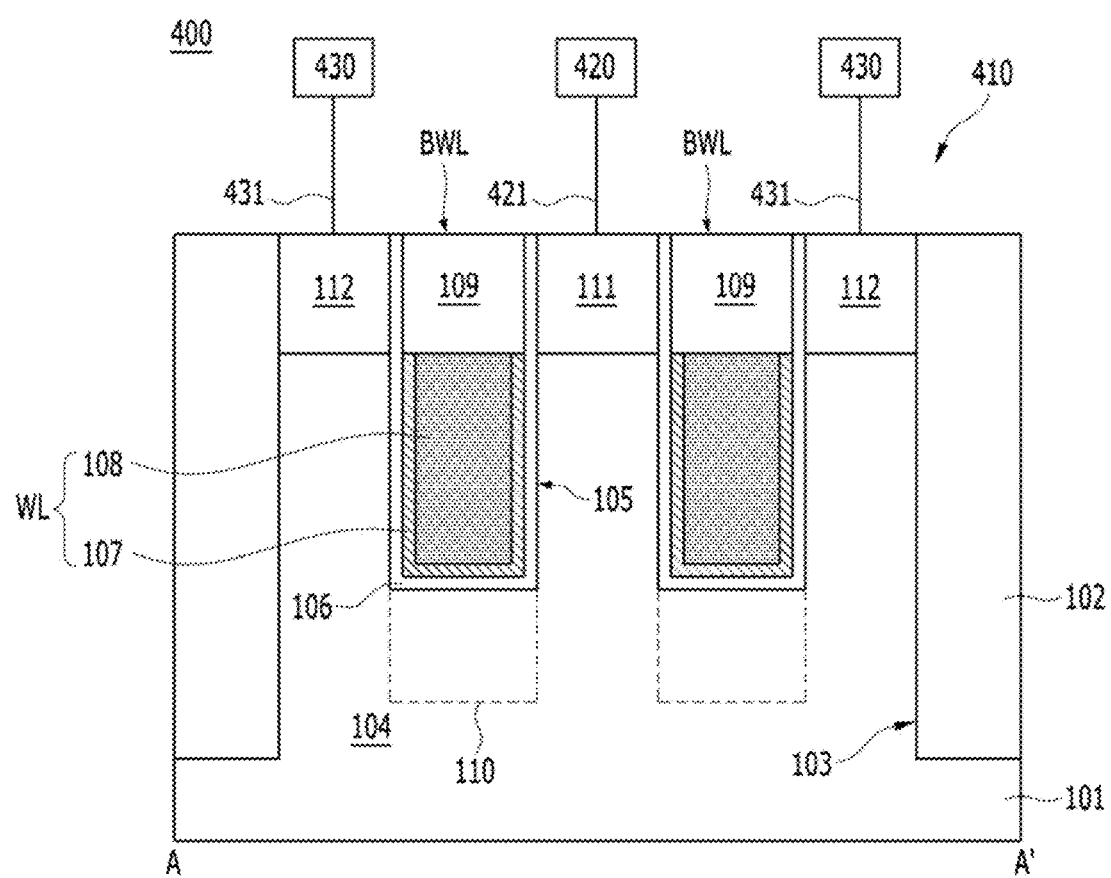
FIG. 18 is a cross-sectional view of a semiconductor device in accordance with an application example of an embodiment of the present invention.

FIG. 18 is a cross-sectional view of a semiconductor device in accordance with an application example of an embodiment of the present invention. FIG. 18 illustrates a memory cell 400 to which the semiconductor device 100 of FIG. 2A is applied.

Referring to FIG. 18, the memory cell 400 is illustrated. The memory cell 400 may include a cell transistor 410, a bit line 420, and a memory element 430. The cell transistor 410 may be configured according to the semiconductor device 100 of FIG. 2A. The cell transistor 410 may include a buried word line structure BWL, a channel region 110, a first doping region 111, and a second doping region 112. The first doping region 111 may be electrically connected to the bit line 420 through a first contact plug 421. The second doping region 112 may be electrically connected to the memory element 430 through a second contact plug 431. The buried word line structure BWL may be the same as the buried gate structure 100G of FIG. 2A. The buried word line structure BWL may be formed inside of a gate trench 105. The buried word line structure BWL may include a gate dielectric layer 106, a word line WL and a capping layer 109. The word line WL may include a first crystal grain layer 107 and a second crystal grain layer 108. The first crystal grain layer 107 may include first crystal grains (see the reference numeral '107G' of FIG. 3A) of a small crystal grain size. The second crystal grain layer 108 may include second crystal grains (see the reference numeral '108G' of FIG. 3A) of a large crystal grain size.

The buried word line structure BWL of the cell transistor 410 may be replaced by the buried gate structure 100G, 200G, 300G or 300G' in accordance with an embodiments and their modification examples.

The memory element 430 may include a capacitor. The memory element 430 may include a storage node (not shown) that contacts the second contact plug 431. The storage node may be a cylindrical shape or a pillar shape. A capacitor dielectric layer may be formed on the surface of the storage node. The capacitor dielectric layer may include at least one selected from a group including a zirconium oxide, an aluminum oxide, and a hafnium oxide. For example, the capacitor dielectric layer may have a ZAZ ($ZrO_2/Al_2O_3/ZrO_2$) structure where a first zirconium oxide, an aluminum oxide, and a second zirconium oxide are stacked. A plate node may be formed over the capacitor dielectric layer. The storage node and the plate node may include a metal-containing material.

According to another embodiment of the present invention, the memory element 430 may include a variable resistance material. The variable resistance material may include a phase-change material. The phase-change material may include at least one selected from a group including tellurium (Te) and selenium (Se), which are chalcogenide elements. According to another embodiment of the present invention, the variable resistance material may include a transition metal oxide. According to yet another embodiment of the present invention, the variable resistance material may include a Magnetic Tunnel Junction (MTJ).

As described above, the memory cell 400 may include the buried word line structure BWL that includes the first crystal grain layer 107 and the second crystal grain layer 108. When the memory cell 400 is applied to a Dynamic Random Access Memory (DRAM) device, the refresh characteristics of the DRAM device may be improved. Also, it is possible to prevent off-leakage, which leads to improved retention time.

The semiconductor devices in accordance with the embodiments of the present invention may be applied to an electronic device. The electronic device may include a plurality of semiconductor devices. For example, the electronic device may include at least one selected from the semiconductor devices 100, 200, 300 and 300' and the memory cell 400 in accordance with the embodiments of the present invention.

The least one semiconductor device among the semiconductor devices included in the electronic device may include a buried gate structure that is formed inside of a gate trench. The buried gate structure may include first crystal grains and second crystal grains. The first crystal grains may contact a gate dielectric layer, and the second crystal grains may not contact the gate dielectric layer. The crystal grain size of the first crystal grains may be smaller than the crystal grain size of the second crystal grains. Since the first crystal grains are formed in a small crystal grain size, the interface characteristics between the gate dielectric layer and a gate electrode may be improved. Therefore, it is possible to realize rapid operation rates in electronic devices that are being miniaturized.

According to embodiments of the present invention void formation and delamination may be prevented by forming crystal grains of a small crystal grain size that cover and contact the gate dielectric layer. As a result, the characteristics of the interface between the gate dielectric layer and the gate electrode may be improved.

Also, according to embodiments of the present invention, the resistance of the gate electrode may be improved by forming the crystal grains of a large crystal grain size filling most of the gate trench.

Also, according to embodiments of the present invention, the resistance of the gate electrode may be improved by removing impurities through a subsequent process.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
   a gate trench formed into a semiconductor substrate;
   a first doping region and a second doping region formed in the substrate separated from each other by the gate trench;
   a gate dielectric layer formed in the gate trench to cover an inside surface of the gate trench; and
   a gate electrode disposed over the gate dielectric layer to fill a lower part of the gate trench without overlapping with the first and the second doping region,
   wherein the gate electrode includes:
      a second crystal grain layer disposed in the gate trench, the second crystal grain layer having second crystal grains; and
      a first crystal grain layer disposed between the second crystal grain layer and the gate dielectric layer, the first crystal grain layer having first crystal grains, and is directly contacted with the second crystal grain layer,
   wherein each of the first crystal grains has a smaller crystal grain size than each of the second crystal grains,
   wherein the first crystal grains and the second crystal grains are a columnar structure, and
   wherein the gate electrode having the columnar structure comprises the first and second crystal grains,
   wherein the first crystal grain layer is a polycrystalline layer free of any voids formed by a crystal grain growth of an amorphous material,
   wherein the second crystal grain layer is formed by a crystal grain growth of a polycrystalline material, and
   wherein said crystal growth includes annealing the amorphous and the polycrystalline materials at a temperature of from 300° C. to 1100° C.

2. The semiconductor device of claim 1, wherein the first crystal grains and the second crystal grains are crystal grains of the same material.

3. The semiconductor device of claim 1, wherein the first crystal grains and the second crystal grains include metal crystal grains or metal nitride crystal grains.

4. The semiconductor device of claim 1, wherein the first crystal grains and the second crystal grains include titanium nitride (TiN) crystal grains, respectively.

5. The semiconductor device of claim 1, further comprising:
   a fin region formed on a bottom surface of the gate trench and including an upper surface and side walls covered by the gate dielectric layer,
   wherein the first crystal grains cover the upper surface and side walls of the fin region.

6. The semiconductor device of claim 1, wherein the first crystal grains cover the gate dielectric layer, and the second crystal grains do not contact the gate dielectric layer.

7. The semiconductor device of claim 1, further comprising:
   a capping layer formed on the gate electrode inside the gate trench to fill an upper part of the gate trench, and wherein the gate electrode filling a lower part of the gate trench.

8. The semiconductor device of claim 1, wherein the first crystal grains and the second crystal grains are formed of metal nitride.

9. The semiconductor device of claim 1, wherein the first crystal grains and the second crystal grains are formed of metal.

10. The semiconductor device of claim 1, wherein the amorphous material is formed of an amorphous titanium nitride, and the polycrystalline material is formed of polycrystalline titanium nitride.

11. The semiconductor device of claim 1, wherein the gate electrode is formed of only titanium nitride.

* * * * *